(12) United States Patent
Jurkov et al.

(10) Patent No.: US 11,942,898 B2
(45) Date of Patent: Mar. 26, 2024

(54) GENERATION AND SYNCHRONIZATION OF PULSE-WIDTH MODULATED (PWM) WAVEFORMS FOR RADIO-FREQUENCY (RF) APPLICATIONS

(71) Applicant: Massachusetts Institute of Technology, Cambridge, MA (US)

(72) Inventors: Alexander Sergeev Jurkov, Somerville, MA (US); David J. Perreault, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/703,230

(22) Filed: Mar. 24, 2022

(65) Prior Publication Data
US 2022/0216832 A1 Jul. 7, 2022

Related U.S. Application Data

(60) Continuation of application No. 16/932,327, filed on Jul. 17, 2020, now Pat. No. 11,316,477, which is a
(Continued)

(51) Int. Cl.
*H03F 1/02* (2006.01)
*H03F 1/56* (2006.01)
(Continued)

(52) U.S. Cl.
CPC .......... *H03F 1/0205* (2013.01); *H03F 1/56* (2013.01); *H03F 1/565* (2013.01); *H03F 3/19* (2013.01);
(Continued)

(58) Field of Classification Search
CPC .......... H03F 1/0205; H03F 1/56; H03F 1/565; H03F 3/19; H03F 3/193; H03F 3/21;
(Continued)

(56) References Cited

U.S. PATENT DOCUMENTS 3,800,167 A    3/1974 Smith
5,195,045 A    3/1993 Keane et al.
(Continued)

FOREIGN PATENT DOCUMENTS

CN    101297480 A    10/2008
CN    103181086       6/2013
(Continued)

OTHER PUBLICATIONS

U.S. Appl. No. 13/722,659, filed Dec. 20, 2012, Perreault, et al.
(Continued)

*Primary Examiner* — Hieu P Nguyen
(74) *Attorney, Agent, or Firm* — Daly, Crowley, Mofford & Durkee, LLP

(57) ABSTRACT

Described are concepts, systems, circuits and techniques directed toward methods and apparatus for generating one or more pulse width modulated (PWM) waveforms with the ability to dynamically control pulse width and phase with respect to a reference signal.

18 Claims, 38 Drawing Sheets

Related U.S. Application Data division of application No. 16/126,553, filed on Sep. 10, 2018, now Pat. No. 10,790,784, which is a continuation-in-part of application No. 15/918,410, filed on Mar. 12, 2018, now abandoned, which is a continuation of application No. 14/975,742, filed on Dec. 19, 2015, now Pat. No. 9,923,518, which is a continuation of application No. 14/974,563, filed on Dec. 18, 2015, now Pat. No. 9,755,576.

(60) Provisional application No. 62/094,144, filed on Dec. 19, 2014.

(51) Int. Cl.

| | | |
|---|---|---|
| H03F 3/19 | (2006.01) | |
| H03F 3/193 | (2006.01) | |
| H03F 3/21 | (2006.01) | |
| H03F 3/217 | (2006.01) | |
| H03F 3/24 | (2006.01) | |
| H03K 7/08 | (2006.01) | |
| H03H 7/38 | (2006.01) | |

(52) U.S. Cl.
CPC .............. *H03F 3/193* (2013.01); *H03F 3/21* (2013.01); *H03F 3/2171* (2013.01); *H03F 3/2176* (2013.01); *H03F 3/245* (2013.01); *H03K 7/08* (2013.01); *H03F 3/2178* (2013.01); *H03F 2200/301* (2013.01); *H03F 2200/387* (2013.01); *H03F 2200/391* (2013.01); *H03F 2200/451* (2013.01); *H03H 7/38* (2013.01)

(58) Field of Classification Search
CPC ...... H03F 3/2171; H03F 3/2176; H03F 3/245; H03F 3/2178; H03F 2200/301; H03F 2200/387; H03F 2200/391; H03F 2200/451; H03K 7/08; H03H 7/38
USPC .................................................. 330/251, 302
See application file for complete search history.

(56) References Cited

U.S. PATENT DOCUMENTS

| | | | |
|---|---|---|---|
| 6,239,996 B1 | 5/2001 | Perreault et al. | |
| 6,346,797 B1 | 2/2002 | Perreault et al. | |
| 6,456,514 B1 | 9/2002 | Perreault et al. | |
| 6,587,017 B1 | 7/2003 | Sheng et al. | |
| 6,671,195 B2 | 12/2003 | Perreault et al. | |
| 6,887,339 B1 | 5/2005 | Goodman et al. | |
| 6,900,997 B2 | 5/2005 | Perreault et al. | |
| 6,937,115 B2 | 8/2005 | Perreault et al. | |
| 7,825,715 B1 | 11/2010 | Greenberg | |
| 8,054,892 B2 | 11/2011 | Aziz et al. | |
| 8,174,233 B2 | 5/2012 | Julstrom et al. | |
| 8,279,950 B2 | 10/2012 | Aziz et al. | |
| 8,339,174 B2 | 12/2012 | Yang et al. | |
| 8,404,598 B2 * | 3/2013 | Liao | H01J 37/32165 216/68 |
| 8,525,609 B1 | 9/2013 | Sadasivam et al. | |
| 8,625,654 B2 | 1/2014 | Jeong et al. | |
| 8,633,782 B2 | 1/2014 | Nagarkatti et al. | |
| 8,718,188 B2 | 5/2014 | Balteanu et al. | |
| 8,830,709 B2 | 9/2014 | Perreault et al. | |
| 8,830,710 B2 | 9/2014 | Perreault et al. | |
| 8,890,618 B2 | 11/2014 | Pamarti et al. | |
| 9,141,832 B2 | 9/2015 | Perreault et al. | |
| 9,374,020 B2 | 6/2016 | Perreault et al. | |
| 9,401,664 B2 | 7/2016 | Perreault et al. | |
| 9,407,164 B2 | 8/2016 | Chang et al. | |
| 9,490,752 B2 | 11/2016 | Briffa et al. | |
| 9,537,456 B2 | 1/2017 | Briffa et al. | |
| 9,634,577 B2 | 4/2017 | Perreault et al. | |
| 9,660,520 B2 | 5/2017 | Perreault et al. | |
| 9,755,576 B2 | 9/2017 | Perreault et al. | |
| 9,755,672 B2 | 9/2017 | Perreault et al. | |
| 9,762,145 B2 | 9/2017 | Perreault et al. | |
| 9,768,731 B2 | 9/2017 | Perreault et al. | |
| 9,768,732 B2 | 9/2017 | Briffa et al. | |
| 9,819,272 B2 | 11/2017 | Perreault et al. | |
| 9,825,545 B2 | 11/2017 | Chen et al. | |
| 9,853,550 B2 | 12/2017 | Perreault et al. | |
| 9,912,303 B2 | 3/2018 | Barton et al. | |
| 9,923,518 B2 | 3/2018 | Perreault et al. | |
| 10,038,461 B2 | 7/2018 | Briffa et al. | |
| 10,075,064 B2 | 9/2018 | Perreault et al. | |
| 10,536,093 B2 | 1/2020 | Perreault et al. | |
| 10,790,784 B2 | 9/2020 | Jurkov et al. | |
| 11,316,477 B2 | 4/2022 | Jurkov et al. | |
| 2005/0286278 A1 | 12/2005 | Perreault et al. | |
| 2007/0090874 A1 | 4/2007 | Sorrells et al. | |
| 2007/0285140 A1 | 12/2007 | Kubo | |
| 2008/0218291 A1 | 9/2008 | Zhu et al. | |
| 2012/0056689 A1 | 3/2012 | Spears et al. | |
| 2013/0033118 A1 | 2/2013 | Karalis et al. | |
| 2013/0285741 A1 | 10/2013 | Wright | |
| 2014/0226378 A1 | 8/2014 | Perreault et al. | |
| 2014/0266433 A1 | 9/2014 | Nobbe et al. | |
| 2014/0355322 A1 | 12/2014 | Perreault et al. | |
| 2015/0023063 A1 | 1/2015 | Perreault et al. | |
| 2015/0084701 A1 | 3/2015 | Perreault et al. | |
| 2015/0188448 A1 | 7/2015 | Perreault et al. | |
| 2016/0173032 A1 | 6/2016 | Kuttner | |
| 2018/0102644 A1 | 4/2018 | Perreault et al. | |

FOREIGN PATENT DOCUMENTS

| | | |
|---|---|---|
| CN | 103378811 A | 10/2013 |
| CN | 103444078 A | 12/2013 |
| EP | 0 786 863 A2 | 1/1997 |
| EP | 0 821 304 B1 | 2/2002 |
| EP | 2 582 039 A2 | 4/2013 |
| JP | H 104335 | 1/1998 |
| JP | H11220338 | 8/1999 |
| JP | 2002-158556 | 5/2002 |
| JP | 2002-271160 | 9/2002 |
| JP | 2007-501600 A | 1/2007 |
| JP | 2014-187678 | 10/2014 |
| KR | 20040070002 | 8/2004 |
| WO | WO 01/03288 A1 | 1/2001 |
| WO | WO 2004/105208 A1 | 12/2004 |
| WO | WO 2007/053569 | 5/2007 |
| WO | WO 2018/005795 A1 | 1/2018 |

OTHER PUBLICATIONS

U.S. Appl. No. 15/797,491, filed Oct. 30, 2017, Perreault, et al.
U.S. Appl. No. 15/918,410, filed Mar. 12, 2018, Perreault, et al.
R. Malmqvist, et. al., "RF MEMS based impedance matching networks for tunable multi-band microwave low noise amplifiers," in *Proc. 2009 International Semiconductor Conference*, vol. I, pp. 303-306. (4 pages).
J. Mitola, "The software radio architecture," *IEEE Communications Magazine*, vol. 33, No. 5, pp. 26-38, May 1995. (13 pages).
E. Din, et. al., "Efficiency enhancement of class-F GaN power amplifiers using load modulation," *2010 German Microwave Conference*, pp. 114-117, Mar. 15-17, 2010. (4 pages).
M. Schmidt, et. al., "A comparison of tunable ferroelectric Π- and T-matching networks," in *Proc. 37th European Microwave Conference*, pp. 98-101, Oct. 9-12, 2007. (4 pages).
W. Gu, and K. Harada, "A new method to regulate resonant converters," *IEEE Transactions on Power Electronics*, vol. 3, No. 4, Oct. 1988 (10 pages).
A. Jurkov, L. Roslaniec, and D. Perreault, "Lossless multiway power combining and outphasing for high-frequency resonant inverters," *IEEE Transactions on Power Electronics*, vol. 29, No. 4, pp. 1894-1908, Apr. 2014. (15 pages).
L. Roslaniec, et. al., "Design of single-switch inverters for variable resistance/load modulation operation," *IEEE Transactions on Power Electronics*, accepted for publication (15 pages).

(56) References Cited

OTHER PUBLICATIONS

E. Waffenschmidt, "Dynamic Resonant Matching Method for a Wireless Power Transmission Receiver", *IEEE Transactions on Power Electronics*, vol. 30, No. 11, Nov. 2015 (8 pages).
PCT Search Report and Written Opinion of the ISA dated Apr. 21, 2016; for PCT Pat App. No. PCT/US2015/066722; 16 pages.
Office Action dated Feb. 8, 2017 from U.S. Appl. No. 14/974,563; 19 Pages.
Denieport; "Medical Power Generator Using a Voltage Mode Resonant Converter Controlled by a Synchronous Switched Capacitor is MRI Compatible"; 2014 21$^{st}$ IEEE International Conference on Electronics, Circuits and Systems (ICECS); Dec. 7-10, 2014; 4 Pages.
Response to Office Action dated Feb. 8, 2017 from U.S. Appl. No. 14/974,563, filed May 8, 2017; 8 Pages.
PCT International Preliminary Report on Patentability dated Jun. 29, 2017 from International Application No. PCT/US2015/066722; 10 Pages.
Notice of Allowance dated Jul. 17, 2017 from U.S. Appl. No. 14/974,563; 11 Pages.
Office Action dated Oct. 5, 2016 for U.S. Appl. No. 14/975,742; 11 pages.
Response to Office Action dated Oct. 5, 2016 for U.S. Appl. No. 14/975,742, filed Jan. 5, 2017, 14 pages.
Final Office Action dated Mar. 7, 2017 for U.S. Appl. No. 14/975,742; 13 pages.
Response to Final Office Action dated Mar. 7, 2017 for U.S. Appl. No. 14/975,742, filed Jun. 7, 2017, 13 pages.
Notice of Allowance dated Dec. 8, 2017 for U.S. Appl. No. 14/975,742; 8 pages.
International Search Report of the ISA for Int'l. Appl. No. PCT/US2017/040000 dated Nov. 3, 2017; 5 pages.
International Written Opinion of the ISA for Int'l. Appl. No. PCT/US2017/040000 dated Nov. 3, 2017; 6 pages.
Notice of Rejection with English translation dated Aug. 28, 2018 for Japanese Appl. No. 2017-532742; 10 pages.
Response (with English Translation) to Japanese Office Action dated Aug. 24, 2018 for Japanese Application No. 2017-532742; Response filed on Feb. 28, 2019; 20 Pages.
Japanese Office Action dated Jul. 11, 2019 (with English Translation) for Japanese Application No. 2017-532742; 8 pages.
Response to Office Action with English claims filed Oct. 10, 2019 for Japanese Application No. 2017-532742; 13 pages.
International Search Report and Written Opinion of the ISA dated Dec. 27, 2019 for International Application No. PCT/US2019/046595; 13 Pages.
Intention of Grant dated Mar. 2, 2020 for Japanese Application No. 2017-532742; 5 pages.
Chinese Office Action with English Translation dated Mar. 11, 2020 for Chinese Application No. 201580069046.1; 56 Pages.
Restriction Requirement dated Oct. 3, 2019 for U.S. Appl. No. 16/126,553; 5 Pages.
Response to Restriction Requirement dated Oct. 3, 2019 for U.S. Appl. No. 16/126,553, filed Oct. 18, 2019; 1 Page.
Office Action dated Dec. 18, 2019 for U.S. Appl. No. 16/126,553; 21 Pages.
Response to Office Action dated Dec. 18, 2019 for U.S. Appl. No. 16/126,553, filed Mar. 16, 2020; 9 Pages.
Notice of Allowance dated May 4, 2020 for U.S. Appl. No. 16/126,553; 9 Pages.
Response to Office Action for Chinese Patent Application No. 201580069046.1 as filed on Jul. 27, 2020 with English Translation; 14 Pages.
Office Action dated Aug. 17, 2020 for Chinese Application No. 201580069046.1 with English Translation; 12 Pages.
International Preliminary Report on Patentability dated Mar. 25, 2021 for International Application No. PCT/US2019/046595; 6 Pages.
European Communication pursuant to Rules 161(2) and 162 EPC dated Apr. 21, 2021 for European Application No. 19859116.6; 3 Pages.
Chinese Office Action (with English Translation from Espacenet.com) dated Mar. 30, 2021 for Chinese Application No. CN201580069046.1; 71 Pages.
Chinese Decision of Rejection (with English Translation) dated Nov. 2, 2021 for Chinese Application No. CN201580069046.1; 71 Pages.
Voluntary Amendment for International Application No. 11202101095S as filed on Mar. 7, 2023; 7 Pages.
Office Action dated Dec. 22, 2022 for Korean Application No. 10-2021-7008984 with English Translation; 11 Pages.
Office Action dated Jun. 13, 2022 for Japanese Application No. 2021-513188 with English Translation; 9 Pages.
Response to Office Action dated Jun. 13, 2022 for Japanese Application No. 2021-513188 with English Translation as filed on Dec. 13, 2022; 14 Pages.
Notice of Allowance dated Feb. 22, 2023 for Japanese Application No. 2021-513188 with English Translation and Allowed Claims; 12 Pages.
Communication pursuant to Rules 70(2) and 70a(2) EPC dated Aug. 30, 2022 for European Application No. 19859116.6; 1 Page.
Partial European Search Repot dated May 10, 2022 for Application No. 19859116.6; 13 Pages.
European Extended Search Report dated Aug. 12, 2022 for Application No. 19859116.6; 12 Pages.
Office Action dated Feb. 17, 2021 for Japanese Application No. 2020-060147 with English Translation; 23 Pages.
Response to Office Action dated Feb. 17, 2021 for Japanese Application No. 2020-060147 with English Translation as filed on Aug. 17, 2021; 14 Pages.
Final Office Action dated Jan. 12, 2022 for Japanese Application No. 2020-060147 with English Translation; 21 Pages.
Response to Final Office Action dated Jan. 12, 2022 for Japanese Application No. 2020-060147 with English Translation as filed on May 12, 2022; 23 Pages.
Notice of Allowance dated Jul. 22, 2022 for Japanese Application No. 2020-060147 with English Translation and allowed claims; 10 Pages.
Office Action dated Jan. 19, 2023 for Korean Application No. 10-2023-7001062 with English Translation; 15 Pages.
Office Action dated Jun. 15, 2022 for Korean Application No. 10-2017-70017717 with English Translation; 15 Pages.
Final Office Action dated Jan. 28, 2023 for Korean Application No. 10-2017-70017717 with English Translation; 8 Pages.
Office Action dated Jul. 7, 2021 for U.S. Appl. No. 16/932,327; 9 Pages.
Response to Office Action dated Jul. 7, 2021 for U.S. Appl. No. 16/932,327, filed Oct. 7, 2021; 16 Pages.
Notice of Allowance dated Dec. 22, 2021 for U.S. Appl. No. 16/932,327; 8 Pages.

\* cited by examiner

100

800

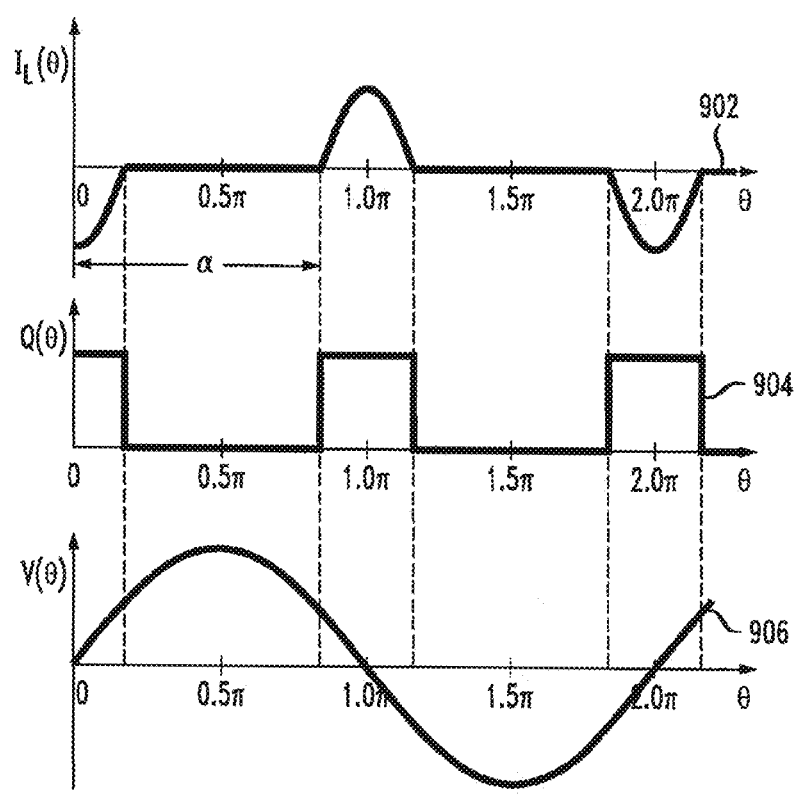

1300

1400

1500

1600

1700

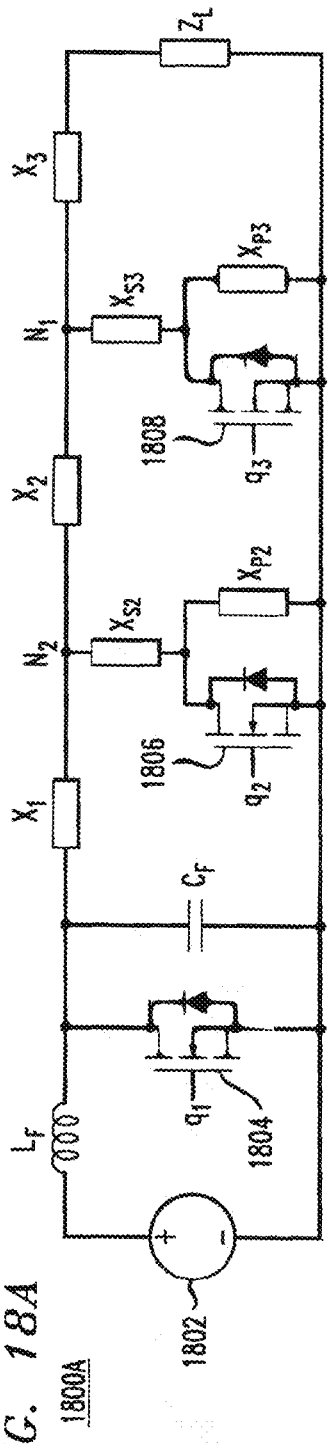
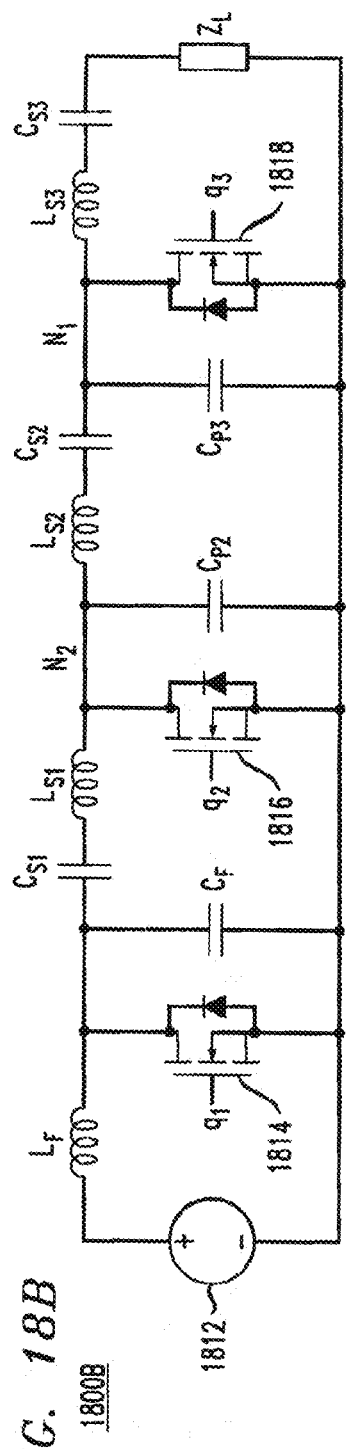
FIG. 18A
FIG. 18B

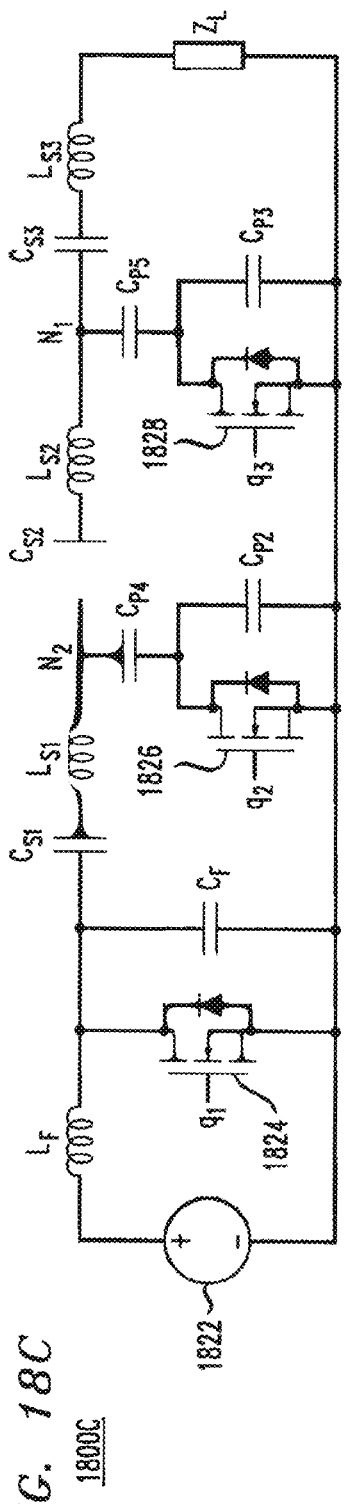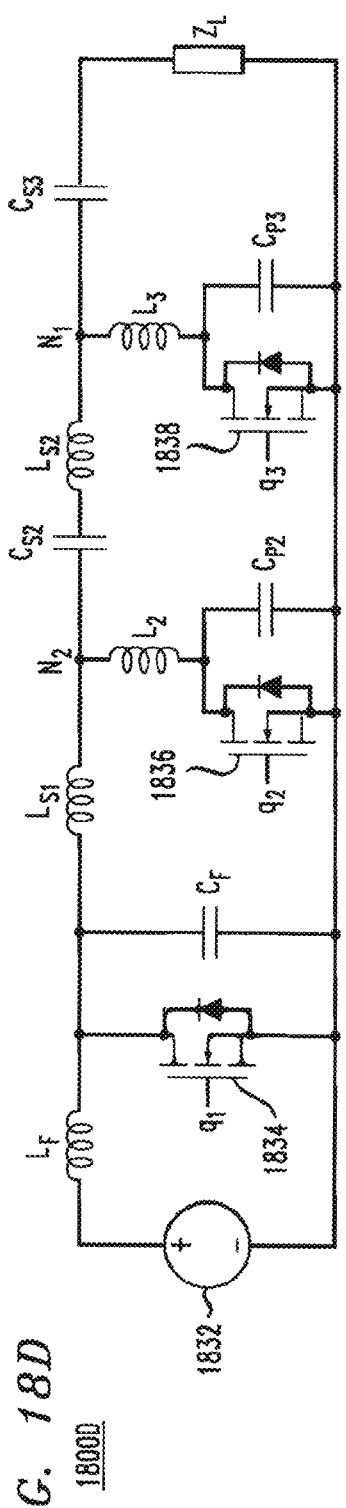
FIG. 18C
1800C
FIG. 18D
1800D

1800E

1900

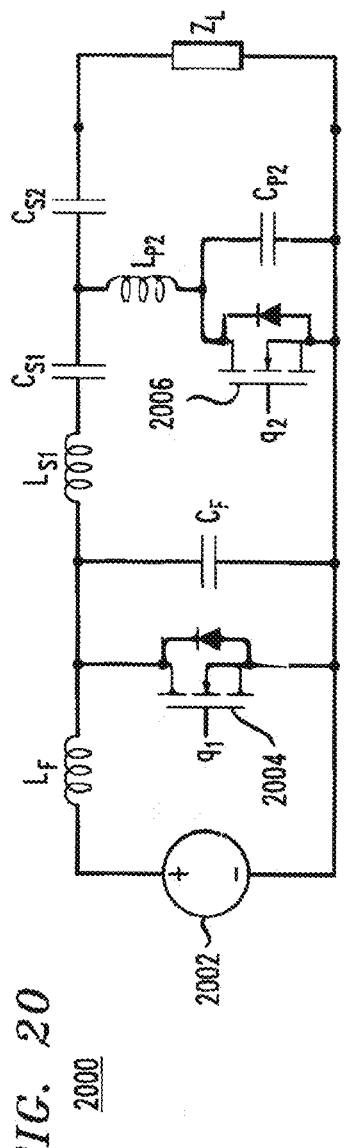
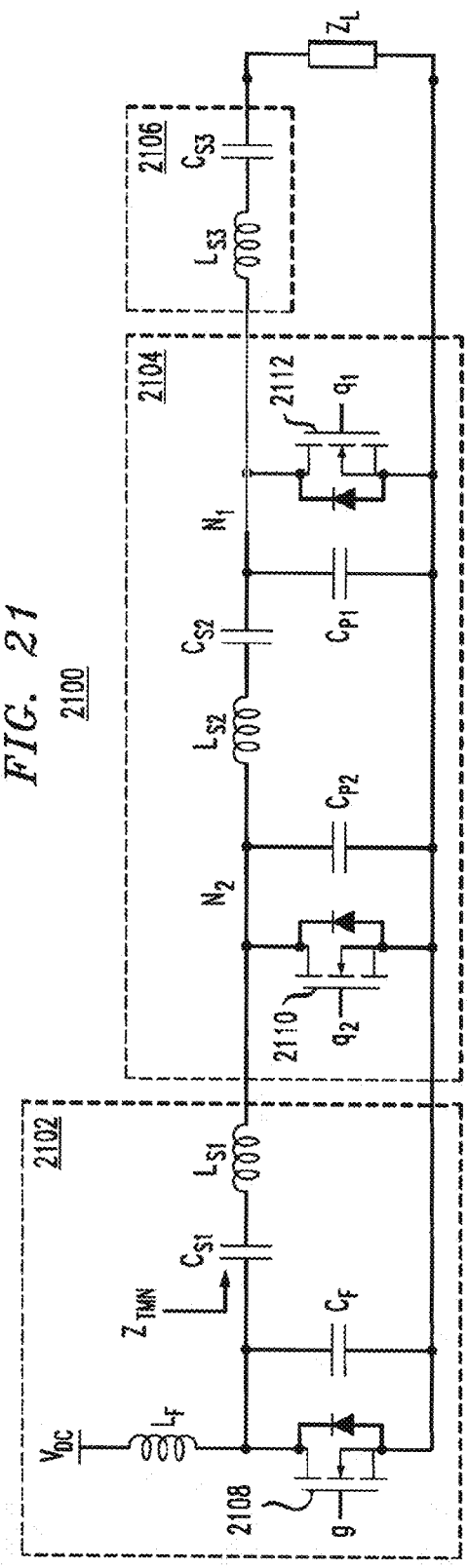
FIG. 20
2000
FIG. 21
2100

GENERATION AND SYNCHRONIZATION OF PULSE-WIDTH MODULATED (PWM) WAVEFORMS FOR RADIO-FREQUENCY (RF) APPLICATIONS

CROSS-REFERENCE TO RELATED APPLICATIONS

This application is a continuation of co-pending U.S. application Ser. No. 16/932,327 filed Jul. 17, 2020, now U.S. Publication No. 2020/0350863 A1 which is a continuation of U.S. application Ser. No. 16/126,553 filed Sep. 10, 2018, now U.S. Pat. No. 10,790,784 B2 which is a continuation-in-part (CIP) of U.S. application Ser. No. 15/918,410 filed Mar. 12, 2018 (now abandoned) which is a continuation of U.S. application Ser. No. 14/975,742 filed on Dec. 19, 2015, now U.S. Pat. No. 9,923,518 B2 which is a continuation of U.S. application Ser. No. 14/974,563, filed on Dec. 18, 2015, now U.S. Pat. No. 9,755,576 which claims the benefit under 35 U.S.C. § 119(e) of U.S. provisional application no. 62/094,144, filed on Dec. 19, 2014. Application Ser. No. 14/975,742 filed on Dec. 19, 2015, now U.S. Pat. No. 9,923,518 B2 also claims the benefit under 35 U.S.C. § 119(e) of U.S. provisional application no. 62/094,144, filed on Dec. 19, 2014. Each of the above applications are hereby incorporated herein by reference in their entireties.

BACKGROUND

As is known in the art, impedance matching networks are commonly used for maximizing power transfer within many radio frequency (RF) and microwave systems. For example, in RF transmitters, impedance matching networks might be used to provide an impedance match from an output impedance of an RF power amplifier (PA) to an impedance of an RF load (e.g., an antenna). Such impedance matching increases the transmitted power, reduces power loss and reduces or eliminates the need for additional circuit elements (e.g., isolators, etc.).

One class of impedance matching networks is referred to as tunable impedance matching networks (TMNs), sometimes called automatic antenna tuning units. Conventional TMNs might be implemented as single-element or lumped-element reactive networks where at least one of the reactive elements are variable (e.g., tunable) components such that the impedance of the variable components at a particular frequency, or over a range of frequencies, can be modified. The reactive elements within a TMN might be arranged in circuit topologies such as a ladder-network, an L-network, a T-network, or a Pi-network.

Conventional TMNs can be classified as either analog (continuously adjustable) or digital (adjustable among a set of discrete values). Analog TMNs utilize variable reactance elements having reactance values (at some frequency or over a range of frequencies) that can be tuned in a continuous manner by adjusting bias conditions. Digital TMNs implement the variable reactive elements as digitally switched arrays of static reactance elements. This approach allows adjustment of the impedance of the reactance values in finite and discrete steps.

Analog TMNs are often implemented using varactor diodes (or varactor diode circuits) or micro-electromechanical systems (MEMS) varactors. Although analog TMNs allow fast and accurate impedance matching over a wide range of impedances, relatively high bias voltages are required to operate at high power levels.

Digital TMNs are often implemented using CMOS switches, MEMS switches, PIN diodes or discrete power transistors. Although MEMS switches have low on-state resistance and can operate up to tens of GHz with low power consumption, MEMS switches require large control voltages. PIN diode and CMOS switch-based digital TMNs exhibit low-to-moderate on-state resistance and, thus, can handle high power levels at the expense of some resistive power loss. PIN diode and CMOS switch-based digital TMNs are favorable for on-die integration, for example for Software Defined Radio (SDR) integrated circuits (ICs) and other on-chip TMNs. Digital TMNs, however, exhibit limited tuning resolution, and hence, limited accuracy with which impedance matching can be achieved. In some high power applications where accurate impedance matching is required over a very wide impedance range, such as RF plasma drivers, the use of digital TMNs can be impractical due to the large number of digital switches needed to achieve the required fine-tuning resolution.

SUMMARY

This Summary is provided to introduce a selection of concepts in a simplified form that are further described below in the Detailed Description. This Summary is not intended to identify key or essential features or combinations of the claimed subject matter, nor is it intended to be used to limit the scope of the claimed subject matter.

In general overview, the concepts, systems and techniques described herein are directed toward methods and apparatus for generating one or more pulse width modulated (PWM) waveforms (signals) with the ability to dynamically control pulse width and phase with respect to a reference signal. The pulse width and phase of each PWM waveform (with respect to the reference signal) can be independently adjusted over a 0° to 360° range with arbitrarily fine resolution that is not affected by the operating frequency. The generated PWM signals are capable of maintaining phase and frequency lock to the reference signal for a wide modulation range of the reference signal frequency. The concepts, systems, devices and techniques described herein are suitable for generating accurate and dynamically adjustable PWM waveforms for HF and VHF applications. They have particular value in applications in which a reference signal is derived from a radio frequency (RF) input source with respect to which precise timing of the PWM must be maintained, including phase-switched impedance modulation (PSIM) based tunable matching networks (TMNs) and PSIM amplifiers. Such circuits find application in high power microwave plasma systems for use in connection with semiconductor processing and cleaning of semiconductor processing equipment, for example.

In one aspect of the concepts, systems, and techniques described herein, a pulse width modulation (PWM) generator includes a phase-shifting circuit that has at least one input and a plurality of outputs. The phase-shifting circuit is configured to receive a reference signal and, in response, provide a phase-shifted signal on each of said two or more outputs. Each phase-shifted signal can have a phase shift relative to the reference signal. The PWM generator can further include a waveform combiner. The waveform combiner can have a plurality of inputs with each input coupled to a respective output of the phase-shifting circuit. The waveform combiner can be configured to receive the phase-shifted signals from the phase-shifting circuit and, in response, generate a PWM signal having a pulse width and phase-shift relative to the reference signal.

With this arrangement, a PWM generator for generating a PWM signal with a pulse width and phase shift relative to a reference signal is provided. In embodiments, the pulse width and phase shift relative to the reference signal of the PWM signal can be dynamically controlled. Because the waveform combiner is configured to generate the PWM in response to the phase-shifting signals, altering the phase-shifting signals may adjust the pulse width and phase shift relative to the reference signal of the PWM signal.

In embodiments, the phase-shifting circuit can include a plurality of phase-shifting elements coupled in a parallel architecture or in a cascaded architecture.

In embodiments, the phase-shifting circuit can include an In-phase/quadrature-phase (IQ) modulator having at least three inputs and at least one output. One input of the IQ modulator can be configured to receive the reference signal and two other inputs of the IQ modulator can be configured to receive baseband signals derived from the reference signal. The IQ modulator can include an adder coupled between its output and at least two of its inputs.

In embodiments, the waveform combiner can include at least one of an edge detector, logic gate, flip-flop, or amplifier. The waveform combiner can also include a plurality of amplifiers that each have an input and an output. Each input of the amplifiers can be configured to receive a phase-shifted signal. The waveform combiner can further include a logic gate that has a plurality of inputs and at least one output. Each input of the waveform combiner can be configured to be coupled to the output of at least one amplifier.

In embodiments, phase-shifting circuit can be configured to generate two or more phase shifted signals based upon at least one predetermined phase-shift parameter. The phase-shifting circuit can also be configured to receive the at least one predetermined phase-shift parameter from a controller. The controller can be configured to generate at least one predetermined phase-shift parameter based upon the pulse width and phase-shift relative to the reference signal of the generated PWM signal.

In embodiments, the PWM generator can be realized in an integrated circuit.

The PWM generation techniques presented herein rely on the use of phase-shifting elements that take an input waveform and generate an output waveform locked to the input in both phase and frequency (or in both delay and frequency), The phase shift (or delay) between the input and the output can be dynamically controlled (via digital or analog methods), and the resolution with which the phase shift can be set ultimately determines the resolution with which one can adjust the phase and pulse width of a PWM signal. These phase-shifting elements can be cascaded or connected in parallel to form cascaded or paralleled system architectures respectively.

In another aspect of the concepts, systems and techniques described herein, an apparatus for generating dynamically controlled pulse width modulation (PWM) signals. The apparatus can include two or more phase-shifting elements. Each phase-shifting element can have an input and output with the input of each phase-shifting element that can be configured to receive a reference signal. The apparatus can further include a waveform combiner that can be electronically coupled to the outputs of the phase-shifting elements. Each phase-shifting element can be configured to generate a respective phase-shifted signal at its output based upon the reference signal and a respective predetermined phase-shift parameter. Also, the waveform combiner can be configured to generate a PWM signal having a pulse width and pulse shift based upon the phase-shifted signals generated at the outputs of the phase-shifting elements.

With this particular arrangement, a parallel architecture for generating a desired PWM signal is provided. In embodiments, the PWM signal can have a dynamically adjustable pulse width and phase shift relative to the reference signal. By adjusting the phase-shift parameters of the phase-shifting elements, the pulse width and phase shift of the PWM signal can be dynamically controlled.

In embodiments, each predetermined phase-shift parameter can include at least one of a predetermined phase shift or a predetermined pulse width.

In embodiments, at least one of the phase-shifting elements can include an In-phase/Quadrature modulator or a phase-lock loop.

In embodiments, each phase-shifting element can be coupled to a respective control signal. Each respective control signal can include the respective predetermined phase shift parameter. The apparatus can further include a phase detector coupled to the reference signal and the generated PWM signal. In embodiments, the phase detector can be configured to generate a phase correction signal based upon a comparison of the reference signal to the generated PWM signal. The phase correction signal can be provided to each phase-shifting element.

In embodiments, the waveform combiner can include at least one edge detector, each edge detector being coupled to at least one flip-flop. The flip-flop can be configured to generate the PWM signal based upon a rising edge of at least one generated phase-shifted signal and a rising edge of at least one other generated phase-shifted signal.

In another aspect of the concepts, systems and techniques described herein, an apparatus for generating dynamically controlled pulse width modulation (PWM) signals is provided. The apparatus can include a first phase-shifting element having input and outputs. The input of the first phase-shifting element can be coupled to a reference signal. The apparatus can also include a second phase-shifting element that can have an input and output. The input of the second phase shifting element can be coupled to the output of the first phase-shifting element. The apparatus can also include a waveform combiner that can be electronically coupled to the outputs of the first and second phase-shifting elements. The first phase-shifting element can be configured to generate a first phase-shifted signal at its output based upon the reference signal and a respective predetermined phase shift. The second phase-shifting element can be configured to generate a second phase-shifted signal at its output based upon the first phase-shifted signal and a respective predetermined phase shift. The waveform combiner can be configured to generate a PWM signal having a pulse width and pulse shift based upon the first and second phase-shifted signals.

With this particular arrangement, a cascaded architecture for generating a desired PWM signal is provided. In this arrangement, each phase-shifting element may receive a distinct, unrelated phase-shift parameter. Due to this, fewer phase-shift parameters may need to be adjusted to achieve a desired pulse width and phase-shift relative to the reference signal for the generated PWM signal.

In embodiments, each predetermined phase-shift parameter can include at least a predetermined phase shift or a predetermined pulse width.

In embodiments, at least one of the phase-shifting elements can include an In-phase/Quadrature modulator. The apparatus can also include a control circuitry coupled to the at least one In-phase/Quadrature modulator, said control circuitry configured to provide a control signal to the at least one In-phase/Quadrature modulator. In embodiments, the control signal can include a respective predetermined phase shift parameter for the In-phase/Quadrature modulator.

In embodiments, at least one of the phase-shifting elements comprises a phase-lock loop.

In embodiments, the apparatus can further include a phase detector that can be coupled to the reference signal and the generated PWM signal. The phase detector can be configured to generate a phase correction signal based upon a comparison of the reference signal to the generated PWM signal. In embodiments, each phase-shifting element can further be configured to generate a phase-shifted signal based upon the phase correction signal.

In embodiments, the waveform combiner can include at least one logic gate. The logic gate can be configured to compare the first and second phase-shifted signals.

In still another aspect of the concepts, systems and techniques described herein, an apparatus for generating dynamically controlled pulse width modulation (PWM) signals is described. The apparatus can include a first set of phase-shifting elements electronically coupled in parallel and each having an input and output. The inputs of the first set of phase-shifting elements can each electronically coupled to a reference signal. The apparatus can also include a second set of phase-shifting elements electronically coupled in parallel and each having an input and output. The inputs of the second set of phase-shifting elements can each electronically coupled to the output of at least one phase-shifting element of the first set. The apparatus can also include a waveform combiner electronically coupled to the outputs of the phase-shifting elements of the first and second sets. Each phase-shifting element of the first set can be configured to generate a respective phase-shifted signal at its output based upon the reference signal and a respective predetermined phase shift. Each phase-shifting element of the second set can be configured to generate a respective phase-shifted signal at its output based upon at least one phase-shifted signal generated by a phase-shifting element of the first set and a respective predetermined phase shift. The waveform combiner can be configured to generate a dual-pulse PWM signal having a first pulse with a pulse width and pulse shift based upon the phase-shifted signals generated by the phase-shifting elements of the first set. The PWM signal can also have a second pulse with a pulse width and pulse shift based upon the phase-shifted signals generated by the phase-shifting elements of the second set.

With this particular arrangement, an architecture for generating a dual pulse PWM signal is provided. The dual pulse PWM signal can have two pulse widths and phase shifts relative to a reference signal that can be dynamically adjusted. By having two pulse widths and phase shifts, multiple phase-switched reactance elements can be driven at once.

In embodiments, the phase-shifting elements of the first set can be electronically coupled in a parallel architecture. The inputs of each phase-shifting element of the first set can be coupled to the reference signal.

In embodiments, the phase-shifting elements of the first set can be coupled in a cascading architecture In still another aspect of the concepts, systems and techniques described herein a method for generating dynamically controlled pulse width modulation (PWM) waveforms is provided. The method can include receiving a reference signal at one or more phase-shifting elements. Each phase-shifting element can have a respective predetermined phase-shift parameter. The method can also include generating respective phase-shifted signals at outputs of the one or more phase-shifting elements based upon the reference signal and the respective predetermined phase shift parameters. The method can further include combining the generated phase-shifted signals to obtain a PWM waveform having a pulse width and phase shift based upon the predetermined phase shift parameters of the phase-shifting elements.

With this particular arrangement, a method for generating a PWM signal with dynamically controlled pulse widths and phase shifts relative to a reference signal is provided. By adjusting the phase-shift parameters, the pulse width and phase shifts of the PWM signal can be dynamically controlled.

In embodiments, each respective predetermined phase shift parameter can include at least one of a respective predetermined phase shift or respective predetermined pulse width.

In embodiments, the method can further include providing a respective control signal to each phase-shifting element. The control signal can include the respective predetermined phase shift parameter.

In embodiments, the method can also include generating a phase correction signal based upon a comparison of the reference signal to the PWM waveform.

In embodiments, the method can further include adjusting the generated phase-shifted signals based upon the phase correction signal.

In still another aspect of the concepts, systems and techniques described herein a power generation and delivery system having an input port and an output port is provided. The power generation and delivery system can include a pulse width modulation (PWM) signal generator that can include one or more phase-shifting elements. The PWM signal generator can be to generate a PWM signal based upon a phase-shift parameter associated with the one or more phase-shifting elements. The power generation and delivery system can also include a phase-switched tunable impedance network coupled to the output port. The phase-switched tunable impedance network can be configured to receive a generated PWM signal from the PWM signal generator, and, in response, can vary an impedance thereof to modulate an impedance presented to the output port.

With this particular arrangement, a phase-switched tunable impedance (PSIM) network driven by a PWM signal is provided. Because the PWM signal generated by the PWM generator can have its pulse width or phase shift relative to a reference signal dynamically adjusted, these parameters may be adjusted in order to change the impedances presented by the PSIM.

In embodiments, the one or more phase-shift elements are electronically coupled in a parallel architecture or cascading architecture.

BRIEF DESCRIPTION OF THE DRAWING FIGURES

Other aspects, features, and advantages of the broad concepts sought to be protected herein will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

FIG. 9 is a plot of current and voltage versus phase with respect to a control signal of a full-wave switched variable inductance element;

Figure 11:
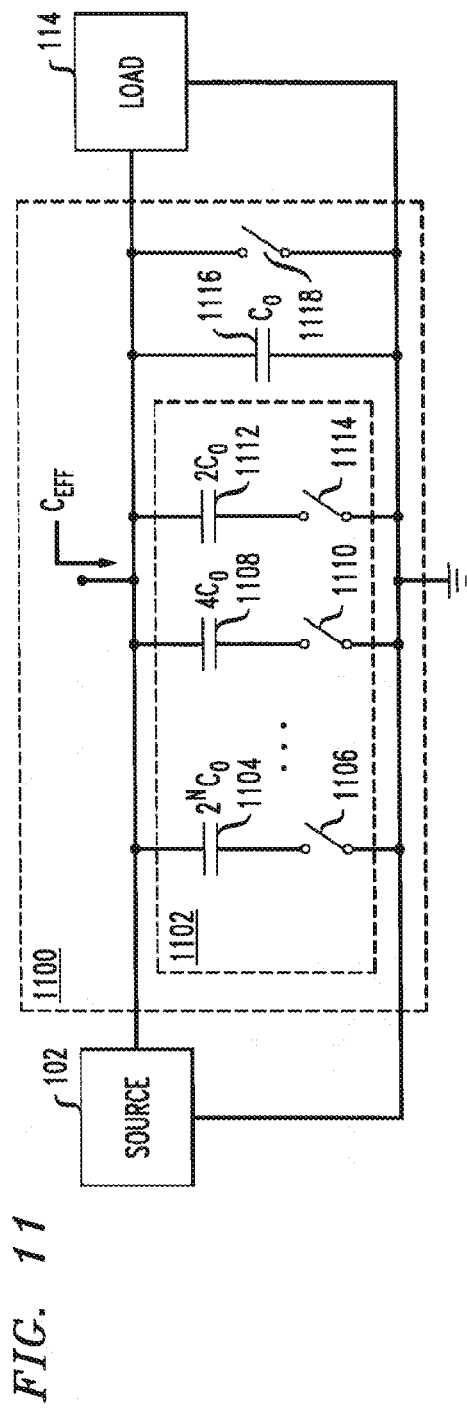
Figure 12:
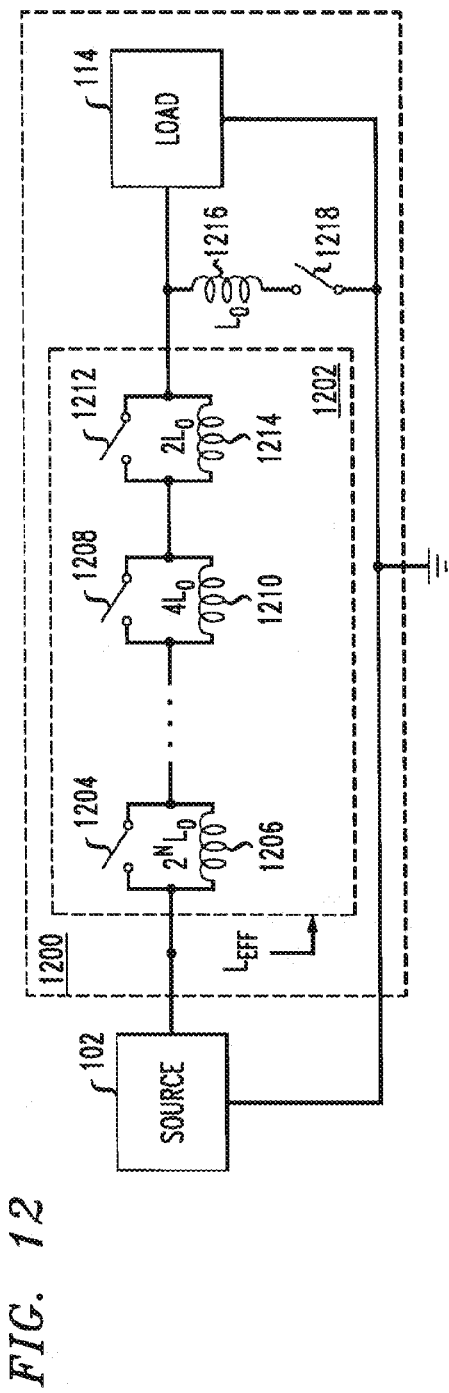
Figure 13:
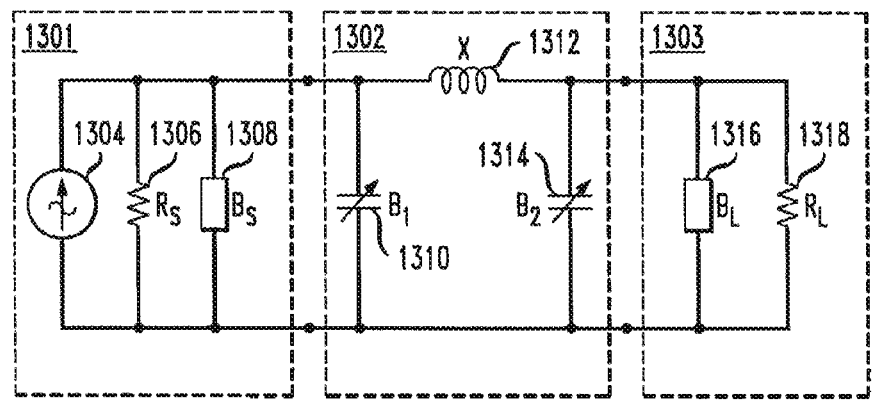
Figure 14:
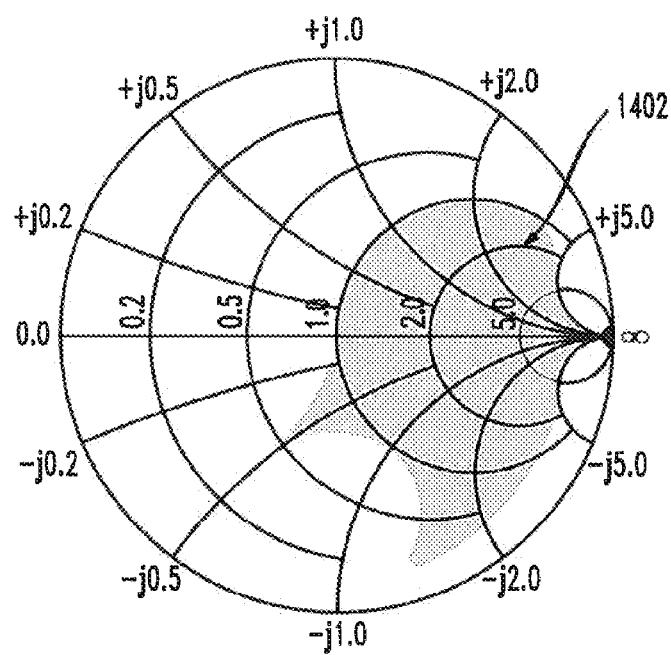
Figure 15:
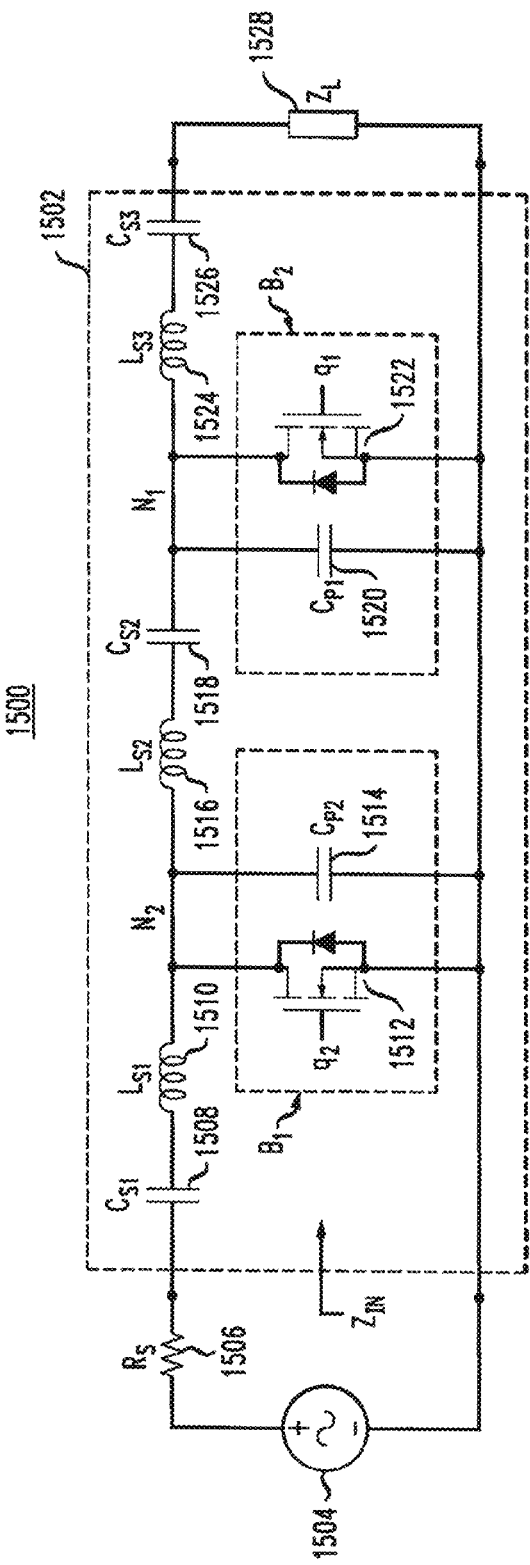
Figure 16:
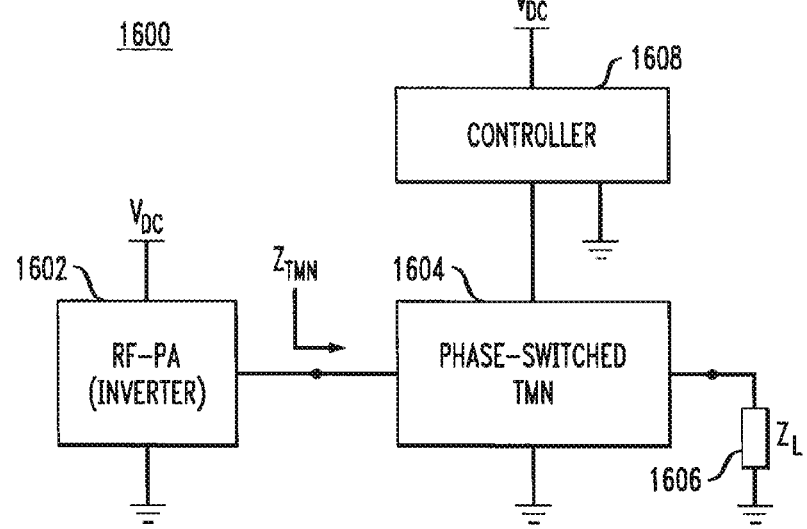
Figure 17:
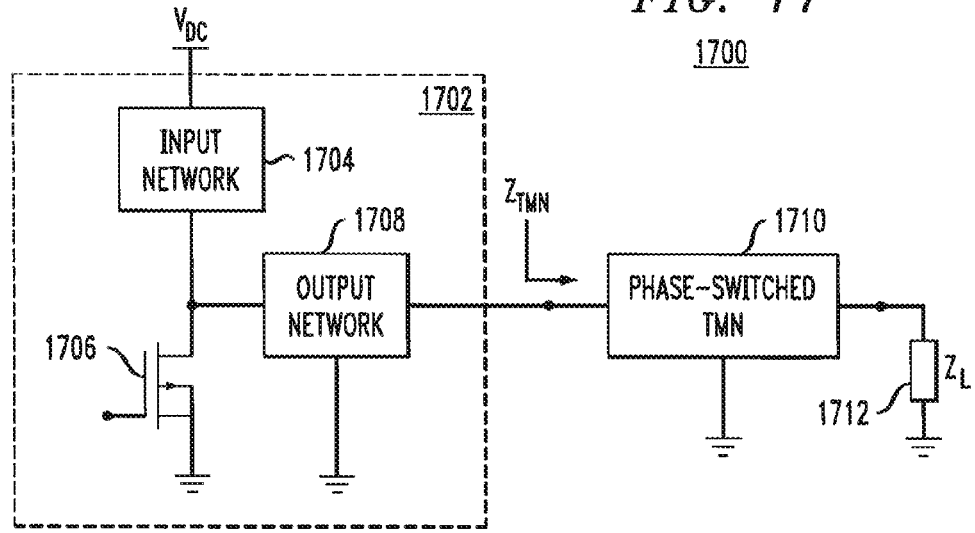
Figure 19:
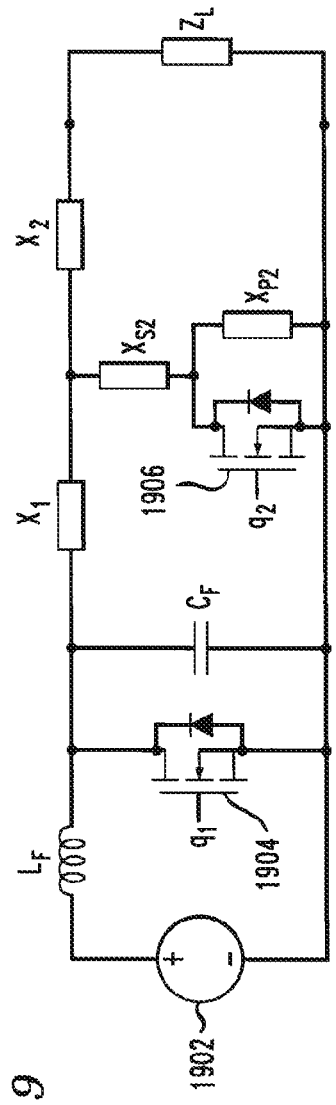
Figure 22:
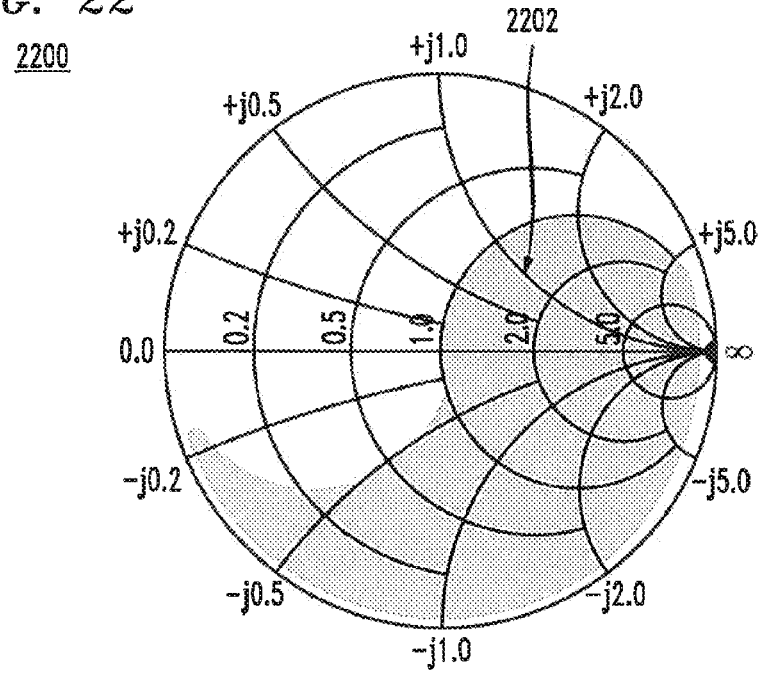
Figure 23:
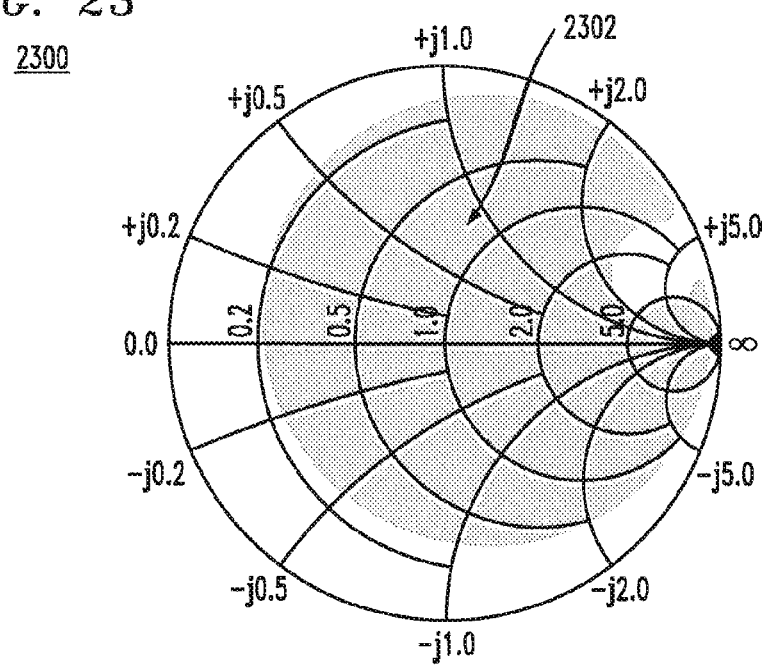
Figure 24:
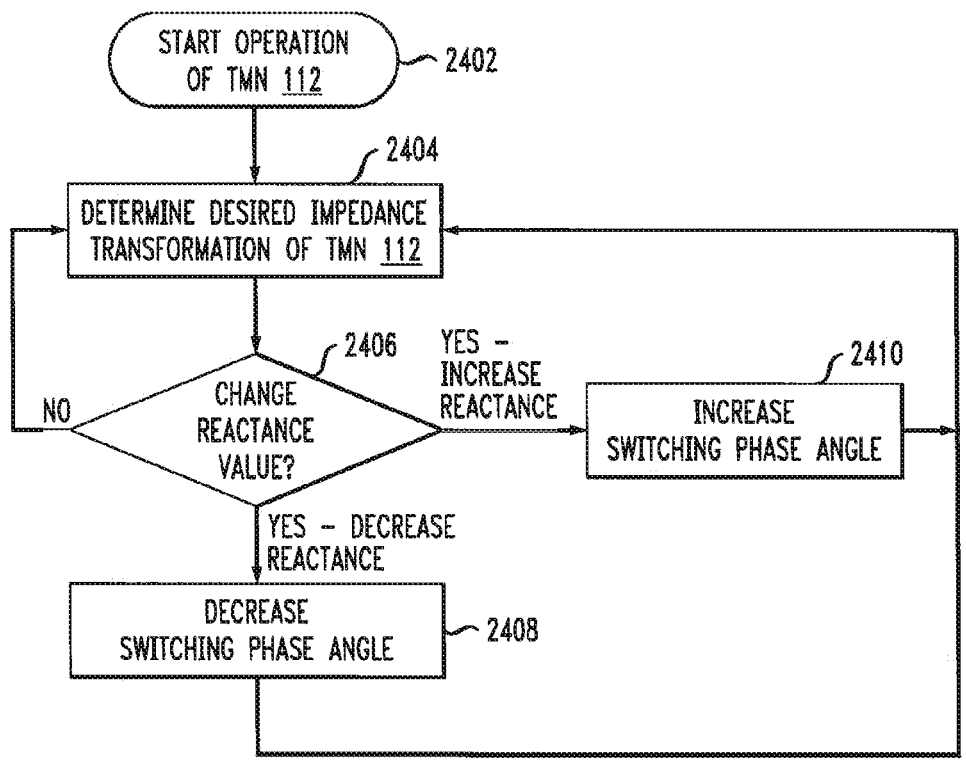
Figure 25A:
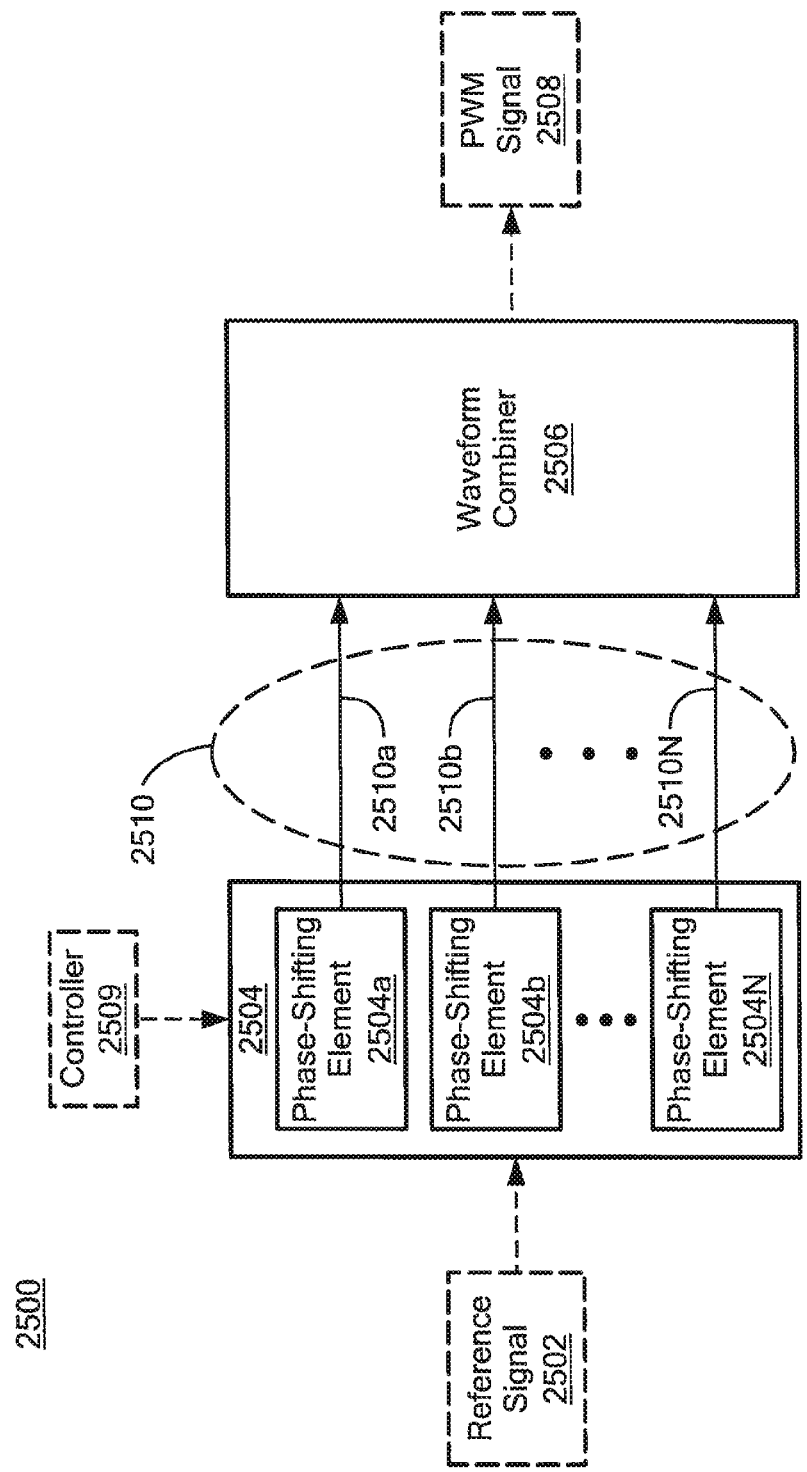
Figure 25B:
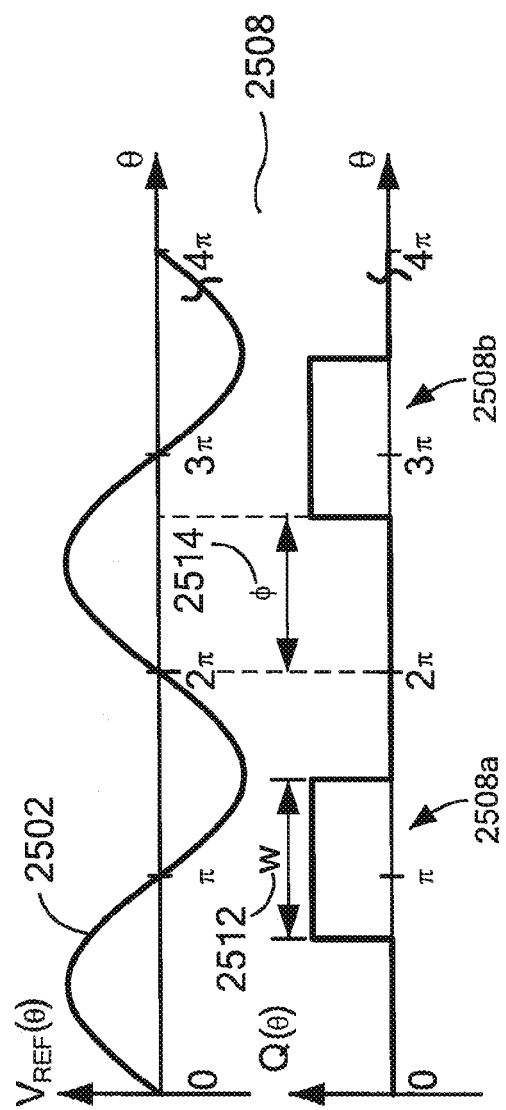
Figure 26:
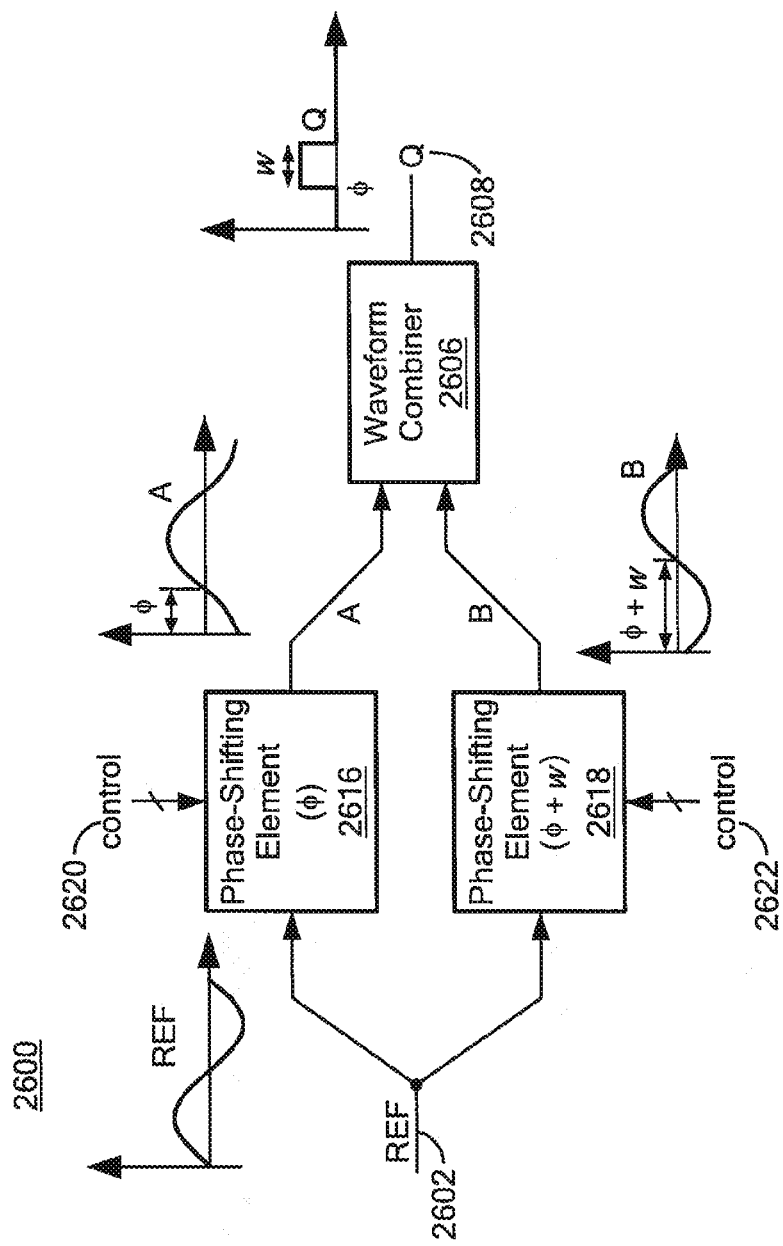
Figure 27:
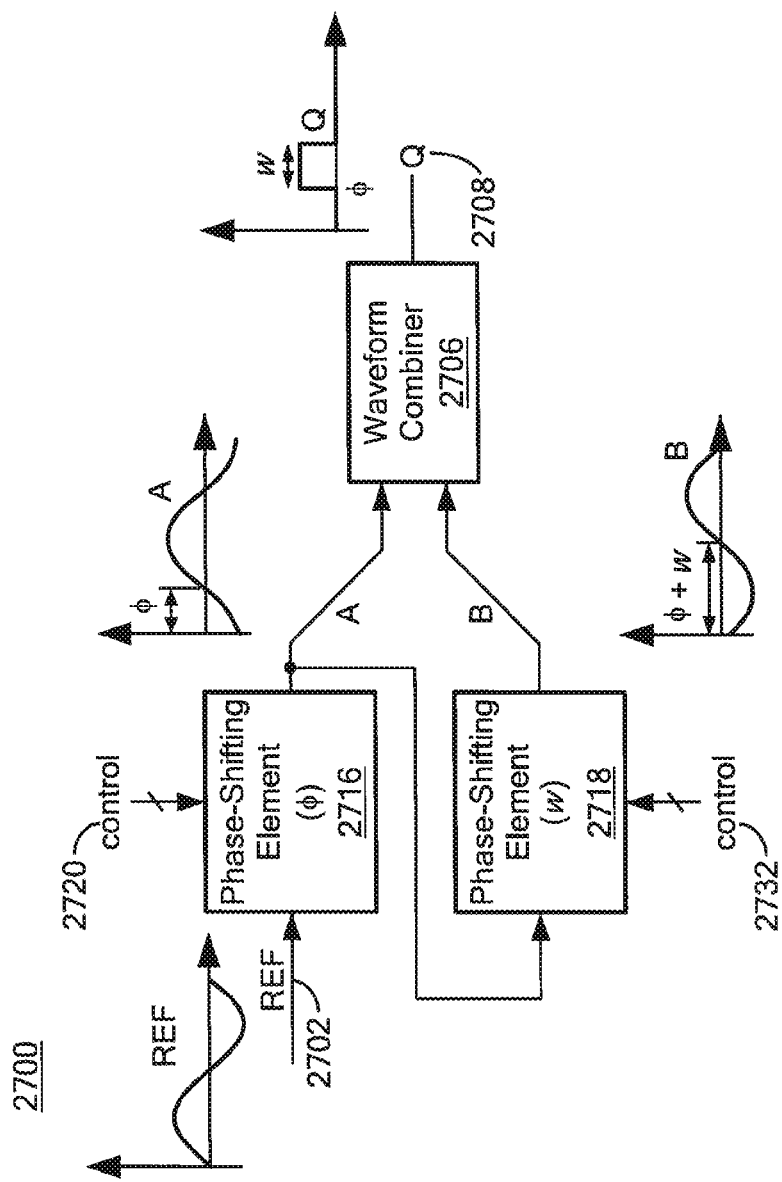
Figure 28:
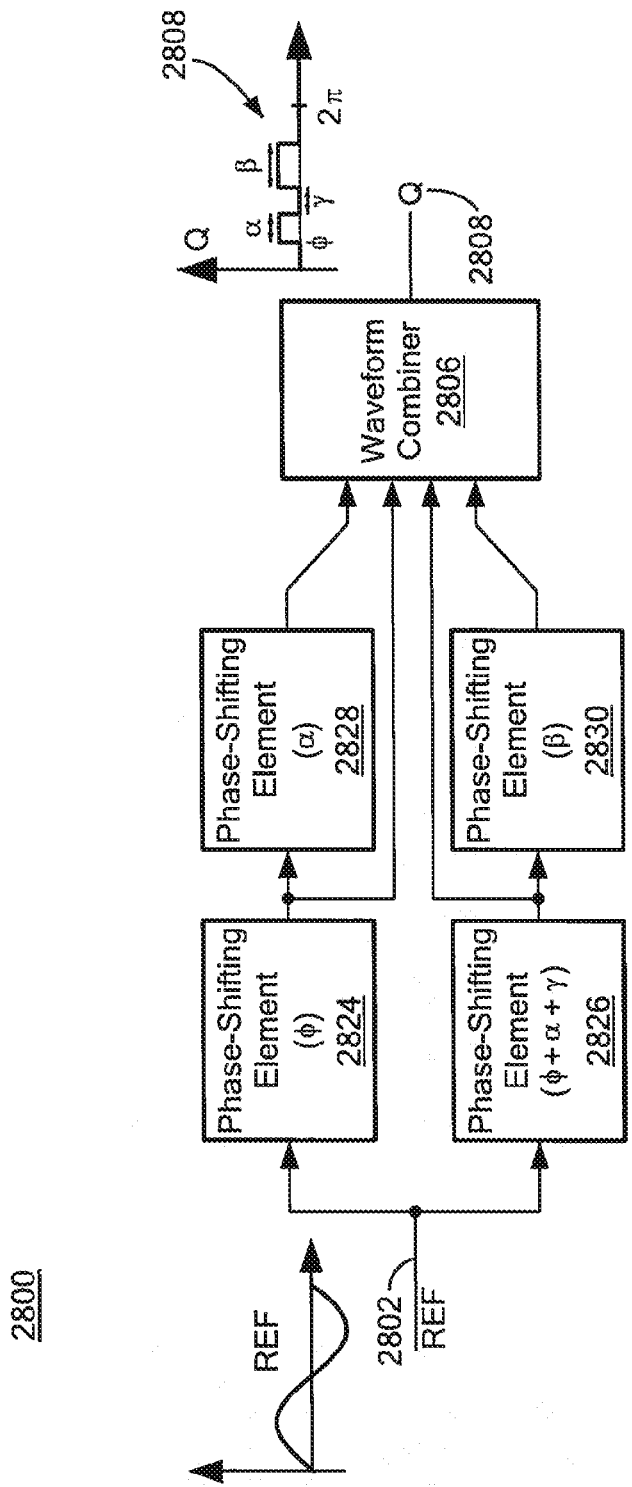
Figure 29:
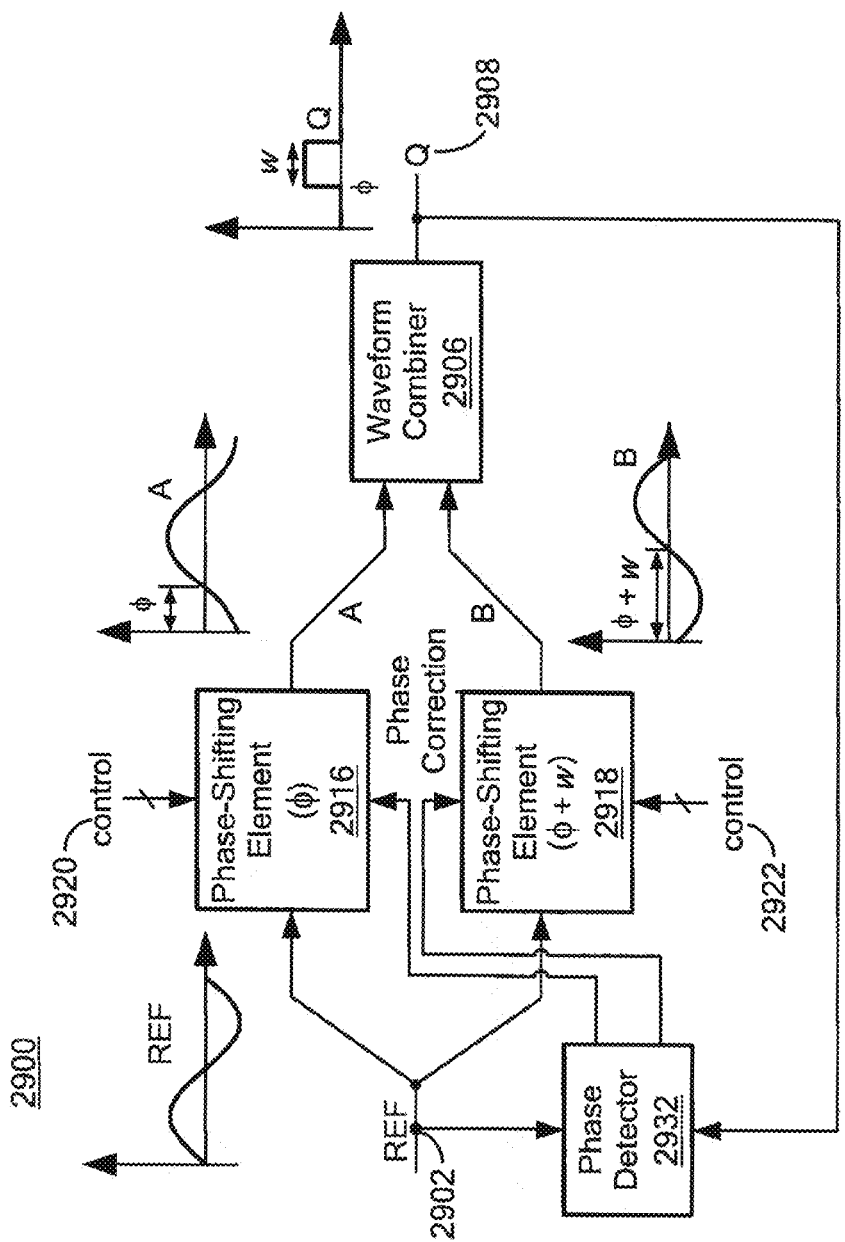
Figure 30:
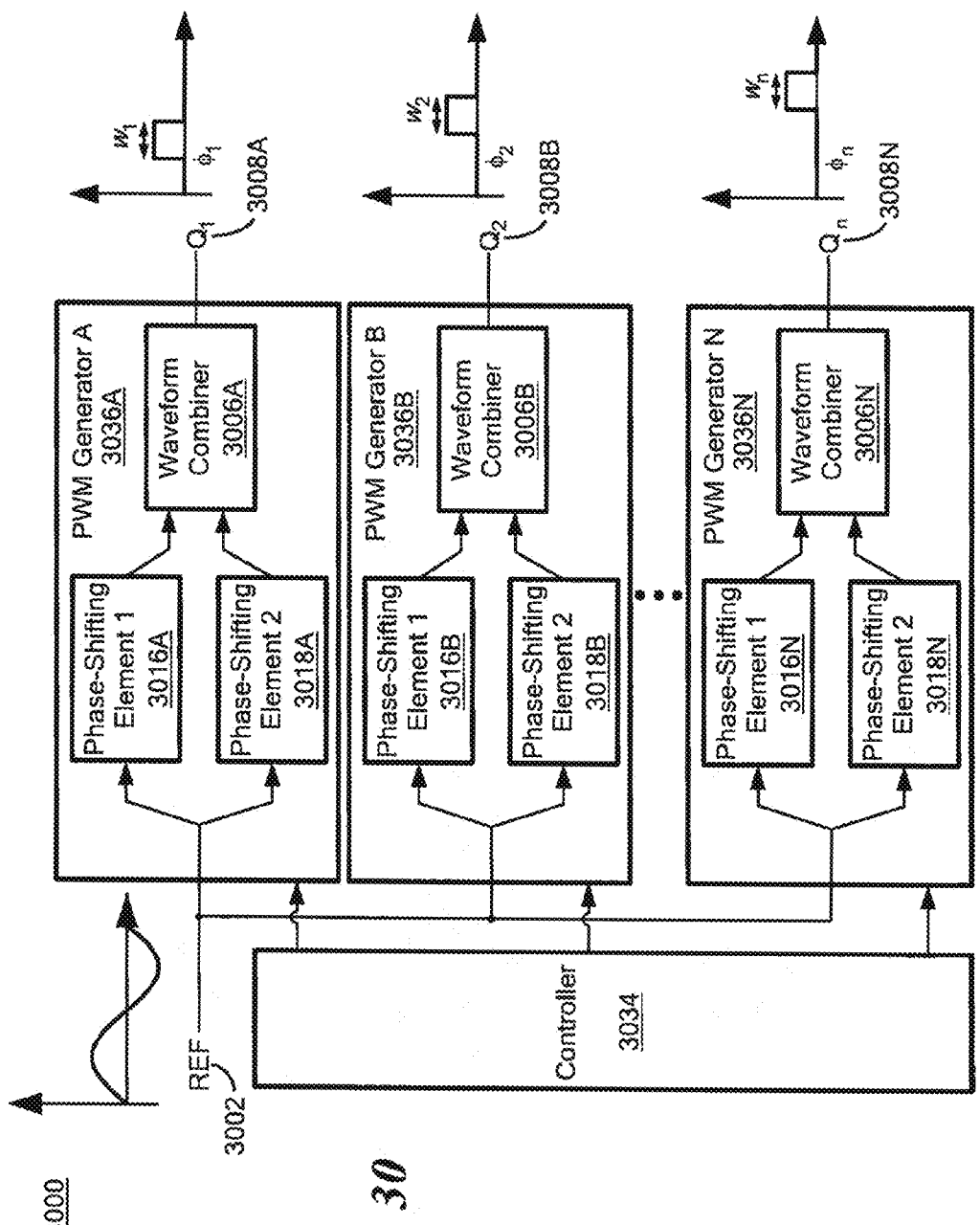
Figure 31:
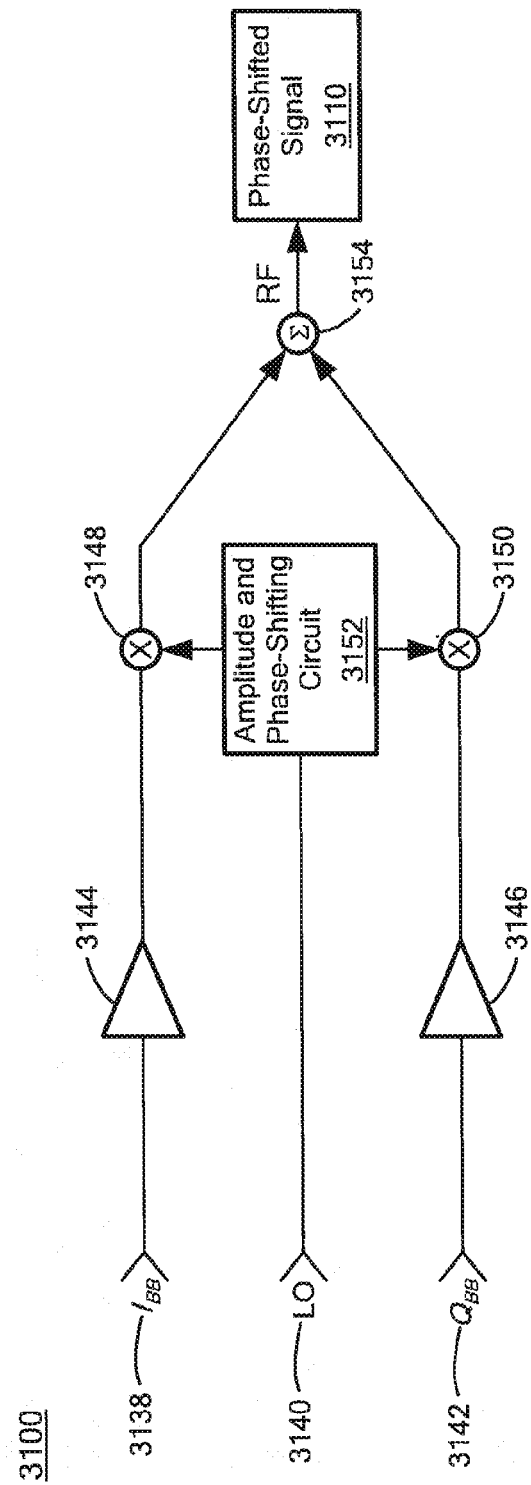
Figure 32:
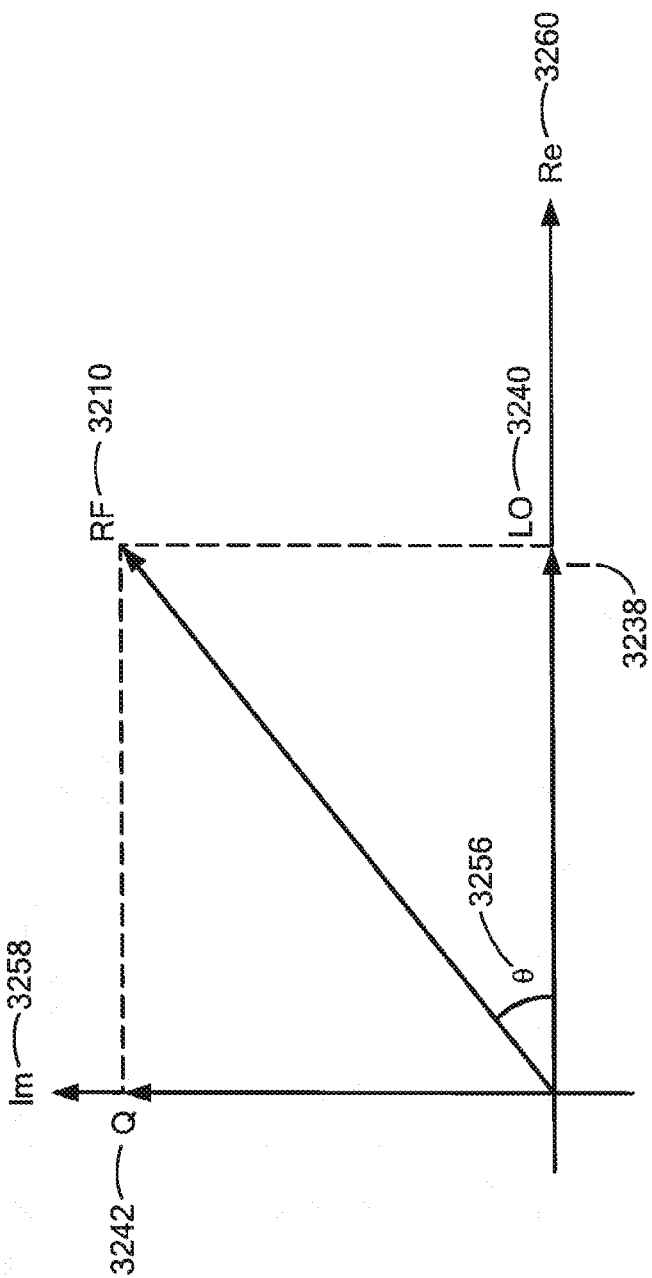
Figure 33:
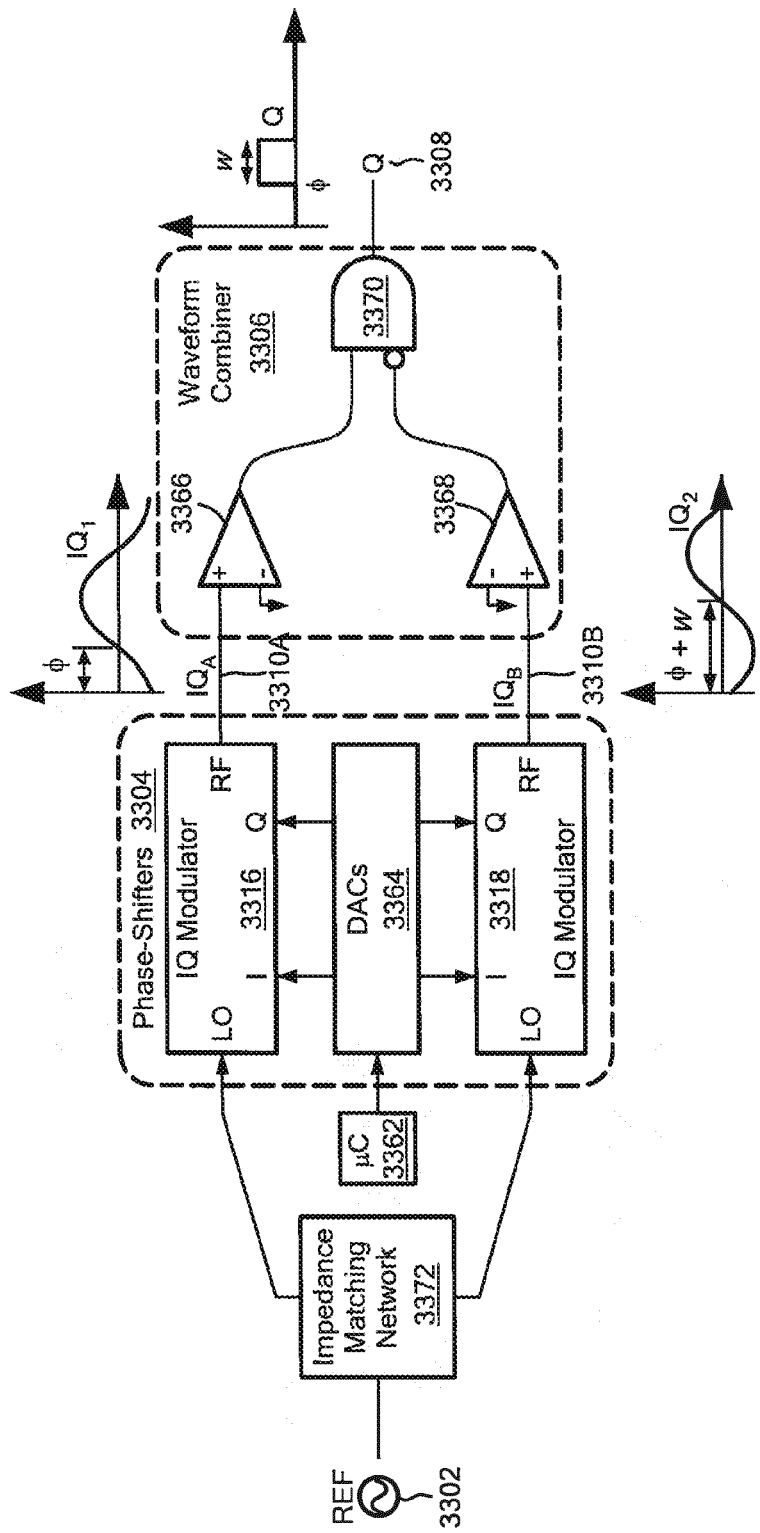
Figure 34:
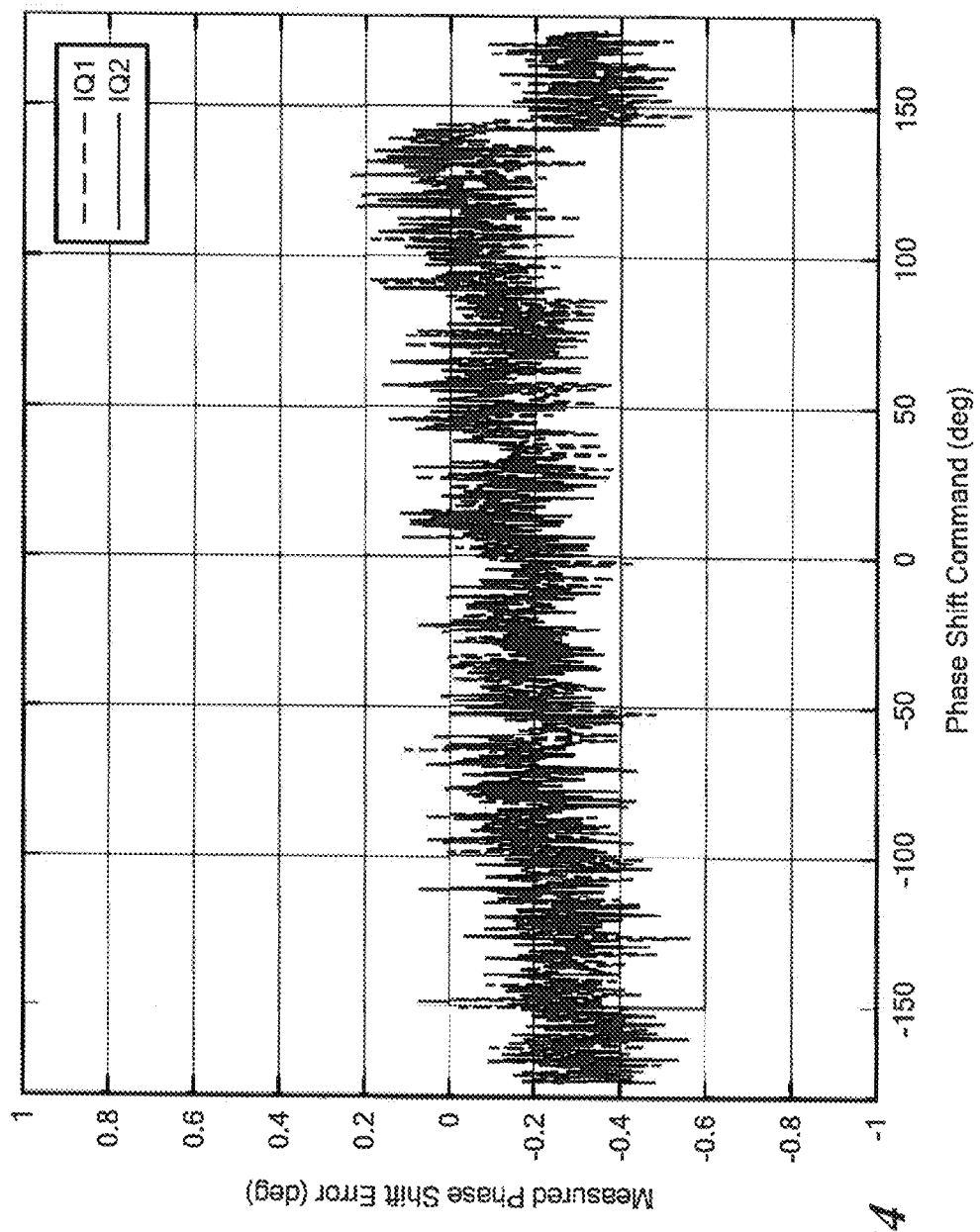
Figure 35:
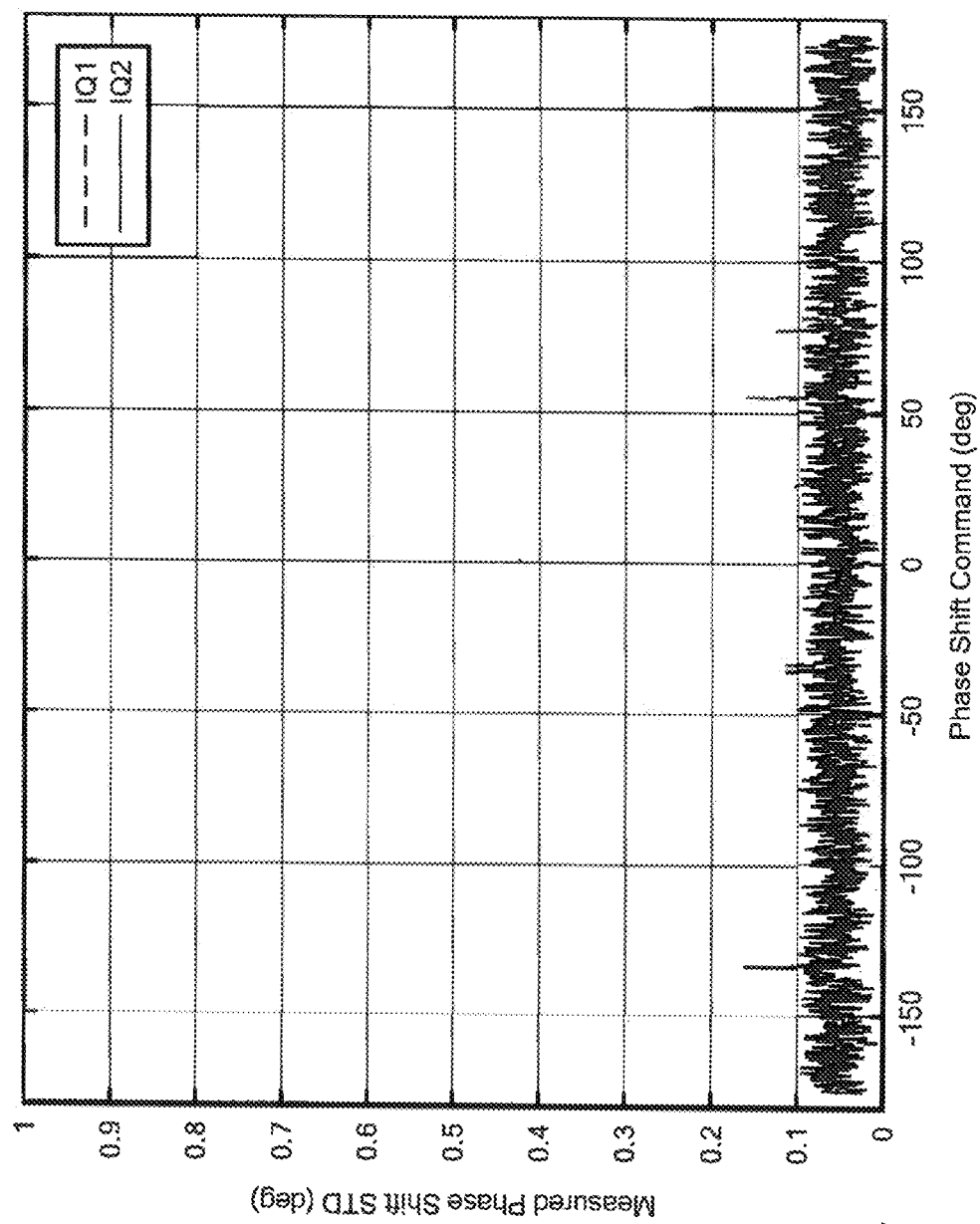
Figure 36:
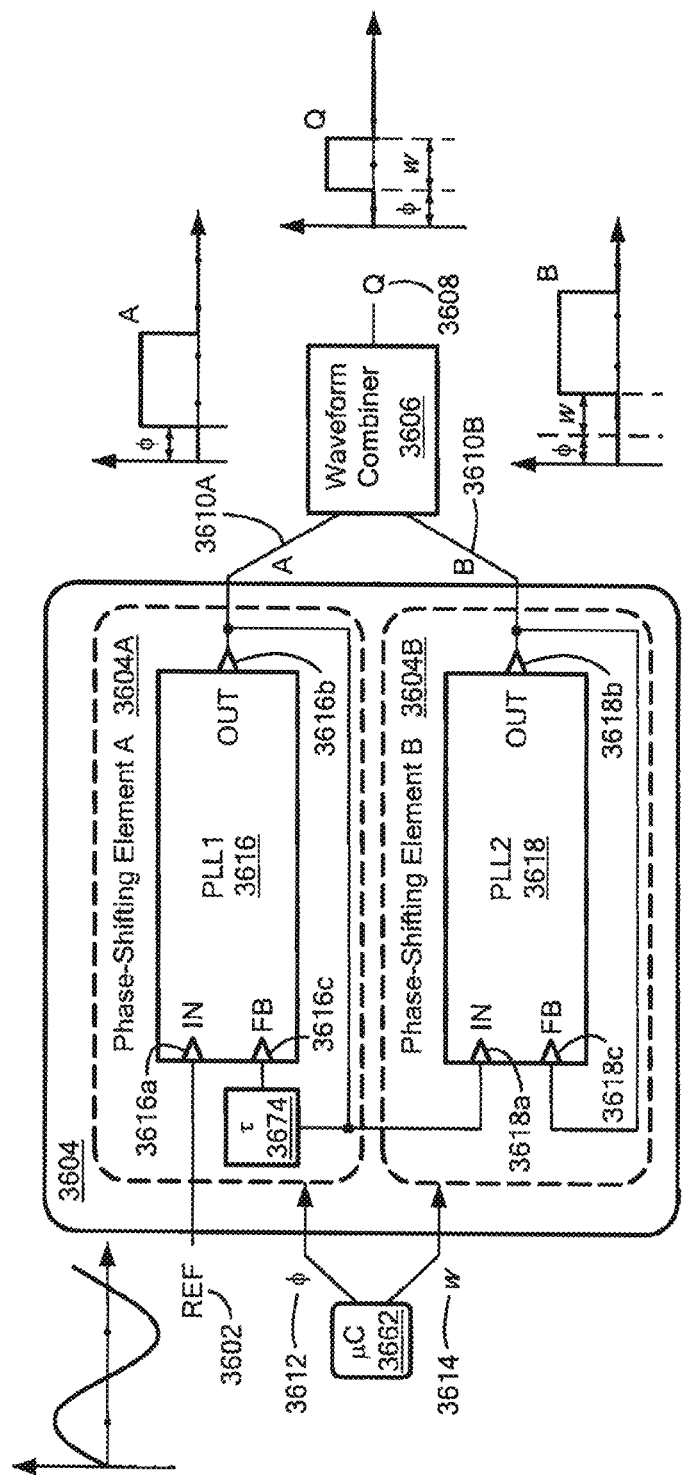
Figure 37:
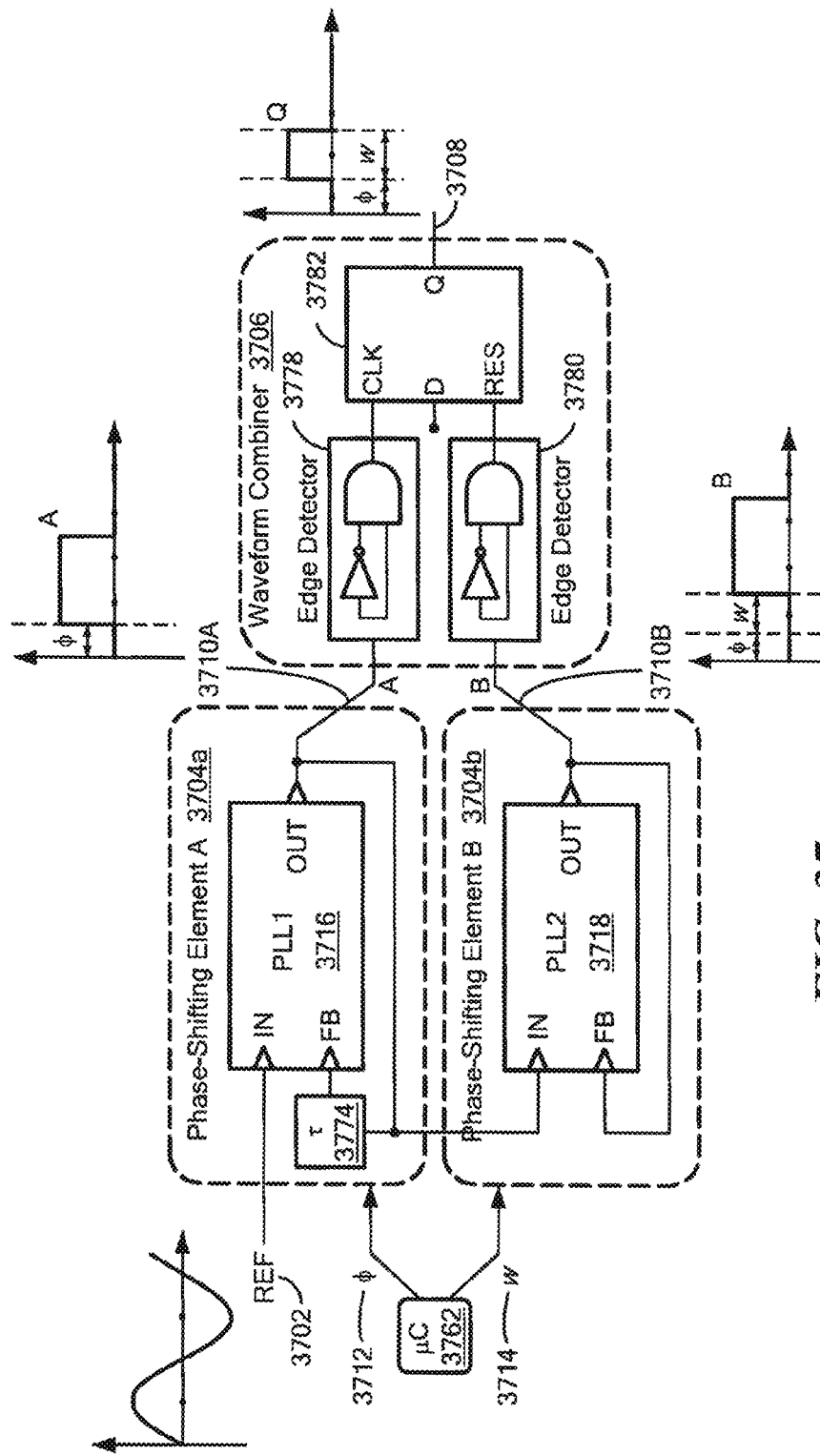
Figure 38:
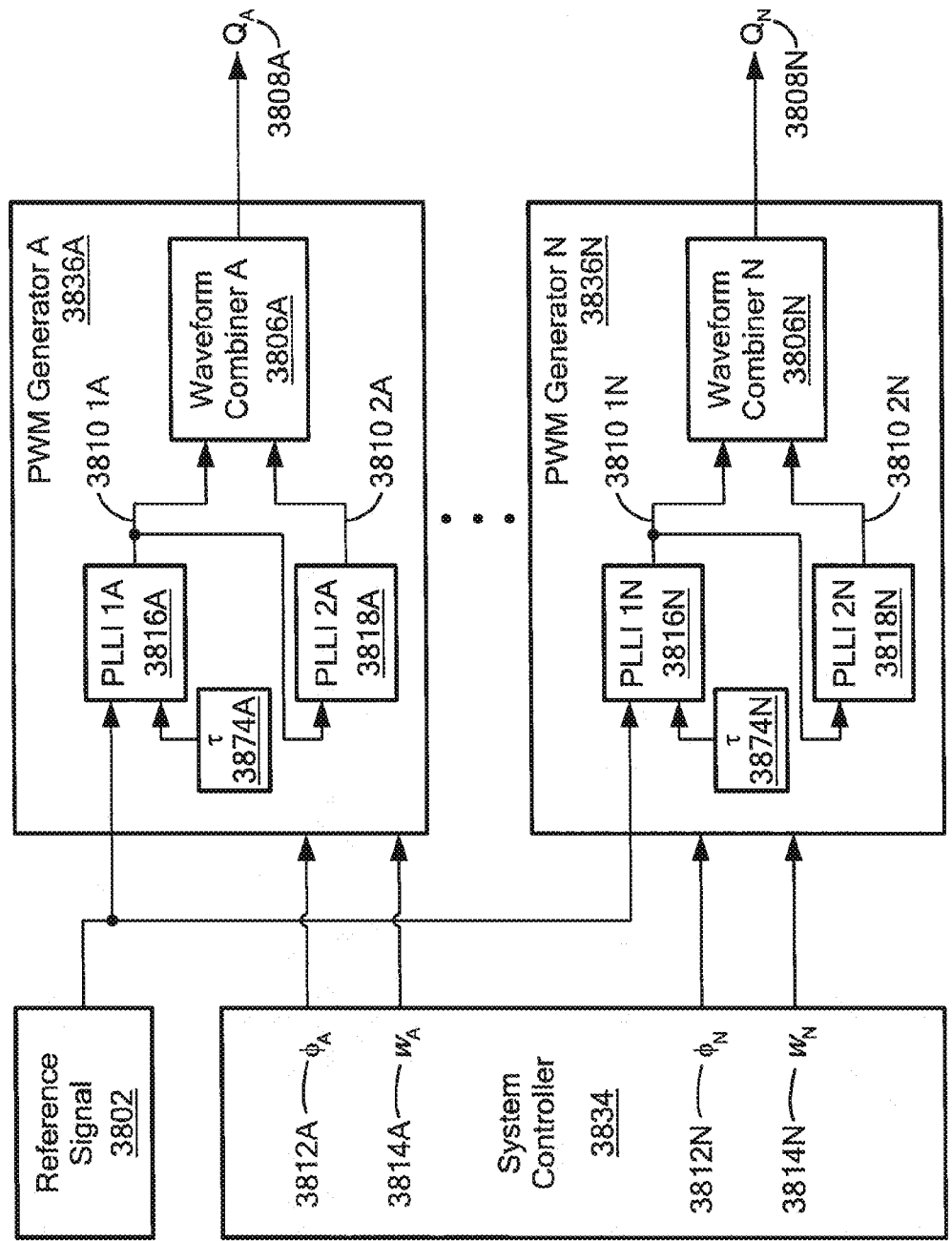
Figure 39:
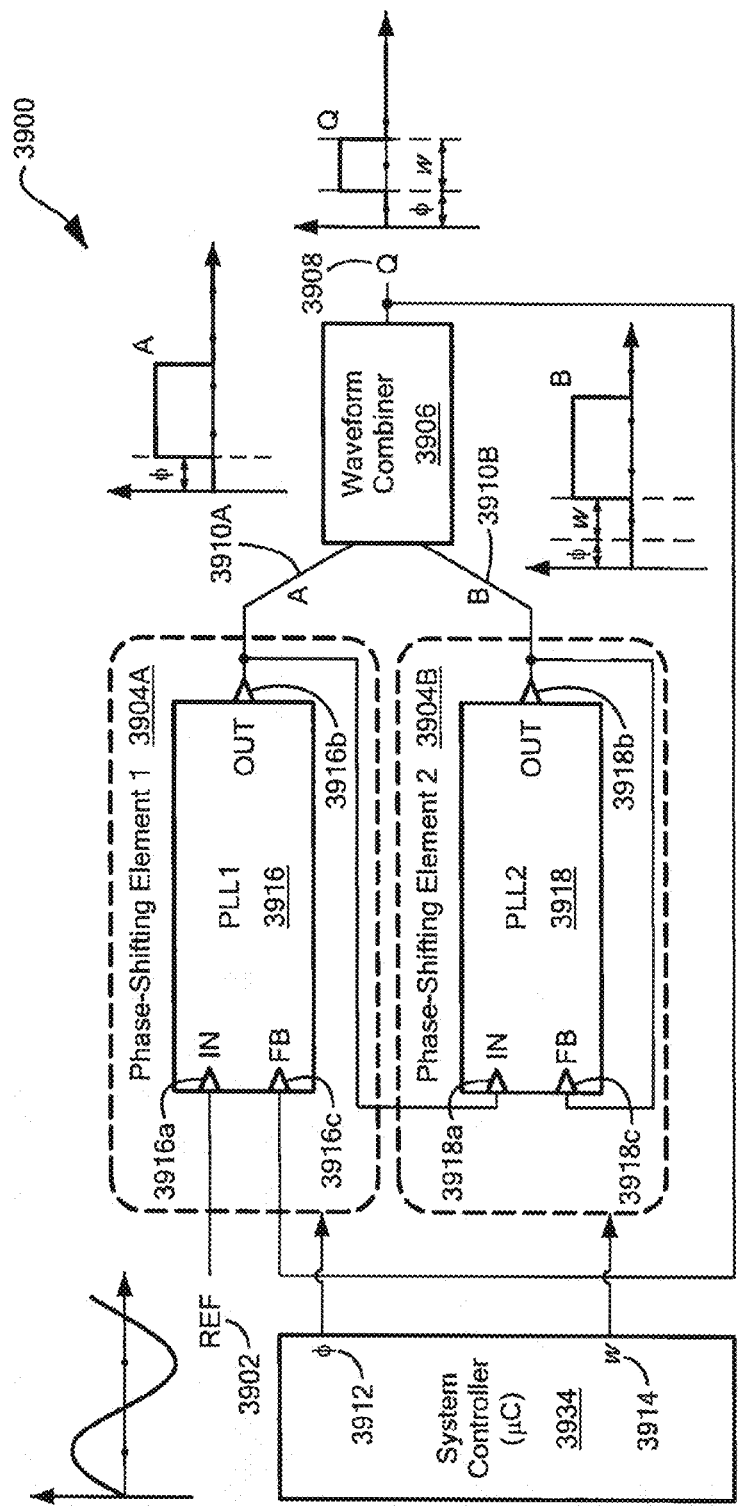
Figure 40:
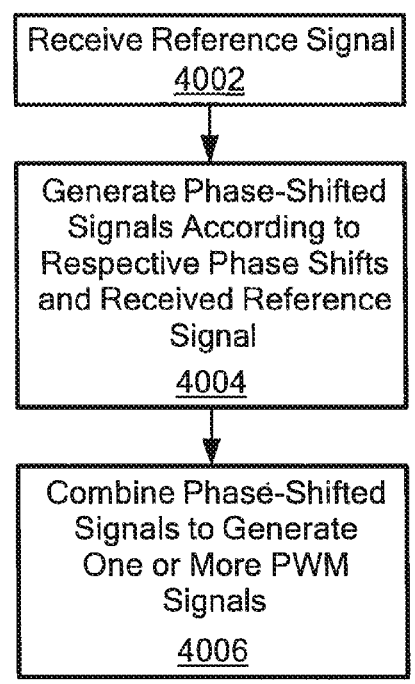
Figure 41A:
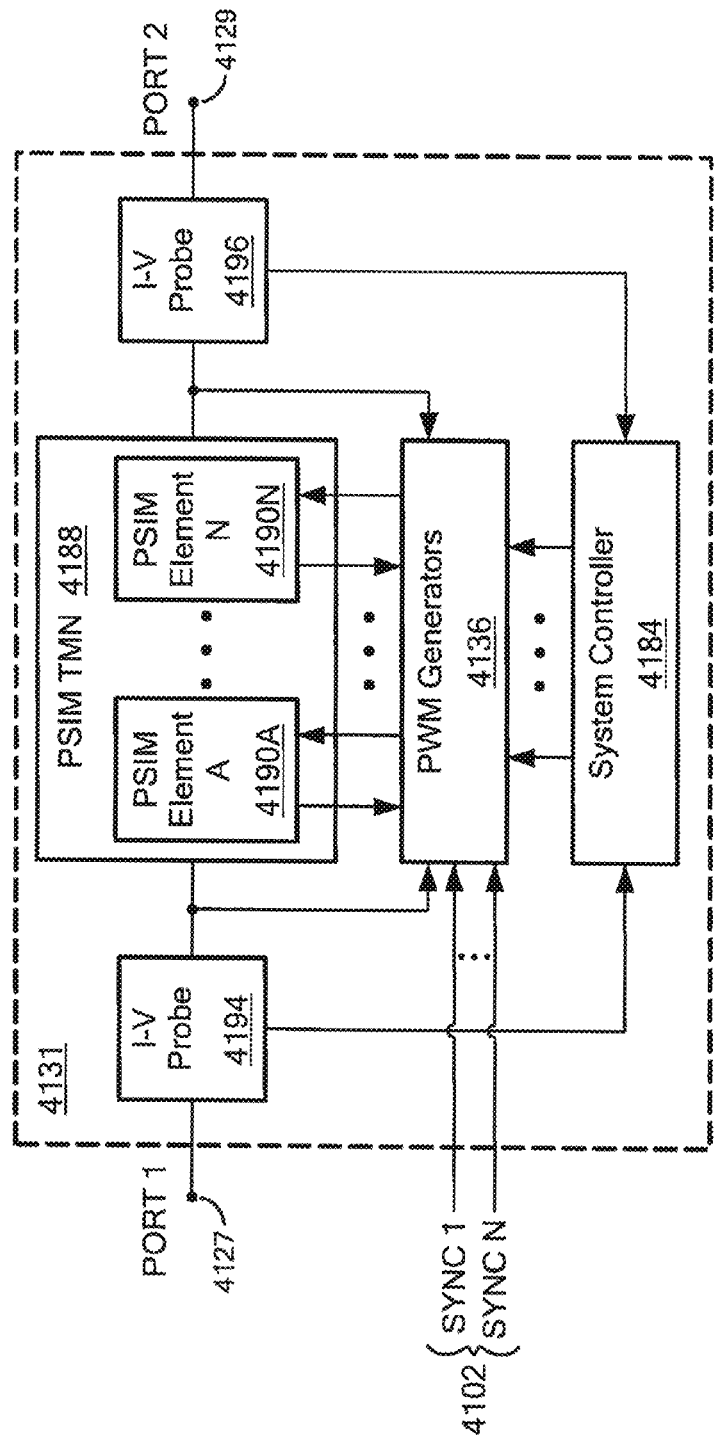
Figure 41B:
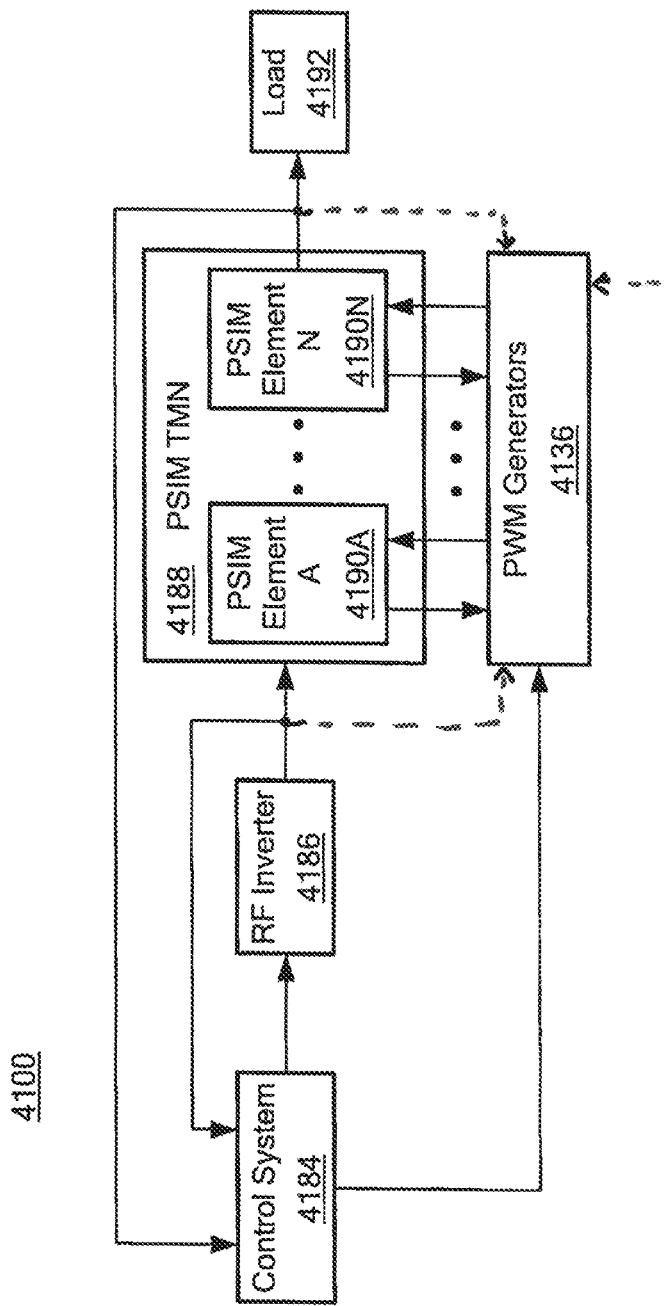
Figure 42:
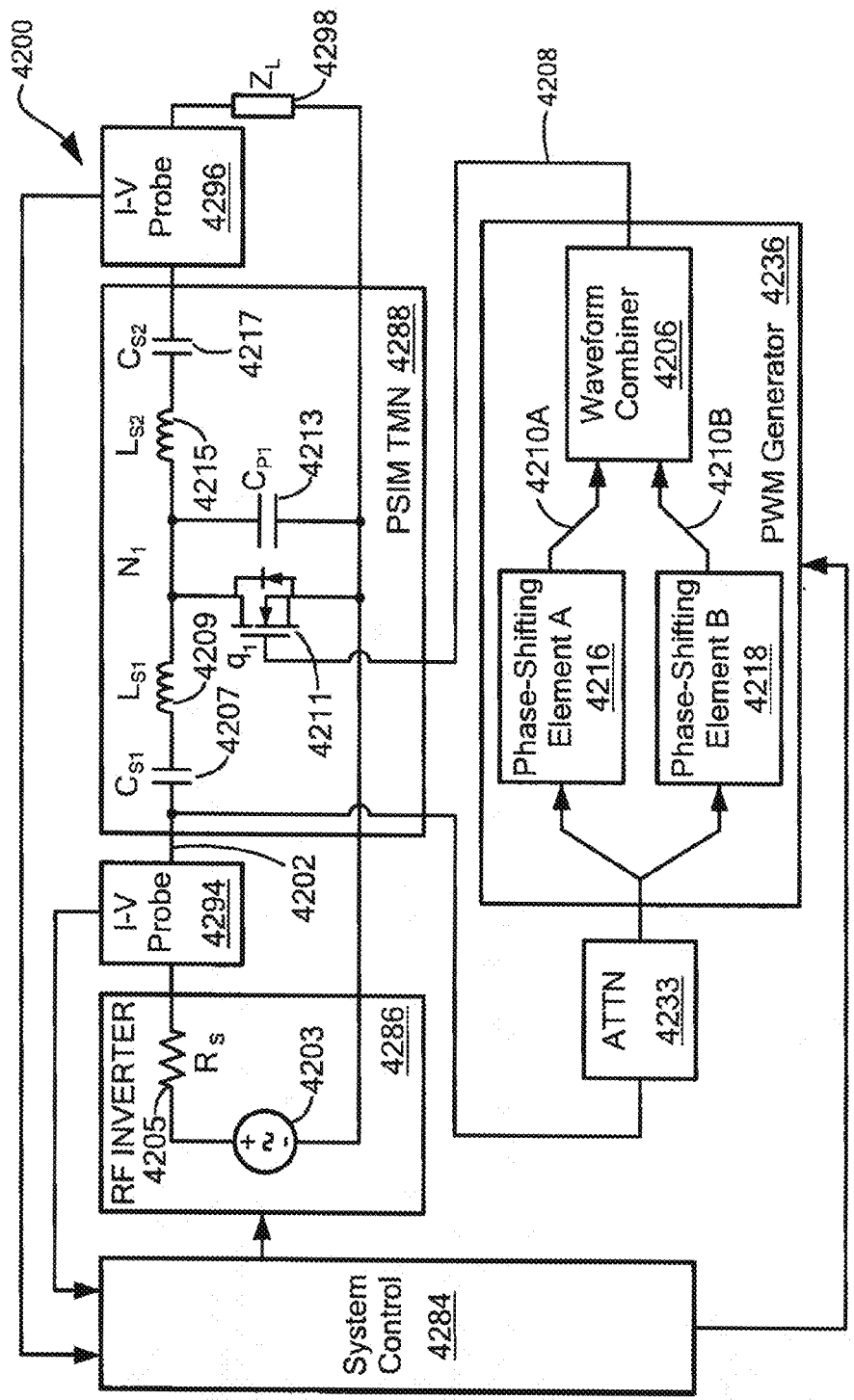
Figure 43:
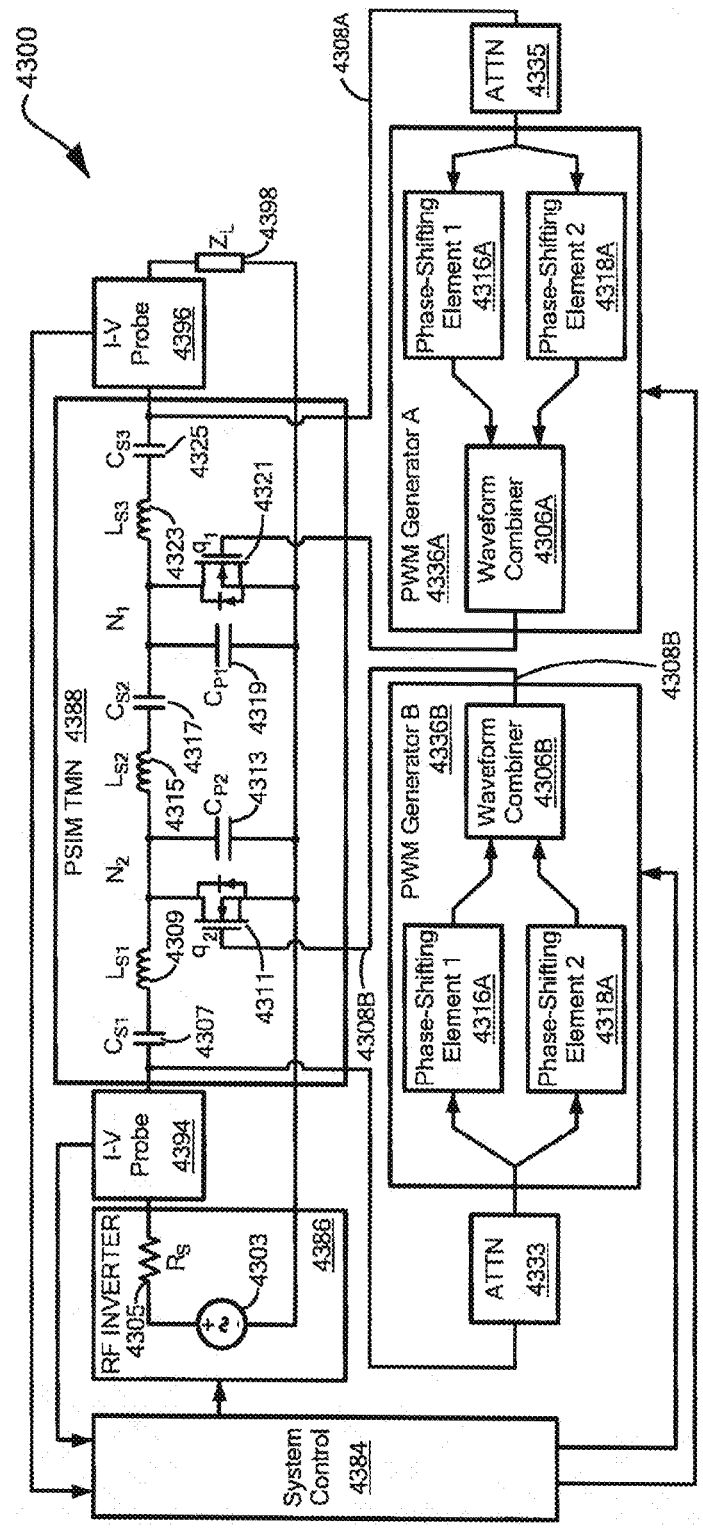

FIGS. 10A-D are schematic diagrams of illustrative switched reactance elements in accordance with described embodiments;

FIG. 11 is a schematic diagram of an illustrative phase-switched tunable matching network (TMN) employing a digitally-switched capacitance matrix;

FIG. 12 is a schematic diagram of an illustrative phase-switched TMN employing a digitally-switched inductance matrix;

FIG. 13 is a schematic diagram of an illustrative phase-switched TMN in accordance with described embodiments;

FIG. 14 is a Smith chart of a range of load impedances that can be matched by the tuning network of FIG. 13 for an illustrative operating range;

FIG. 15 is a schematic diagram of additional detail of the tuning network of FIG. 13;

FIG. 16 is a block diagram of an illustrative topology of a phase-switched impedance modulation amplifier in accordance with described embodiments;

FIG. 17 is a block diagram of another illustrative topology of a phase-switched impedance modulation amplifier in accordance with described embodiments;

FIGS. 18A-E are schematic diagrams of illustrative three-switch phase-switched impedance modulation amplifiers in accordance with described embodiments;

FIGS. 19 and 20 are schematic diagrams of illustrative two-switch phase-switched impedance modulation amplifiers in accordance with described embodiments;

FIG. 21 is a schematic diagram of an illustrative phase-switched impedance modulation amplifier over an illustrative operating range;

FIGS. 22 and 23 are Smith charts showing a range of load impedances that can be matched by the phase-switched impedance modulation amplifier of FIG. 21 for an illustrative operating range;

FIG. 24 is a flow diagram of an illustrative process of operating a TMN;

FIG. 25A is a block diagram of a system for generating pulse width modulated (PWM) signals having predetermined phase shifts and pulse widths;

FIG. 25B is a plot of a pulse width modulated (PWM) waveform having pulse width w and a phase shift φ relative to a reference signal with the PWM signal being in phase and frequency lock with the reference signal;

FIG. 26 is a block diagram of a PWM generation circuit having a parallel architecture;

FIG. 27 is a block diagram of a PWM generation circuit having a cascade architecture;

FIG. 28 is a block diagram of a PWM generator circuit having a dual-pulse PWM generation architecture;

FIG. 29 is a block diagram of a PWM generation circuit having a parallel PWM generation architecture with two phase-shifting elements and a phase detector feedback loop;

FIG. 30 is a block diagram of a system having an architecture capable of generating multiple PWM waveforms that are phase- and frequency-locked to a common reference signal;

FIG. 31 is a block diagram of a PWM generation circuit having an in-phase/quadrature-phase (IQ) modulator;

FIG. 32 is a phase diagram illustrating a phase shift according to baseband inputs of an IQ modulator;

FIG. 33 is a block diagram of a PWM generation circuit having a parallel PWM generation architecture with two phase-shifters implemented as IQ modulators;

FIG. 34 is a plot of phase shift command vs. measured phase shift error for a pair of output signals from respective ones of IQ modulators of the PWM generation circuit of FIG. 33;

FIG. 35 is a plot of phase shift command vs. measured phase shift standard deviation for a pair of output signals from respective ones of IQ modulators of the PWM generation circuit of FIG. 33;

FIG. 36 is a block diagram of a cascaded PWM waveform generator having phase-shifting elements implemented using phase-locked loop (PLL) modules coupled to a waveform combiner;

FIG. 37 is a block diagram of the cascaded phase-locked PWM generator of FIG. 36 having a waveform combiner provided from a D-type flip-flop and edge detectors;

FIG. 38 is a block diagram of a PWM signal generation system implemented with a PLL;

FIG. 39 is a block diagram of a PWM generation system having a nested PLL architecture with feedback;

FIG. 40 is a flowchart of a method of generating PWM signals with desired phase shifts and pulse widths;

FIG. 41A is a block diagram of an impedance matching system comprising a plurality of phase-switched, impedance (PSIM) elements driven by PWM generators;

FIG. 41B is a block diagram of a radio frequency ("RF") amplifier having a phase-switched tunable impedance network coupled to a system for generating PWM signals with desired phase shifts and pulse widths;

FIG. 42 is a block diagram of a system having a phase-switched tunable impedance network having one phase-switched tunable impedance element coupled to a PWM generator; and FIG. 43 is a block diagram of a system having a phase-switched tunable impedance network having two phase-switched tunable impedance elements coupled to two PWM generators.

DETAILED DESCRIPTION

Table 1 summarizes a list of acronyms employed throughout this specification as an aid to understanding the described embodiments:

TABLE 1

| | | | |
|---|---|---|---|
| CMOS | Complementary Metal-Oxide Semiconductor | CR | Cognitive Radio |
| FET | Field Effect Transistor | HEMT | High-Electron-Mobility Transistor |
| IC | Integrated Circuit | LUT | Look Up Table |
| MEMS | Micro-ElectroMechanical Systems | PA | Power Amplifier |
| PSIM | Phase-Switched Impedance Modulation | PS-TMN | Phase-Switched Tunable impedance Matching Network |
| RF | Radio Frequency | SDR | Software Defined Radio |
| TMN | Tunable impedance Matching Network | WPT | Wireless Power Transfer |
| ZCS | Zero Current Switching | ZVS | Zero Voltage Switching |

Described embodiments are directed toward phase-switched, tunable matching networks (PS-TMNs) and phase-switched, impedance modulation amplifiers (PSIMs). Both the phase-switched, tunable matching networks and the phase-switched, impedance modulation amplifiers include phase-switched variable network reactance elements. When configured in the context of PS-TMNs and phase-switched, impedance modulation amplifiers, such phase-switched variable network reactance elements provide rapid, high bandwidth, continuous impedance matching over a wide impedance range, while operating efficiently at high power levels without requiring high bias voltages or currents. PS-TMNs might be employed alone, or might also be employed in combination with other matching techniques such as discrete switched reactance banks.

PS-TMNs might be employed in a variety of reconfigurable and adaptive RF systems, for example, RF front ends for software-defined radio (SDR) and cognitive radio (CR) applications that operate over a wide range of frequency bands, at different bandwidths, and in accordance with a variety of communication standards. PS-TMNs might also be employed in other RF applications, such as drivers for RF plasma loads to compensate for rapid load variations, or in wireless power transfer (WPT) systems to compensate for impedance mismatches between the transmitter and receiver to maximize transferred power and/or efficiency.

The PSIMs may be operable as zero voltage switching (ZVS) radio frequency (RF) amplifiers. Such PSIM amplifiers might employ a PS-TMN to operate over a large frequency range by efficiently modulating output power over a wide frequency range and/or matching into highly variable loads (e.g., loads that are variable over a wide impedance range).

Figure 1:
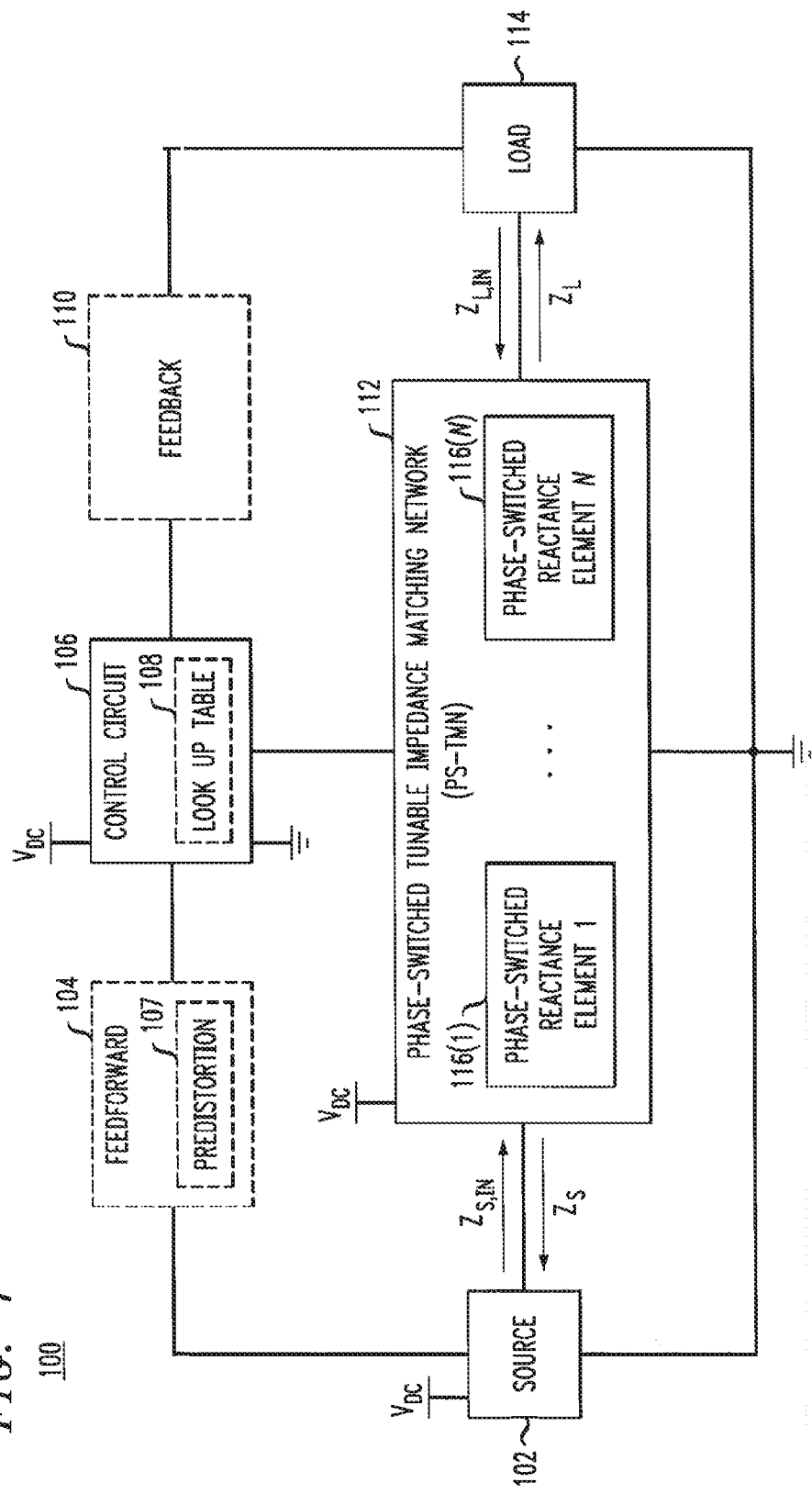
FIG. 1 is a block diagram of an illustrative tunable impedance matching network (TMN) in accordance with described embodiments.

Referring to FIG. 1, a radio frequency (RF) system 100 includes a phase-switched tunable impedance matching network (PS-TMN) 112 coupled between a source 102, having an impedance $Z_S$, and a load 114, having an impedance $Z_L$. In some applications, source 102, control circuit 106 and PS-TMN 112 (and other elements of RF system 100) are coupled to a power supply voltage (e.g., $V_{DC}$) and ground. Control circuit 106 is coupled to PS-TMN 112 and provides control signals to PS-TMN 112 so as to control operation of PS-TMN 112. In response to such control signals, PS-TMN 112 provides a desired impedance transformation characteristic. It should be appreciated that control circuit 106 might be an internal component to PS-TMN 112, or might be an external component coupled to PS-TMN 112 or some portions of control circuit 106 (or functions provided by control circuit 106 may be internal to PS-TMN 112 while other portions of control circuit 106 may be external to PS-TMN 112).

In some embodiments, control circuit 106 controls operation of PS-TMN 112 based, at least partially, upon information received from an optional feedforward circuit 104 coupled to source 102 and/or an optional feedback circuit 110 coupled to load 114. In some embodiments, optional feedforward circuit 104 includes adaptive predistortion circuit 107 and control circuit 106 includes look up table (LUT) 108. For example, as will be described in greater detail below, some embodiments might employ one or more non-linear control techniques (e.g., by control circuit 106) to determine appropriate control signals for PS-TMN 112, such as employing fixed or adaptable look-up tables (e.g., LUT 108) to store predetermined control signal information, feedback (e.g., by feedback circuit 110) and/or feedforward compensation (e.g., by feedforward circuit 104) to adaptively adjust control signal information, or performing digital predistortion of the control signals (e.g., by predistortion circuit 107), or other similar techniques.

PS-TMN 112 includes one or more phase-switched reactance elements 116(1)-116(N). As will be described in greater detail below, phase-switched reactance elements 116(1)-116(N) might be implemented using one or more capacitive elements (e.g., capacitors), one or more inductive elements (e.g., inductors), or a combination of both. Phase-switched reactance elements 116(1)-116(N) can be controlled to adjust the effective impedance ($Z_{S,IN}$ and $Z_{L,IN}$) presented to the terminals of PS-TMN 112 at a desired frequency. The phase-switched reactance elements 116(1)-116(N) are switched, for example by either a shunt or a series switch, and the effective impedance of the phase-switched reactance elements is controlled by adjusting the phase and/or duty-cycle of the shunt or series switch. In some embodiments, the desired frequency might be the RF frequency of operation of RF source 102 (e.g., the frequency of the signal provided from RF source 102 to PS-TMN 112).

By modulating the effective impedance at a desired frequency of operation of RF system 100 (e.g., by adjusting the impedance of phase-switched reactive elements 116(1)-116(N)), it is possible to adjust, tune, change or otherwise manipulate the impedance presented by PS-TMN 112 to source 102 and/or load 114. For example, phase-switched reactance elements 116(1)-116(N) allow PS-TMN 112 to present a desired impedance ($Z_{S,IN}$) to PS-TMN 112 from source 102 and a desired impedance ($Z_{L,IN}$) into PS-TMN 112 from load 114.

The control signals provided to PS-TMN 112 operate to control the timing of turning on and/or off the switches of phase-switched reactance elements 116(1)-116(N) with respect to the RF signal provided from source 102. The switching provides the effective reactance values of phase-switched reactance elements 116(1)-116(N) that effect the desired impedance transformation of PS-TMN 112. Feedforward information might include information about the effective input impedance of PS-TMN 112, the timing of RF waveforms, specified signal levels and/or impedance levels, etc. Feedback information might include measured information about the effective load impedance and/or power reflected from the load, the timing of RF waveforms, etc.

Thus, in some embodiments, PS-TMN 112 might be employed to provide a desired impedance transformation between source 102 and load 114. For example, PS-TMN 112 might provide an impedance match between source 102 and load 114. Alternatively, the impedance of PS-TMN 112 might be adjusted to compensate for variations in the impedance ($Z_L$) of load 114 such that source 102 is coupled to a more stable impedance (e.g., $Z_{S,IN}$) provided by PS-TMN 112.

Figure 2:
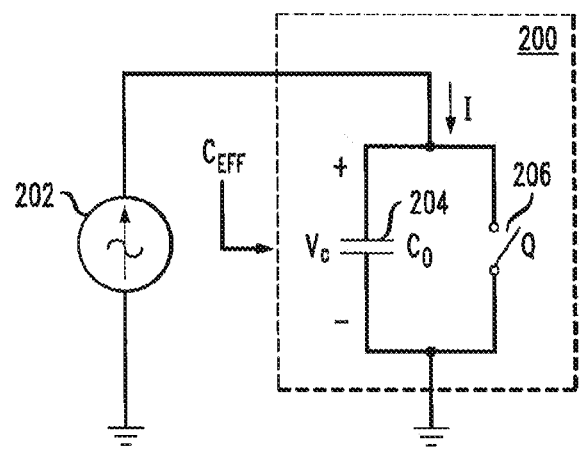
FIG. 2 is a schematic diagram of an illustrative phase-switched variable capacitance element of the TMN of FIG. 1.

Referring to FIG. 2, sinusoidal current source 202, having a current I, drives an illustrative phase-switched variable reactance 200. The phase-switched variable reactance is here shown as including a parallel combination of a capacitor 204 and switch 206 to provide the phase-switched variable reactance as phase-switched variable capacitance 200. Capacitor 204 has a physical capacitance $C_0$, and a voltage $V_C$. The state of switch 206 is controlled by a characteristic of signal Q. For example, switch 206 provides a low impedance signal path between its terminals (e.g., switch 206 is "on" or "closed") when signal Q has a logic high value, and switch 206 provides a high impedance signal path between its terminals (e.g., switch 206 is "off" or "open") when signal Q has a logic low value. Thus, switch 206 could be considered to switch capacitor 204 into the circuit when the switch is open (current I flows into capacitor 204), and out of the circuit when the switch is closed (current I flows through the closed switch and bypasses capacitor 204).

If switch 206 is always off (open), then the effective capacitance, $C_{EFF}$, of phase-switched variable capacitance 200 presented to source 202 is equivalent to the physical capacitance, $C_0$, of capacitor 204. Alternatively, if switch 206 is always on (closed), then the low impedance path between the terminals of switch 206 effectively "shorts" capacitor 204, and phase-switched variable capacitance 200 behaves as an infinite capacitor in the sense that the voltage across capacitor 204 remains zero irrelevant of current I. The effective capacitance, $C_{EFF}$, of capacitor 204 can theoretically be controlled between $C_0$ and infinity by controlling the conduction angle of switch 206 over an AC cycle of sinusoidal current source 202 from 0 to $2\pi$. As used herein, a conduction angle is the angle of the sinusoidal signal at which switch 206 is turned on. The conduction angle with which the switch is turned on may be entirely determined by a switching signal Q (e.g., the switching angle) or partly determined by switching signal Q and partly by circuit waveforms such as voltage $V_C$ and current I.

Figure 3:
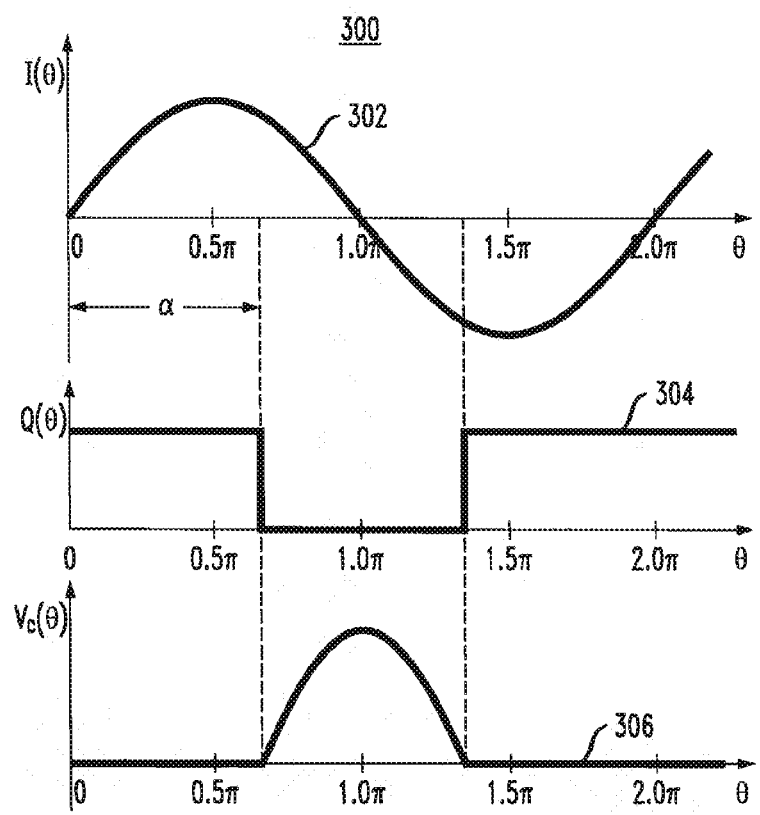
FIG. 3 is a plot of current and voltage versus phase with respect to a control signal of the phase-switched variable capacitance element of FIG. 2.

Referring to FIG. 3, illustrative waveforms of the current I and capacitor voltage $V_C$ (e.g., the voltage of capacitor 204) are shown with respect to the switch control signal, Q, as a function of a cycle angle θ. In particular, curve 302 shows I(θ), curve 306 shows $V_C(\theta)$ and curve 304 shows Q(θ) for a half-wave switched capacitor. As shown in FIG. 3, every cycle of I(θ), switch 206 is turned off (opened) a radians after I(θ) transitions from negative to positive (e.g., switch 206 is on/closed until a radians into the positive half-cycle of I(θ)). Switch 206 remains off (open) until after the capacitor voltage rings down to zero. Biasing the switch into its conductive state (e.g., turning the switch on or closing the switch) after the capacitor voltage rings down to zero ensures zero-voltage-switching (ZVS) turn on of switch 206.

If the switch includes a diode that naturally prevents the voltage from going negative, the timing of actively turning switch Q on may be relaxed, since it will naturally commutate "ON" when the switch voltage reaches zero and the active turn-on signal can be issued while the diode conducts. The capacitor $C_0$ across the switch provides snubbing of the turn off transition, providing zero-voltage-switching (ZVS) turn off of switch 206.

As shown in FIG. 3, when I(θ) is a purely sinusoidal current source, switch 206 remains off (open) until the conduction angle of the switch is reached (e.g., at 2α). Thus, for a half-wave switched capacitor, switch 206 is turned on and off once per cycle of the RF signal from source 102 (e.g., I(θ) as shown by curve 302).

Adjusting a sets where in the cycle switch 206 turns on and off (e.g., controls the conduction angle of switch 206) and hence controls the voltage at which the capacitor peaks. Thus, there is a relationship between the switching angle (α) and the magnitude of the fundamental component of $V_C(\theta)$ at the switching frequency. Consequently, the effective capacitance, $C_{EF}F$, of capacitor 204 can be represented as a function of α:

$$C_{EFF} = \frac{C_0 \cdot \pi}{\pi - \alpha + \sin(\alpha) \cdot \cos(\alpha)} \quad (1a)$$

Figure 4:
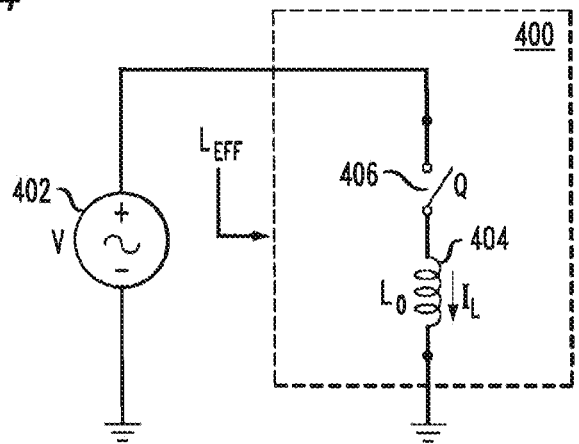
FIG. 4 is a schematic diagram of an illustrative phase-switched variable inductance element of the TMN of FIG. 1.

Referring to FIG. 4, it is also possible to implement a phase-switched variable reactance as a switched inductor network that allows continuous control of its effective inductance at the switching frequency. Such a switched inductor network is shown in FIG. 4 as phase-switched variable inductance 400 and corresponds to the topological dual of the switched capacitor network 200 shown in FIG. 2. As shown in FIG. 4, illustrative phase-switched variable inductance 400 includes a series combination of inductor 404 and switch 406 being driven by a sinusoidal voltage source 402 with a voltage V. Inductor 404 has a physical inductance $L_0$, and an inductor current $I_L$. The state of switch 406 is controlled by the signal Q, for example, switch 406 might be on (e.g., closed) when signal Q has a logic high value, and off (e.g., open) when signal Q has a logic low value. Thus, switch 406 could be considered to switch inductor 404 into the circuit when the switch is closed (applying voltage V to inductor 404), and out of the circuit when the switch is open (no voltage is applied to inductor 404).

Similarly to the switched-capacitor implementation of a phase-switched variable reactance described in regard to FIG. 2, the effective inductance $L_{EFF}$ of phase-switched variable inductance 400 at the switching frequency can be modulated from a base value $L_0$ to infinity. For example, if switch 406 is always on (closed), then the effective inductance, $L_{EFF}$, of phase-switched variable inductance 400 seen by source 402 is equivalent to the physical inductance, $L_0$, of inductor 404. Alternatively, if switch 406 is always off (open), then inductor 404 behaves as an infinite inductor in the sense that the current through inductor 404 remains zero irrelevant of voltage V. The effective inductance, $L_{EFF}$, of inductor 404 can ideally be controlled between Lo and infinity by controlling the conduction angle of switch 406 over an AC cycle of sinusoidal voltage source 402 from 0 to $2\pi$.

Figure 5:
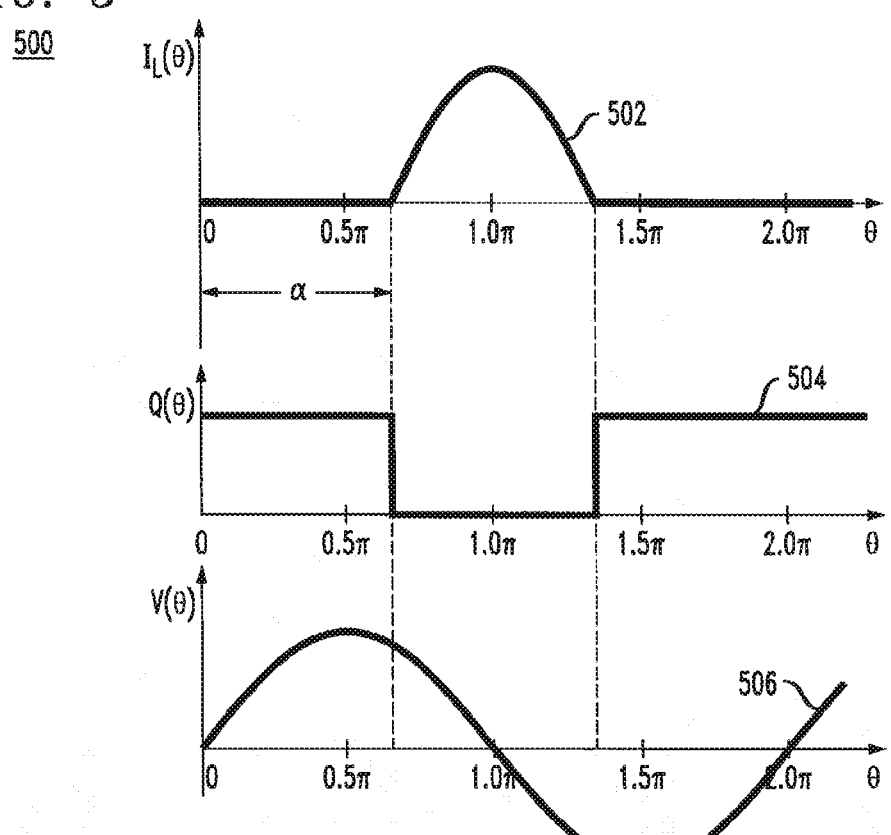
FIG. 5 is a plot of current and voltage versus phase with respect to a control signal of the phase-switched variable inductance element of FIG. 4.

Referring to FIG. 5, illustrative waveforms of the current I and voltage $V_C$ of capacitor 204 are shown with respect to the switch control signal, Q, as a function of a cycle angle θ. As a result of the properties of topological duality, the voltage waveform of the switched capacitor network shown in FIG. 3 is analogous to the current waveform of the switched inductor network shown in FIG. 5, and vice versa.

In particular, curve 502 shows $I_L(\theta)$, curve 506 shows V(θ) and curve 504 shows Q(θ) for a half-wave switched inductor. As shown in FIG. 5, every cycle of V(θ), switch 406 is turned on (closed) a radians after V(θ) transitions from negative to positive (e.g., switch 406 is off/open until a radians into the positive half-cycle of V(θ)). Switch 406 remains on (closed) until after the inductor current rings down to zero. Since the switch has an inductor in series with it, zero-current-switching (ZCS) turn on of the switch can be achieved. Turning the switch off at the time when the inductor current rings down to zero ensures zero-current-switching (ZCS) turn off of switch 406. In duality with the capacitive circuit, utilization of diode(s) as part of switch Q can enable natural commutation (turn off) of the switch and relax detailed active timing of the turn-off moment of the switching control waveform. As shown in FIG. 5, when V(θ) is a purely sinusoidal voltage source, switch 406 remains on (closed) until the conduction angle of the switch is reached (e.g., at 2α).

Adjusting a sets where in the cycle switch 406 turns on and off (e.g., controls the conduction angle of switch 406) and hence controls the current at which the inductor peaks. Thus, similarly to the switched-capacitor implementation of a phase-switched variable reactance described in regard to FIG. 2, there is a relationship between the switching angle (α) and the magnitude of the fundamental component of $I_L(\theta)$ at the switching frequency. Consequently, the effective inductance, $L_{EFF}$, of inductor 404 can be represented as a function of α:

$$L_{EFF} = \frac{L_0 \cdot \pi}{\pi - \alpha + \sin(\alpha) \cdot \cos(\alpha)} \tag{1b}$$

As a result of topological duality, expression (1b) for the effective inductance is the same as that of expression (1a) for the effective capacitance. Expression (1a) is consistent with the intuitive expectation for infinite effective capacitance when the switch is always in the on state (α=π) and predicts the equivalence between $C_{EFF}$ and $C_0$ when the switch is permanently off (α=0). Expression (1b) is similarly consistent with the intuitive expectation for infinite effective inductance when the switch is always in the off state (α=0) and predicts the equivalence between $L_{EFF}$ and $L_0$ when the switch is permanently on (α=π). Thus, in accordance with expressions (1a) and (1b), the effective capacitance $C_{EFF}$ or the effective inductance $L_{EFF}$ at the switching frequency can be modulated by controlling the conduction angle of the switch associated with the capacitor or inductor.

Figure 6:
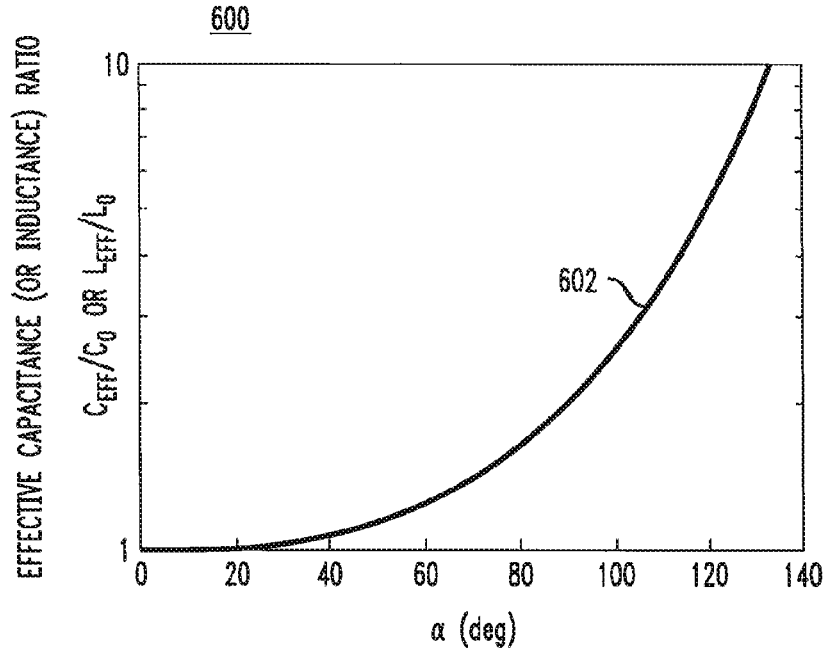
FIG. 6 is a plot of normalized effective capacitance (or inductance) of the phase-switched elements of FIGS. 2 and 4 versus a control angle of the phase-switched element.

Referring to FIG. 6, the normalized effective capacitance, $C_{EFF}/C_0$, or the normalized effective inductance $L_{EFF}/L_0$, is shown by curve 602 at the switching frequency. For the capacitive circuit this is the same thing as the normalized admittance $Y_{EFF}/Y_0$ while for the inductive circuit this is the same as the normalized reactance, $X_{EFF}/X_0$. As a result of topological duality, the normalized effective admittance $Y_{EFF}/Y_0$ of the phase-switched capacitor circuit of FIG. 2 is the same as the normalized reactance, $X_{EFF}/X_0$ of the phased-switched inductor network shown in FIG. 4.

As shown in FIG. 6, the normalized effective capacitance $C_{EFF}$ (or inductance $L_{EFF}$) increases rapidly with a and approaches infinity as a approaches π (e.g., 180 degrees).

Figure 7:
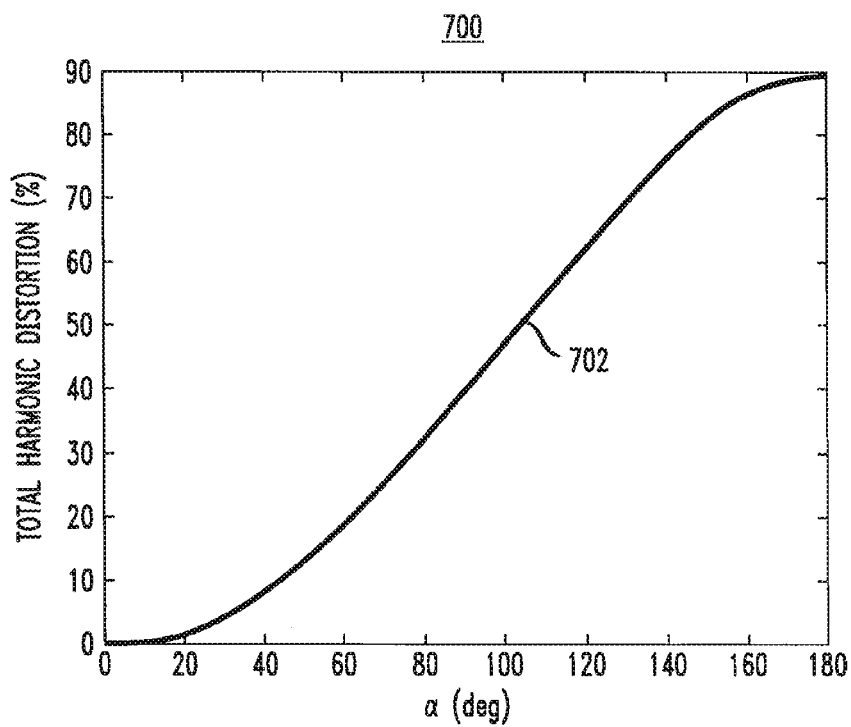
FIG. 7 is a plot of total harmonic distortion of the phase-switched elements of FIGS. 2 and 4 versus the control angle of the phase-switched element.

Referring to FIG. 7, curve 702 shows the total harmonic distortion of the capacitor voltage (inductor current) versus a for a purely sinusoidal current (voltage) excitation source. The practical range over which $C_{EFF}$ or $L_{EFF}$ can be modulated depends on the amount of harmonic distortion that can be present in the network. As a increases towards π (e.g., the conduction angle of the switch increases), the ringing of the capacitor voltage $V_C$ (e.g., curve 306) or of the inductor current $I_L$ (e.g., curve 502) is limited to a shorter time period. As shown in FIG. 7, this results in significant harmonic content of the capacitor voltage for large $Y_{EFF}/Y_0$ or $X_{EFF}/X_0$ (e.g., $C_{EFF}/C_0$ or $L_{EFF}/L_0$) ratios (e.g., the total harmonic distortion increases as a increases). The amount of harmonic distortion allowed in a given system depends on specified limits of harmonic content allowed into the source and/or load and the amount of filtering that is necessary or desired.

Note that FIG. 7 shows the harmonic distortion of the phase-switched variable reactance (e.g., the harmonic distortion of the capacitor voltage of phase-switched variable capacitance 200, or the harmonic distortion of the inductor current of phase-switched variable inductance 400), and not the harmonic content that is actually injected into the source and/or load of the RF system (e.g., source 102 and load 114). In some embodiments, the phase-switched variable reactance (e.g., phase-switched variable capacitance 200 or phase-switched variable inductance 400) includes additional filtering components (not shown in FIGS. 2 and 4) to reduce harmonic content injected into the source and/or load (e.g., source 102 and load 114).

As described in regard to FIGS. 3 and 5, the phase-switched variable reactance (e.g., phase-switched variable capacitance 200 or phase-switched variable inductance 400), are half-wave switched, where the switch is operated so that the capacitor voltage (curve 306 of FIG. 3) and inductor current (curve 502 of FIG. 5) are unipolar. However, other switching schemes are also possible. For example, FIGS. 8 and 9 show illustrative waveforms of the current I and voltage V with respect to the switch control signal, Q, as a function of a cycle angle θ, for the switched capacitor network shown in FIG. 3 and the switched inductor network shown in FIG. 5, respectively.

Figure 8:
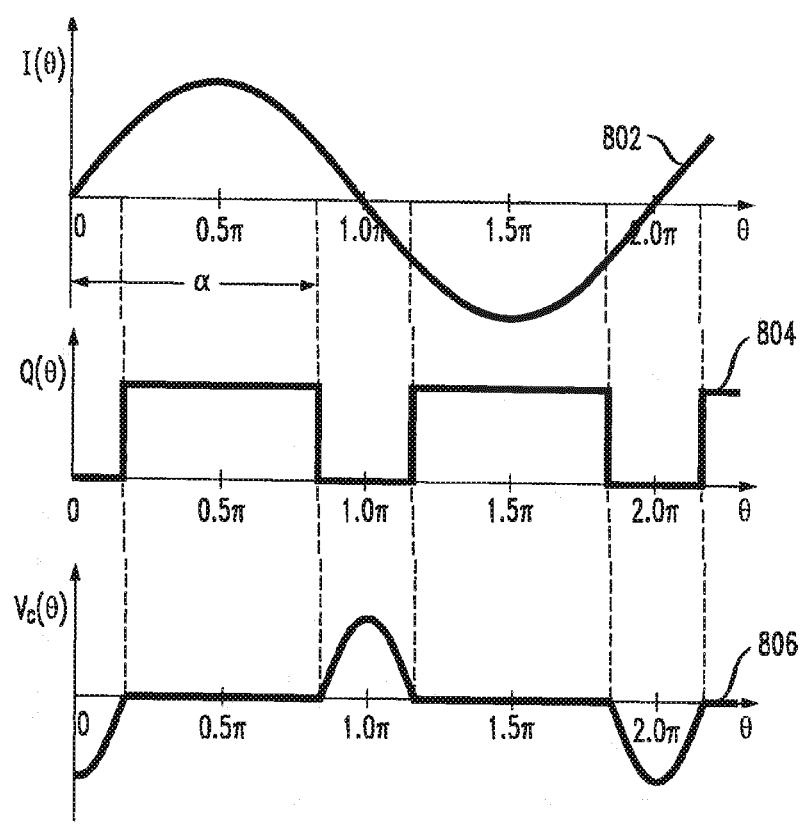
FIG. 8 is a plot of current and voltage versus phase with respect to a control signal of a full-wave switched variable capacitance element.

In particular, as shown in FIG. 8, curve 802 shows I(θ), curve 806 shows $V_C(\theta)$ and curve 804 shows Q(θ) for a full-wave switched capacitor. As shown in FIG. 9, curve 902 shows $I_L(\theta)$, curve 906 shows V(θ) and curve 904 shows Q(θ) for a full-wave switched inductor. When phase-switched variable capacitance 200 is full-wave switched, the switch (e.g., switch 206) is turned off twice every cycle of I(θ) (e.g., Q(θ) is zero), with the off periods being centered around the instants when the current I(θ) is zero. For a purely sinusoidal excitation current I(θ), this results in a bipolar capacitor voltage waveform $V_C(\theta)$. Capacitor voltage $V_C(\theta)$ has zero DC average value. Similarly, when phase-switched variable inductance 400 is full-wave switched, the switch (e.g., switch 406) is turned on twice every cycle of V(θ) (e.g., Q(θ) has a logic high value), with the on periods being centered around the instants when the voltage V(θ) is zero. For a purely sinusoidal excitation voltage V(θ), this results in a bipolar inductor current waveform $I_L(\theta)$, which also has zero DC average value. Thus, for a full-wave switched capacitor (or inductor), switch 206 is turned on and off twice per cycle of the RF signal from source 102 (e.g., I(θ) as shown by curve 802).

As with half-wave switching (e.g., as shown in FIGS. 3 and 5), the effective capacitance $C_{EFF}$ and the effective inductance $L_{EFF}$ at the switching frequency can be modulated by controlling the switching angle, α, of the switch. The effective capacitance, $C_{EFF}$, of capacitor 204 can be represented as a function of a for a full-wave switched capacitor:

$$C_{EFF} = \frac{C_0 \cdot \pi}{2 \cdot [\pi - \alpha + \sin(\alpha) \cdot \cos(\alpha)]} \tag{2a}$$

Similarly, the effective inductance, $L_{EFF}$, of inductor 404 can be represented as a function of α:

$$L_{EFF} = \frac{L_0 \cdot \pi}{2 \cdot [\pi - \alpha + \sin(\alpha) \cdot \cos(\alpha)]}. \tag{2b}$$

Thus, the effective capacitance/inductance that can be achieved for a given switching angle, a, with full-wave switched networks (e.g., relationships (2a) and (2b)) is half the effective capacitance/inductance that can be achieved with half-waved switched networks (e.g., relationships (1a) and (1b)). However, full-wave switched networks inherently result in reduced harmonic content of the capacitor voltage and inductor current compared to half-wave switched networks for the same switching angle, a (i.e. the switching angle which controls the total switch conduction angle). On the other hand, implementing full-wave switching requires the switch has to operate at twice the operating frequency (e.g., to switch twice per cycle). Further, for capacitive modulation, bidirectional blocking switches are required, which can complicate switch implementation with typical semiconductor switches.

Relationships (1) and (2) above show that the effective capacitance and inductance for the switched networks shown in FIGS. 2 and 4 can be based upon the switching angle, α, for purely sinusoidal excitation signals. For excitation signals that are not purely sinusoidal, the effective reactance can be controlled by appropriately selecting the timing or switching angle, α, at which the switch turns off (or on) although relationships (1) and (2) cannot calculate an exact value of α. Together with the circuit waveforms that determine zero-voltage (or zero current) points (for switch turn on (or off), switching angle a determines the total conduction angle of the switch during the cycle. For excitation signals that are not purely sinusoidal, an adaptable look-up table (e.g., LUT 108), feedback circuit 110 or feedforward circuit 104 (including optional digital predistortion circuit 107) might be employed to determine the required value of a for a given desired effective reactance.

Phase-switched variable capacitance 200 and phase-switched variable inductance 400 can be employed as building blocks for implementing phase-switched variable reactances and other adjustable circuits such as TMNs. Particularly, some applications could benefit substantially from variable reactances whose value can be controlled over a range spanning both capacitive and inductive reactances, and/or by modulating the effective reactance over a more limited range. Augmenting phase-switched variable capacitance 200 and/or phase-switched variable inductance 400 with additional reactive components can provide a wider range of variable reactances.

FIGS. 10A-10D show illustrative embodiments of phase-switched reactance circuits that include both capacitive and inductive elements, thereby expanding a range over which the impedance of the phase-switched reactance circuit can be tuned as compared to the single-element circuits shown in FIGS. 2 and 4.

Figure 10D:
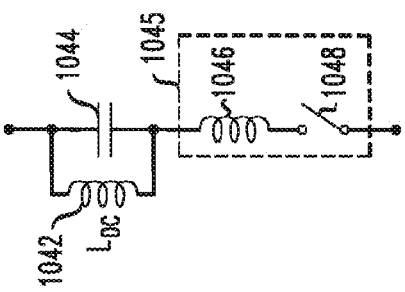
Figure 10C:
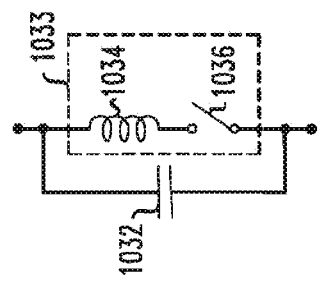
Figure 10B:
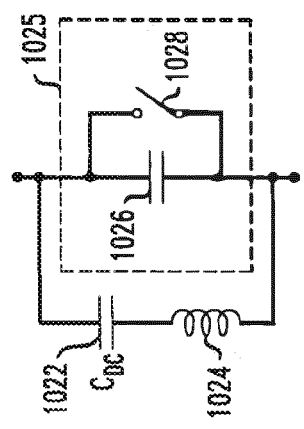
Figure 10A:
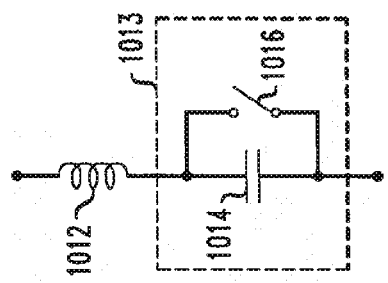

For example, FIG. 10A shows phase-switched reactance circuit 1002 that includes inductor 1012 in series with phase-switched capacitor 1013. Phase-switched capacitor 1013 includes switch 1016 in parallel with capacitor 1014, similarly as described in regard to FIG. 2. FIG. 10B shows phase-switched reactance circuit 1004 that includes inductor 1024 in series with capacitor 1022, with the series combination of inductor 1024 and capacitor 1022 arranged in parallel with phase-switched capacitor 1025. Capacitor 1022 is not phase-switched and, thus, is shown as $C_{DC}$. Phase-switched capacitor 1025 includes switch 1028 in parallel with capacitor 1026, similarly as described in regard to FIG. 2. FIG. 10C shows phase-switched reactance circuit 1006 that includes capacitor 1032 in parallel with phase-switched inductor 1033. Phase-switched inductor 1033 includes switch 1036 in series with inductor 1034, similarly as described in regard to FIG. 4. FIG. 10D shows phase-switched reactance circuit 1008 that includes inductor 1042 in parallel with capacitor 1044, with the parallel combination of inductor 1042 and capacitor 1044 arranged in series with phase-switched capacitor 1045. Inductor 1042 is not phase-switched and, thus, is shown as $L_{DC}$. Phase-switched inductor 1045 includes switch 1048 in series with inductor 1046, similarly as described in regard to FIG. 4.

As would be understood by one of skill in the art, circuit variants other than the ones illustrated in FIGS. 10A-10D are also possible. For example, placing a capacitor in series with a phase-switched capacitor provides a net effective impedance having a maximum capacitance equal to the series combination of the capacitor and the physical capacitance of the phase-switched capacitor, and a minimum capacitance equal to the series combination of the capacitor and the phase-switched capacitance value.

As described in regard to FIGS. 6 and 7, a tradeoff exists for phase-switched variable capacitance 200 and phase-switched variable inductance 400 between their variable reactance range and the amount of harmonic content injected into the rest of the system. In other words, the range over which the effective reactance can be controlled is limited by the amount of harmonic content that can be tolerated within the system (e.g., by source 102 and/or load 114). Some embodiments might employ additional or external filtering components to reduce harmonic content injected to source 102 and/or load 114. However, in some embodiments, it might not be possible to employ additional filtering components.

Referring to FIGS. 11 and 12, in cases where additional filtering components are not employed, the harmonic content can be reduced by combining phase-switched variable capacitance 200 and phase-switched variable inductance 400 with one or more digitally controlled capacitor or inductor matrices that are not phase-switched. Such hybrid switched networks include an RF switch operated at the RF frequency of operation and with controlled phase and duty cycles with respect to the RF waveform. The hybrid switched network also includes digital switches associated with one or more capacitors or inductors in the switched matrix. The digital switches are typically operated at a much lower frequency than the RF frequency, but could be operated up to the RF frequency (e.g., on a cycle-by-cycle basis) determined by the control bandwidth of the effective reactance $C_{EFF}$ or $L_{EFF}$.

Referring to FIG. 11, hybrid switched network 1100 includes a phase-switched reactance (e.g., capacitor $C_0$ 1116 and parallel switch 1118) and digitally controlled capacitor network 1102. Although shown as a phase-switched variable capacitance (e.g., capacitor $C_0$ 1116 and parallel switch 1118) coupled in parallel with digitally controlled capacitor network 1102 and load 114, in other embodiments, the phase-switched reactance might be implemented as a phase-switched variable inductance (e.g., such as shown in FIG. 4) coupled in series with digitally controlled capacitor network 1102 and load 114, or as one of the phase-switched reactance circuits shown in FIGS. 10A-D, or other equivalent circuits.

Digitally controlled capacitor network 1102 includes a plurality of capacitors and associated switches, shown as capacitors 1104, 1108, and 1112, and switches 1106, 1110, and 1114. In some embodiments, each of capacitors 1104, 1108, and 1112 have a unique capacitance value, allowing the capacitance value of digitally controlled capacitor network 1102 to be varied across a large capacitance range. For example, as shown in FIG. 11, capacitors 1104, 1108, and 1112 might increase from the phase-switched capacitor base value (e.g., $C_0$) in increments of $C_0$ until reaching a maximum capacitance value (e.g., $(2 \cdot 2^N -1) \cdot C_0$), where N is the number of capacitors in digitally controlled capacitor network 1102).

Switches 1106, 1110, and 1114 are coupled in series with corresponding ones of capacitors 1104, 1108, and 1112 and are operable to adjust the capacitance of digitally controlled capacitor network 1102 by connecting (or disconnecting) the respective capacitors. Switches 1106, 1110, and 1114 might operate based upon one or more control signals from control circuit 106. As described, switches 1106, 1110, and 1114 generally operate at a frequency less than the RF frequency to adjust the capacitance value of digitally controlled capacitor network 1102.

Referring to FIG. 12, hybrid switched network 1200 includes a phase-switched reactance (e.g., inductor $L_0$ 1216 and series switch 1218) and digitally controlled inductor network 1202. Although shown as a phase-switched variable inductance (e.g., inductor $L_0$ 1216 and series switch 1218) coupled in series with digitally controlled inductor network 1202 and in parallel with load 114, in other embodiments, the phase-switched reactance might be implemented as a phase-switched variable capacitance (e.g., such as shown in FIG. 2), or as one of the phase-switched reactance circuits shown in FIGS. 10A-D, or other equivalent circuits.

Digitally controlled inductor network 1202 includes a plurality of inductors and associated switches, shown as inductors 1206, 1210, and 1214, and switches 1204, 1208, and 1212. In some embodiments, each of inductors 1206, 1210, and 1214 have a unique inductance value, allowing the inductance value of digitally controlled inductor network 1202 to be varied across a large inductance range. For example, as shown in FIG. 12, inductors 1206, 1210, and 1214 and 1218 might increase from the phase-switched inductor base value (e.g., $L_0$) by increments of Lo until reaching a maximum inductance value.

Switches 1204, 1208, and 1212 are coupled in parallel with corresponding ones of inductors 1206, 1210, and 1214 and are operable to adjust the inductance of digitally controlled inductor network 1202 by connecting (or shorting, e.g., providing a low-impedance path to bypass the inductor) the respective inductors. Switches 1204, 1208, and 1212 might operate based upon one or more control signals from control circuit 106. As described, switches 1204, 1208, and 1212 generally operate at a frequency less than the RF frequency to adjust the capacitance value of digitally controlled inductor network 1202.

Digitally controlled capacitor network 1102 and digitally controlled inductor network 1202 expand the range over which the reactance of the phase-switched reactance (e.g., capacitor $C_0$ 1116 and parallel switch 1118, or inductor $L_0$ 1216 and series switch 1218) can be continuously varied without introducing excessive harmonic content to source 102 and/or load 114. For example, the embodiments shown in FIGS. 11 and 12 employ digitally controlled capacitor network 1102 (or digitally controlled inductor network 1202) to control the base value $C_0$ (or $L_0$) of the switched networks 1100 (or 1200). The switch of the phase-switched reactance (e.g., switch 1118 or switch 1218) can be operated to step-up the base capacitance $C_0$ (or inductance $L_0$) by a factor determined by relationships (1) and (2) described above.

For example, the effective capacitance $C_{EFF}$ at the switching frequency of hybrid switched capacitor network 1100 can be controlled between a lower capacitance value $C_0$ and an upper capacitance value by half-wave switching the RF switch with the switching angle, $\alpha$, varying from 0 to approximately $\pi/2$ as shown in FIG. 3. As shown in FIG. 7, RF switch operation with a switching angle, $\alpha$, less than $\pi/2$ (90 degrees) corresponds to a peak harmonic distortion of less than approximately 35%. Thus, the hybrid switched networks (e.g., 1100 and 1200) allow continuous control of the effective reactance at the switching frequency over a wide capacitive (or inductive) range with minimum harmonic distortion and without the need for adjustable bias voltages or currents.

In various embodiments, the RF switch of TMN 112 (e.g., switch 206 or switch 406) can be implemented as one of or a combination of various types of switching elements, for example based upon the RF frequency or other operating parameters of RF system 100. For example, lateral or vertical FETs, HEMTs, thyristors, diodes, or other similar circuit elements might be employed.

Phase-switched variable capacitance 200 and phase-switched variable inductance 400 can be employed as circuit elements within more complex phase-switched tunable matching networks (PS-TMNs), for example a Pi-network topology PS-TMN (Pi-TMN), although other network topologies are possible, such as L-networks, T-networks, or other similar networks. FIG. 13 shows a schematic of illustrative RF system 1300 including an RF source 1301 coupled to Pi-TMN 1302, which is coupled to an RF load 1303. Pi-TMN 1302 includes two variable shunt capacitive susceptances $B_1$ 1310 and $B_2$ 1314. In illustrative embodiments, RF source 1301 is commonly a power amplifier or the output of another RF system. As shown in FIG. 13, RF source 1301 can be represented by its Norton equivalent circuit as including current source 1304 in parallel with source resistance $R_S$ 1306 and source susceptance $B_S$ 1308. Similarly, RF load 1303 can be represented as including load resistance $R_L$ 1318 in parallel with load susceptance $B_L$ 1316. The source and load impedances, $Z_S$ and $Z_L$, respectively, can be expressed as:

$$Z_S = (R_S^{-1} + jB_S)^{-1} \tag{3}$$

$$Z_L = (R_L^{-1} + jB_L)^{-1} \tag{4}$$

Thus, it can be shown that the susceptances $B_1$ and $B_2$ required to match the load impedance $Z_L$ to the source impedance $Z_S$ are given by:

$$B_1 = \frac{R_S \pm \sqrt{R_L R_S - X^2}}{X} - B_S \tag{5}$$

$$B_2 = \frac{R_S}{R_L}\left(\frac{R_S \pm \sqrt{R_L R_S - X^2}}{X}\right) - B_L \tag{6}$$

Thus, Pi-TMN 1302 can be employed to match load impedance $Z_L$ to source impedance $Z_S$ by adjusting the values of variable shunt capacitive susceptances $B_1$ 1310 and $B_2$ 1314.

As shown in FIG. 13, embodiments of Pi-TMN 1302 include two variable shunt capacitive susceptances $B_1$ 1310 and $B_2$ 1314, and a fixed inductive reactance X 1312, although numerous other implementations of a Pi-TMN are possible, such as employing variable shunt inductive susceptances and a fixed capacitive reactance, implementing all three reactive branches as variable components, etc. It should, of course, be appreciated that it is also possible to realize an L-section TMN having one variable shunt-path element and one variable series-path element. Other types of networks, might also be employed. As described in greater detail below, ground-referenced variable capacitors are highly suitable for realization with phase-switched variable reactance networks at RF frequencies.

Referring to FIG. 14, an illustrative range of load impedances that can be matched by Pi-TMN 1302 is shown as shaded region 1402 in Smith chart plot 1400 (normalized to $R_S$). For example, the impedance values represented by shaded region 1402 might be achieved by an illustrative Pi-TMN having $X=R_S$ and susceptance $B_1$ variable over a range of $1/R_S$ to $4/R_S$, and susceptance $B_2$ variable over a range of $1/R_S$ to $2/R_S$. As shown in FIG. 14, Pi-TMN 1302 is able to match the impedance of RF source 1301 to a load impedance that varies over approximately a 10:1 resistance range and a 5:1 reactance range (both capacitively and inductively). To do so, Pi-TMN 1302 modulates $B_1$ over a 1:4 range and $B_2$ over a 1:2 range, which can be achieved employing a phase-switched variable reactance network such as shown in FIGS. 2 and 4.

FIG. 15 shows an illustrative embodiment of phase-switched Pi-TMN circuit 1502 to achieve the matching range shown in FIG. 14 for a source impedance (e.g., $R_S$ 1506) of 50Ω. The inductive reactance X is chosen to be equivalent in value to the Norton-equivalent source resistance $R_S$ (e.g., 50Ω). As shown in FIG. 15, the variable capacitive susceptances $B_1$ and $B_2$ are implemented as half-wave phase-switched capacitors (e.g., phase-switched capacitor 200 of FIG. 2). Variable capacitive susceptance $B_1$ includes phase-switched capacitor $C_{P2}$ 1514 and FET switch 1512, which is controlled by switching control signal q2, which has a switching angle, α2. Variable capacitive susceptance $B_2$ includes phase-switched capacitor $C_{P1}$ 1520 and FET switch 1522, which is controlled by switching control signal q1, which has a switching angle, $α_1$.

In an illustrative embodiment, phase-switched Pi-TMN circuit 1502 operates at 27.12 MHz and is capable of matching a 50Ω source impedance to a load impedance that varies over approximately a 10:1 resistance range and a 5:1 reactance range (both capacitively and inductively), by properly adjusting the switching angles ($α_1$ and $α_2$) of the switches and the phase shift between them (e.g., by adjusting switching control signals q1 and q2).

Implementing variable capacitive susceptances $B_1$ and $B_2$ as half-wave FET-switched capacitor networks provides zero-voltage-switched (ZVS) operation of the switches, and allows each variable reactance to be implemented with a single, ground-referenced switch (e.g., FET 1512 for variable capacitive susceptance $B_1$ and FET 1522 for variable capacitive susceptance $B_2$). ZVS operation is desired in switched systems as it reduces switching power loss and improves the overall system efficiency. Furthermore, the output (drain-to-source) capacitance of FETs 1512 and 1522 are in parallel with phase-switched capacitors $C_{P1}$ and $C_{P2}$ and, thus can be added to the shunt capacitances and utilized as part of the TMN.

In illustrative Pi-TMN circuit 1502, inductive reactance X 1312 shown in FIG. 13 is implemented as a series-resonant circuit including inductor $L_{S2}$ 1516 and capacitor $C_{S2}$ 1518 disposed in series between variable susceptances $B_1$ and $B_2$, which are disposed as shunt elements (e.g., coupled to ground). Inductor $L_{S2}$ 1516 and capacitor $C_{S2}$ 1518 are selected to have an inductive impedance approximately equal to the source impedance (e.g., 50Ω) at the desired frequency.

In the embodiment shown in FIG. 15, two additional series-resonant circuits are included, one as an input filter and one as an output filter of Pi-TMN circuit 1502 to limit the amount of harmonic content injected into the source and the load as a result of the switching. For example, capacitor $C_{S1}$ 1508 and inductor $L_{S1}$ 1510 act as a series-resonant input filter between source 1504 and Pi-TMN circuit 1502. Similarly, inductor $L_{S3}$ 1524 and capacitor $C_{S3}$ 1526 act as a series-resonant output filter between load 1528 and Pi-TMN circuit 1502.

The quality factor, Q, of the series-resonant circuit of $L_{S2}$ 1516 and $C_{S2}$ 1518 controls the interaction between phase-switched capacitor $C_{P1}$ 1520 and phase-switched capacitor $C_{P2}$ 1514. For example, increasing the quality factor Q (e.g., by increasing the values of $L_{S2}$ 1516 and $C_{S2}$ 1518) reduces the interaction between phase-switched capacitor $C_{P1}$ 1520 and phase-switched capacitor $C_{P2}$ 1514, although increasing the quality factor Q also reduces the effective bandwidth of the network.

For example, for phase-switched Pi-TMN circuit 1502 to achieve the matching range shown in FIG. 14 for a source impedance (e.g., $R_S$ 1506) of 50Ω at an illustrative desired frequency in the range of about 27 MHz, phase-switched capacitor $C_{P1}$ 1520 might have a physical value, $C_0$, of 130 pF, and phase-switched capacitor $C_{P2}$ 1514 might have a physical value, $C_0$, of 100 pF. To achieve the desired quality factor Q by the series-resonant circuit between phase-switched capacitor $C_{P1}$ 1520 and phase-switched capacitor $C_{P2}$ 1514, capacitor $C_{S2}$ 1518 might have a value of 0.01 μF, and inductor $L_{S2}$ 1516 might have a value of 297 nH. To achieve the desired input and output filtering by the series-resonant circuits, capacitors $C_{S1}$ 1508 and $C_{S3}$ 1526 might have a value of 23.4 pF, and inductors $L_{S1}$ 1510 and $L_{S3}$ 1524 might have a value of 1.47 μH. Further, FETs 1512 and 1522 might have an on-state resistance of 10 mΩ, and the body diode of each FET might have a forward voltage of 0.4 V and an on-state resistance of 10 mΩ.

Switching of FETs 1512 and 1522 is synchronized to their drain current based upon the switching angle α, which is based upon the desired effective capacitance of capacitors $C_{P1}$ and $C_{P2}$. As described above for half-wave phase-switched capacitors, FETs 1512 and 1522 are turned off after their drain current crosses from negative to positive, and then turned on again once their respective drain voltages ring down to zero. The appropriate value of α for each of FETs 1512 and 1522 can be calculated by determining the required $B_1$ and $B_2$ susceptances for a desired load impedance $Z_L$ as given by relationships (5) and (6). Once each capacitive susceptance $B_1$ and $B_2$ is known, that value can be plugged in as $C_{EFF}$ ($C_0$ is a known value as the physical capacitance of the capacitor) in relationship (1a) (for a half-wave phase-switched capacitor) or relationship (2a) (for a full-wave phase-switched capacitor) to determine values of α that correspond to the desired susceptance values.

As described, for phase-switched networks having non-purely sinusoidal current excitation, relationships (1) and (2) might not result in an exact value of α to achieve the desired susceptance. Further, nonlinearity of the drain-to-source switch capacitances and the mutual interaction of the two switched networks (e.g., capacitive susceptances $B_1$ and $B_2$) might also result in inaccurate calculation of α. Thus, some embodiments employ non-linear control techniques (e.g., by control circuit 106) to determine the appropriate values of α, such as fixed or adaptable look-up tables (e.g., LUT 108), feedback (e.g., by feedback circuit 110), feedforward compensation (e.g., by feedforward circuit 104), digital predistortion of the switching angles (e.g., by predistortion circuit 107), or other similar techniques.

To set the correct value of switching control parameter a for each of FETs 1512 and 1522 for Pi-TMN circuit 1502 to achieve a given impedance, LUT 108 might store predetermined switching angles (e.g., $\alpha_1$ and $\alpha_2$) corresponding to various load impedances. For example, table 2 shows an illustrative list of possible load impedances that Pi-TMN circuit 1502 can match to a 50Ω source and the corresponding values of switching angles $\alpha_1$ and $\alpha_2$ for the switch control signals q1 and q2:

TABLE 2

| Load Impedance $Z_L$ (Ω) | $\alpha_1$ (degrees) | $\alpha_2$ (degrees) |
|---|---|---|
| 48.8 + 10.90j | 0.0 | 0.0 |
| 103 + 8.12j | 78.1 | 95.7 |
| 165 − 0.923j | 87.9 | 91.8 |
| 282 + 3.20j | 97.6 | 85.9 |
| 524 − 19.30j | 107.0 | 79.1 |
| 1000 + 15.90j | 117.0 | 72.2 |

Table 2 shows that it is possible for Pi-TMN circuit 1502 to match a 50Ω source impedance to a load impedance that varies resistively over at least a factor of 10:1. Based upon the switching angles ($\alpha_1$ and $\alpha_2$) listed in Table 2 and the plot of effective reactance (e.g., $C_{EFF}/C_0$ or $L_{EFF}/L_0$) versus as shown as in FIG. 6, it can be shown a 2:1 modulation of the effective capacitances can achieve impedance matching for a load impedance varying resistively over a 10:1 range.

Other types of systems can also employ the phase-switched networks described herein. For example, a wide range of systems can benefit from RF power amplifiers (PA) that deliver power at a particular frequency or over a particular band of frequencies. Such PAs might beneficially control output power over a wide range and maintain high efficiency across its operating range. Conventional linear amplifiers (e.g., class A, B, AB, etc.) offer the benefits of wide-range dynamic output power control and high fidelity amplification, but have limited peak efficiency that degrades rapidly with power back-off. On the other hand, switching PAs (e.g., inverters such as class D, E, F, Φ, etc.), offer high peak efficiency, but only generate constant envelope signals (at a constant supply voltage) while remaining in switched mode.

One technique for output power control in a switching PA is through load modulation, where the load of the PA is modulated by an external network. In described embodiments, the load of the PA is modulated by a phase-switched tunable matching network (TMN) (e.g., a network including one or more phase-switched variable capacitances 200 or phase-switched variable inductances 400, such as Pi-TMN circuit 1502). For example, an impedance transformation of a phase-switched TMN might control the output power of a PA.

Referring to FIG. 16, such a phase-switched impedance modulation (PSIM) amplifier is shown as PSIM amplifier 1600. PSIM amplifier 1600 includes RF power amplifier (or inverter) 1602 that generates RF power at a particular frequency, or over a particular range of frequencies. RF PA 1602 is coupled to a power supply (e.g., voltage $V_{DC}$ and ground) and phase-switched TMN 1604. Phase-switched TMN 1604 is coupled to RF load 1606, which has a load impedance $Z_L$. Phase-switched TMN 1604 is coupled to controller 1608, which controls operation of the TMN, for example by providing control signals to switches of the TMN based upon the switching angles (e.g., α) to achieve a desired impedance. Although not shown in FIG. 16, in some embodiments, controller 1608 is coupled to RF PA 1602 and also controls operation of the PA. Phase-switched TMN 1604 adaptively controls transforming the load impedance $Z_L$ to an impedance presented to PA 1602. For example, phase-switched TMN 1604 may control the output power of PA 1602 by modulating the load presented to PA 1602 (e.g., $Z_{TMN}$) and/or to compensate for frequency and/or load impedance variations to provide high efficiency and desired power to the load.

In various embodiments, PA 1602 is (1) a switching inverter, (2) an amplitude-modulated linear PA, or (3) a combination of these (e.g., depending on desired output). For example, FIG. 17 shows a block diagram of illustrative PSIM amplifier, 1700, that includes switching PA 1702 (e.g., a class E, F or Φ PA, etc.) that includes a single switch (e.g., FET 1706). In other embodiments, other types of PAs might be employed, such as linear PAs (e.g., class A, B, AB or C) or other switching PAs that use more than one switch to convert DC power to RF power (e.g., class D, inverse-D, etc.).

As described, modulating the effective loading impedance $Z_{TMN}$ seen by the PA looking into the phase-switched TMN (e.g., TMN 1604 or 1710) controls the output power over the operating power range of the PSIM amplifier (e.g., amplifiers 1602 and 1702). Additionally, the operating power range of the PSIM amplifier can be further extended by also employing amplitude modulation of the PA drive signal for large output power back off.

Some embodiments might also employ other power modulation techniques such as discrete or continuous drain modulation of the power amplifier. Drain modulation of the PA modulates (e.g., switches) a bias voltage applied to a bias terminal of the PA. For example, one drain modulation technique might switch the bias voltage among multiple discrete voltage levels or continuously adjusting the bias voltage across a voltage range.

In addition to performing impedance modulation and output power control of the RF PA, a phase-switched TMN (e.g., TMN 1604 or 1710) can also compensate for variation in the load impedance $Z_L$. For example, the phase-switched TMN can be continuously tuned to match a variable load impedance to a desired RF inverter loading impedance, $Z_{TMN}$, for a given output power level, by employing the phase-switched TMN to compensate for variations in the amplifier's loading network impedance as the operating frequency changes and, thus, maintain ZVS operation. Thus, a PSIM amplifier (e.g., PSIM amplifiers 1600 and 1700) dynamically controls the output power it delivers to a widely varying load impedance, such as an RF plasma load, across a large frequency range.

Therefore, a PSIM amplifier (e.g., PSIM amplifiers 1600 and 1700) allows (1) efficient dynamic control of output power over a wide power range; (2) the ability to impedance match and deliver power into a wide-ranging load, and (3) fully zero-voltage-switching (ZVS) operation across a frequency range for frequency-agile operation.

Although the block diagrams of PSIM amplifiers 1600 and 1700 shown in FIGS. 16 and 17 show PSIM amplifiers as a cascade combination of an RF PA (e.g., RF PAs 1602 and 1702) with a phase-switched TMN (e.g., phase-switched TMNs 1604 and 1710), other embodiments integrate the PS-TMN into the design of the RF PA. As a result, such integrated PSIM amplifiers can be viewed as an RF amplifier including two or more switches, where a first switch (or group of switches) is principally responsible for generating RF power from DC input power, and a second switch (or group of switches) is principally responsible for modulating the effective impedance presented by a load network to the RF amplifier. In most embodiments, the second switch (or group of switches) will not convert DC power to RF power (e.g., the second switch provides zero power conversion from DC to RF), although in some embodiments, the second switch may convert some power from DC to RF or RF to DC.

In most embodiments a PSIM amplifier can be a zero-voltage switching (ZVS) amplifier with the switching transistors operating substantially in switched-mode and turning on and off under zero-voltage switching, enabling high efficiency to be achieved. In other implementations, a PSIM amplifier might provide switched-mode operation (e.g., saturated operation) over some of its operating range (e.g., while delivering high output power) and utilize linear-mode operation over other portions of its range.

For example, FIG. 18A shows a schematic of an illustrative topology for PSIM amplifier 1800A. As shown, PSIM amplifier 1800A is coupled to DC source 1802 coupled in series with inductor $L_F$, which is in turn coupled to the parallel combination of transistor 1804 and capacitor $C_F$. Inductor $L_F$, capacitor $C_F$, and FET 1804 generally operate to generate RF output power to the rest of the network from the DC source. Branch reactance $X_1$ is coupled between capacitor $C_F$ and node $N_2$, which is coupled to a Pi-TMN including reactance $X_2$ coupled between a first phase-switched reactance (e.g., FET 1806, branch reactance $X_{S2}$, and phase-switched variable reactance $X_{P2}$) and a second phase-switched reactance (e.g., FET 1808, branch reactance $X_{S3}$, and phase-switched variable reactance $X_{P3}$). Branch reactance $X_1$ is coupled between the Pi-TMN at node $N_1$ and the load impedance $Z_L$. The branch reactances $X_1$, $X_2$, $X_3$, $X_{S2}$, $X_{S3}$, and the phase-switched variable reactances $X_{P2}$ and $X_{P3}$ can be implemented as various different reactive networks depending on the required functionality of the design.

FIG. 18B shows an illustrative design 1800B of the PSIM amplifier topology shown in FIG. 18A. As shown in FIG. 18B, the phase-switched variable reactances (comprising FET switches 1806 and 1808 and phase-switched capacitors $C_{P2}$ and $C_{P3}$) are implemented with half-wave phase-switched capacitor network such as described in regard to FIGS. 2 and 3. As shown in FIG. 18B, the three switches 1814, 1816 and 1818 are mutually isolated at DC (e.g., by capacitors $C_{S1}$, $C_{S2}$ and $C_3$, respectively. FET switch 1814 is responsible for generating all the RF power, while FET switches 1816 and 1818 are responsible for transforming and modulating the impedance presented by load $Z_L$ to the DC-to-RF portion of the circuit (e.g., at the output port of switch 1814 at node $N_2$).

FIG. 18C shows an illustrative design 1800C of the PSIM amplifier topology shown in FIG. 18A. Network 1800C is similar to network 1800B, although in network 1800C, the phase-switched capacitor networks (e.g., FET 1826 and capacitor $C_{P2}$ and FET 1828 and capacitor $C_{P3}$) are connected in series with capacitors $C_{P4}$ and $C_{P5}$, respectively. This decreases the sensitivity of the PSIM amplifier to variations in the effective reactance of the switched capacitor networks.

FIG. 18D shows an illustrative design 1800D of the PSIM amplifier topology shown in FIG. 18A where FET switches 1834 and 1836 are DC coupled (e.g., via inductor $L_{S1}$), and thus, potentially, one or both of FET switches 1834 and 1836 can be used to convert DC power into RF power or vice-versa. FET switch 1838, on the other hand, is DC-isolated (e.g., by capacitors $C_{S2}$ and $C_{S3}$) and, thus, is used only for impedance matching to the load impedance $Z_L$.

Figure 18E:
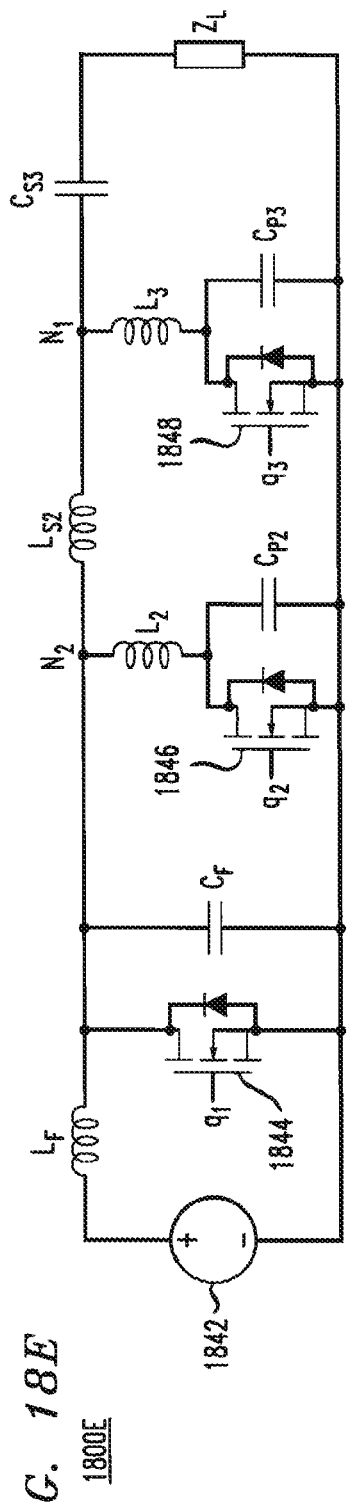

FIG. 18E shows an illustrative design 1800E of the PSIM amplifier topology shown in FIG. 18A where all three FET switches 1844, 1846 and 1848 are DC coupled (e.g., via inductor $L_{S2}$), while only the load is DC-isolated (e.g., by capacitor $C_{S3}$). Thus, in such an embodiment, all three FET switches 1844, 1846 and 1848 can potentially be used to convert between DC power and RF power and/or be responsible for impedance matching of the network to the load, though it is not necessary that all three provide each function.

As shown in FIG. 18E, the switched capacitor network of capacitor CF and FET switch 1844 is in parallel with the phase-switched network of capacitor $C_{P2}$, inductor $L_2$ and FET switch 1846. As a result, some embodiments could combine these two networks into a single switched reactive network having an input current that matches the sum of the input currents of the two switched reactive networks associated with FETs 1844 and 1846. Thus, in some embodiments, the three-switch PSIM shown in FIG. 18E can be implemented as a two-switch PSIM, such as shown in FIGS. 19 and 20.

Referring to FIG. 19, a schematic of an illustrative topology for two-switch PSIM 1900 is shown. Two-switch PSIM 1900 is coupled to RF source 1902 coupled in series with inductor $L_F$, which is in turn coupled to the parallel combination of FET 1904 and capacitor $C_F$. Branch reactance $X_1$ is coupled between capacitor $C_F$ and a phase-switched reactance network including reactance $X_{S2}$ coupled in series with the parallel combination of phase-switched reactance $X_{P2}$ and FET 1906. Branch reactance $X_2$ is coupled between the phase-switched reactance network and the load impedance $Z_L$. The branch reactances $X_1$, $X_2$ and $X_{S2}$, and the phase-switched variable reactance $X_{P2}$ can be implemented as various different reactive networks depending on the required functionality of the design. Either one of switch FETs 1904 and 1906, or both of switches 1904 and 1906, can be used to convert between DC power and RF power.

Referring to FIG. 20, an illustrative implementation of two-switch PSIM 2000 is shown having branch reactance $X_1$ implemented as inductor $L_{S1}$ and capacitor $C_{S1}$. Capacitor $C_{S1}$ provides DC isolation between FET switches 2004 and 2006. Thus, FET switch 2004 generates RF power and FET switch 2006 modulates the impedance presented to the source.

FIG. 21 shows an illustrative implementation of a three-switch PSIM amplifier 2100. PSIM amplifier 2100 operates over a 20.86 MHz to 27.12 MHz frequency range (a factor of 1.3 in frequency). Further, PSIM amplifier 2100 provides the ability for 10:1 dynamic control of the output power delivered to the load having an impedance, $Z_L$, of 50Ω with a ±10% impedance variation (resistive and reactive).

PSIM amplifier 2100 includes RF PA (inverter) 2102, Pi-TMN 2104, branch filter 2106, and load impedance $Z_L$. RF PA 2102 includes FET switch 2108, inductor $L_F$ and an output network formed by capacitors $C_F$ and $C_{S1}$ and inductor $L_{S1}$. In the embodiment shown in FIG. 21, RF PA 2102 is a modified class E inverter with FET switch 2108 converting between DC power and RF power. Pi-TMN 2104 includes a first phase-switched capacitor (e.g., $C_{P2}$ and FET 2110) and a second phase-switched capacitor (e.g., $C_{P1}$ and FET 2112). Branch filter 2106 includes inductor $L_{S3}$ and capacitor $C_{S3}$ coupled between Pi-TMN 2104 and load $Z_L$.

RF PA 2102 maintains zero-voltage-switching (ZVS) and high efficiency at different output power levels when Pi-TMN 2104 maintains the inverter load impedance $Z_{TMN}$ as an approximately resistive load at the frequency of operation of RF PA 2102. RF PA 2102 generates peak RF power when $Z_{TMN}$ is 50Ω (e.g., matches load impedance $Z_L$). Dynamic control of power back off of RF PA 2102 can be achieved by Pi-TMN 2104 modulating $Z_{TMN}$.

For operation over a 20.86 MHz to 27.12 MHz frequency range, the illustrative embodiment of PSIM amplifier 2100 shown in FIG. 21 employs inductor $L_F$ having a value of 113 nH, capacitor $C_F$ having a value of 180 pF, capacitor $C_{S1}$ having a value of 15.2 pF, inductor $L_{S1}$ having a value of 3.81 µH, phase-switched capacitor $C_{P2}$ having a physical value, $C_0$, of 152 pF, inductor $L_{S2}$ having a value of 381 nH, capacitor $C_{S2}$ having a value of 0.01 µF, phase-switched capacitor $C_{P1}$ having a physical value, $C_0$, of 152 pF, inductor $L_{S3}$ having a value of 3.81 µH, and capacitor $C_{S3}$ having a value of 15.2 pF. In some embodiments, Pi-TMN 2104 employs half-wave switched capacitor networks (e.g., capacitor $C_{P2}$ and FET 2110 and capacitor $C_{P1}$ and FET 2112).

The series reactive network branch formed by capacitor $C_{S2}$ and inductor $L_{S2}$ has a 50Ω inductive impedance at a frequency of 20.86 MHz and also DC isolates the two switched networks (e.g., capacitor CP2 and FET 2110 and capacitor CP1 and FET 2112). The impedance of capacitor CS2 and inductor LS2 sets the resistive range over which $Z_{TMN}$ of Pi-TMN 2104 can be modulated. The series resonant network formed by capacitor CS3 and inductor $L_{S3}$ provides additional filtering of the load current IL and prevents DC currents and high-frequency harmonic content being coupled to the load $Z_L$. Pi-TMN 2104 can modulate the impedance, $Z_{TMN}$, presented to RF PA 2102 by appropriately driving FET switches 2110 and 2112, for example by adjusting the conduction angles of the FETs. By modulating the impedance $Z_{TMN}$ presented to RF PA 2102, Pi-TMN 2104 can control the output power that is delivered from RF PA 2102 to load $Z_L$.

FIG. 22 shows an illustrative impedance range (e.g., shaded region 2202) over which $Z_{TMN}$ of Pi-TMN 2104 can be adjusted at 20.86 MHz. FIG. 23 shows an illustrative impedance range (e.g., shaded region 2302) over which $Z_{TMN}$ of Pi-TMN 2104 can be adjusted at 27.12 MHz. Smith charts 2200 and 2300 are normalized to 50Ω. Shaded regions 2202 and 2302 illustrate that Pi-TMN 2104 can match load impedance $Z_L$ over a 10:1 range by varying phase-switched capacitor $C_{P1}$ over a 1:6 impedance range (e.g., varying the switching angle, α1, of FET 2112 over approximately 0 degrees to 125 degrees) and varying phase-switched capacitor CP1 over a 1:10 impedance range (e.g., varying the switching angle, α2, of FET 2110 over approximately 0 degrees to 135 degrees). Furthermore, $Z_{TMN}$ can be modulated to account for a ±10% variation in the load impedance $Z_L$ (both resistive and reactive) at the frequency of operation of RF PA 2102.

To set the correct value of switching angle, α1, of FET 2112 and switching angle, α2, of FET 2110 for Pi-TMN 2104 to achieve a given impedance, LUT 108 might store predetermined switching angles (e.g., α1 and α2) corresponding to various impedances. For example, table 3 shows an illustrative list of possible impedances $Z_{TMN}$ that can be matched to a 50Ω load impedance $Z_L$ and the corresponding switching angles (e.g., α1 and α2). The values of table 3 might be determined based upon simulation of PSIM amplifier 2100, where FETs 2110 and 2112 are modeled having an on-state resistance of 10 mΩ and a body diode having a 0.4 V forward voltage drop. The output power listed in table 3 includes power delivered at the fundamental and higher frequencies when the PSIM amplifier is supplied with a 48 VDC power supply.

TABLE 3

| Switching Frequency (MHz) | α₁ (degrees) | α₂ (degrees) | TMN Impedance $Z_{TMN}$ (Ω) | Output Power (W) |
|---|---|---|---|---|
| 27.12 | 82.1 | 48.6 | 55.5 + 6.06j | 19.8 |
| 27.12 | 64.4 | 68.3 | 125 − 1.60j | 12.3 |
| 27.12 | 61.3 | 66.4 | 50.0 − 1.14j | 3.5 |
| 20.86 | 0.10 | 0.10 | 48.9 − 1.20j | 58.6 |
| 20.86 | 146 | 87.7 | 49.8 − 5.90j | 5.4 |

As described, PSIM amplifier 2100 maintains zero-voltage-switching of all FET switches across a wide range of output power, loading impedance, and frequency of operation. For example, for illustrative PSIM amplifier 2100 to deliver an output power of 58.6 W to 50Ω load ZL at 20.86 MHz with a power supply voltage of 48 VDC, TMN 2102 is required to provide nearly a 1:1 impedance match (e.g., $Z_L = Z_{TMN} = 50Ω$). Under this operating condition, the required effective shunt capacitance at nodes $N_1$ and $N_2$ is equivalent to the $C_{P1}$ and $C_{P2}$ capacitances, respectively, and hence FET switches 2110 and 2112 are off during the entire cycle and the drain voltage waveforms of FET switches 2110 and 2112 would be sinusoidal.

As another example, for illustrative PSIM amplifier 2100 to deliver an output power of 3.50 W to 50Ω load $Z_L$ at 27.12 MHz with a power supply voltage of 48 VDC, TMN 2102 is required to provide an impedance ZTMN of approximately 50Ω (as shown in Table 3). Under this operating condition, the required effective shunt capacitance at nodes $N_1$ and $N_2$ is higher than the $C_{P1}$ and $C_{P2}$ capacitances, respectively, and hence FET switches 2110 and 2112 are turned on for a certain portion of the cycle while maintaining ZVS. Despite high frequency harmonic content of the drain voltage waveforms of FET switches 2110 and 2112, the load current $I_L$ flowing through load $Z_L$ should remain nearly sinusoidal. Thus, PSIM amplifier 2100 is capable of providing dynamic output power control while matching into a variable load across a range of switching frequencies.

Referring now to FIG. 25A, a pulse width modulation (PWM) generator 2500 includes a phase shifting circuit 2504 which includes one or more phase-shifting elements 2504a-2504N with each phase shifting element having inputs and outputs. PWM shifting circuit 2504 receives one or more reference signals from reference signal source 2502 and provides one or more phase shifted signals 2510 at outputs thereof. PWM generator further includes a PWM waveform combiner 2506 configured to receive signals provided thereto from phase-shifting circuit 2504, combine such signals and provide a PWM signal at an output thereof. Thus, PWM generator 2500 receives one or more reference signals 2508 and generates one or more PWM signals 2508 with the ability to dynamically control pulse width and phase with respect to reference signal 2502. In particular, PWM generator 2500 is configured to generate one or more PWM signals 2508 having predetermined pulse widths and phase shifts relative to reference signals 2502. Reference signal source 2502 and PWM signal 2508 are here shown in phantom since they are not properly a part of PWM generator 2500.

Reference signals provided by 2502 may be provided as any arbitrary, periodic waveform including, but not limited to, periodic voltage and current waveforms having a variety of waveform shapes including but not limited to, sinusoidal waveforms (e.g. sine waves, cosine waves, or portions there of etc.), rectangular waveform, square waveforms, triangular waveforms, or any combination thereof. Although for purposes of clarity reference is sometimes made hereinbelow to a reference signal being a voltage waveform, those of ordinary skill in the art will appreciate that current waveforms may also be used in accordance with the described concepts. Further, any other signal derived from current and/or voltage signals may also be used as a reference.

In embodiments, an input of at least one phase-shifting element in phase shifting circuit 2504 is configured to receive at least one reference signal 2502. In other embodiments, inputs of two or more phase shifting elements 2504 may be configured to receive at least one reference signal 2502. Examples of different phase-shifting circuit architectures will be discussed below with reference to FIGS. 26 and 27.

As will become apparent from the description herein below, each phase-shifting element of phase-shifting circuit 2504 is configured to generate a phase-shifted signal 2510 relative to received reference signals 2502 at its respective output based upon a respective phase-shift parameter. Phase shift parameters are provided from a controller 2509 which is here shown in phantom since it is not properly a part of PWM generator 2500. Each phase-shifting element can include analog and/or digital circuitry configured to apply a phase shift to a signal received at its input to generate the phase-shifted signal at its output phase-shifting elements may comprise, for example, any of In-phase/In-quadrature ("IQ") circuits, phase-locked loop ("PLL") circuits, or any combination thereof.

In embodiments, a phase-shift parameter can include a predetermined phase shift and/or predetermined pulse width used to generate a signal having a particular phase-shift (e.g. used in the generation of a phase-shifted signals 2510). According to some embodiments, each phase-shifting element 2504 is configured to receive a respective predetermined phase-shift parameter from controller 2509. Controller 2509 may be provided, for example, as any type of processing circuitry including, but not limited to, a digital signal processor ("DSP"), a computer, a microprocessor, a microcontroller, or any combination thereof.

As will be described in detail below in conjunction with at least FIG. 27, in some embodiments, a first phase-shifting element 2504a can be configured to receive at least one reference signal 2502 at its input while a second phase-shifting element 2504b can be configured to receive at its input a generated phase-shifted signal (e.g. one of signals 2510) from another (i.e. a different) phase-shifting element (e.g. the first phase-shifting element 2504a).

In embodiments, each phase-shifting element 2504a-2504N is configured to shift the phase of signals received at its input based upon a respective phase-shift parameter in order to generate a corresponding one of phase-shifted signals 2510a-2510N generally denoted 2510. In embodiments, some phase-shifting elements may be configured to shift the phase of a received reference 2502 in order to generate a phase-shifted signal 2510 while others may be configured to shift the phase of generated phase-shift signals 2510 received from another phase-shifting element 2504. For example, a phase-shifting element 2504 can receive a phase-shift parameter comprising a phase shift φ. This phase-shifting element 2504 may then generate a phase-shifted signal 2510 at its output by shifting the phase of a signal received at its input (e.g. a reference signal 2502 or generated phase-shifted signal) according to the phase shift φ.

Waveform combiner 2506 is configured to receive the one or more generated phase-shifted signals 2510A-2510N generated by phase-shifting elements 2504A-2504N. Waveform combiner 2506 is configured to combine the phase-shifted signals provided (e.g. phase-shifted signals 2510) thereto and generate PWM signals 2508. Waveform combiner 2506 can include analog/digital circuitry configured to generate, compare, summate, combine, detect, or amplify PWM signals 2508. Such circuitry may include, but is not limited to, edge detectors, analog or digital logic gates, operational amplifier, comparators, or any combination thereof. In some embodiments, waveform combiner 2506 is configured to generate one or more PWM signals 2508 according to received phase-shifted signals 2510, while in other embodiments waveform combiner 2506 can be configured to generate two or more PWM signals 2508 according to received phase-shifted signals 2510.

By generating PWM signals 2508 according to the received phase-shifted signals 2510, the generated PWM signals 2508 have phase-shifts and pulse widths relative to reference signals 2502. These phase-shifted and pulse width adjusted signals are determined from the phase-shift parameters applied by phase-shifting elements 2504 in generating the phase-shifted signals 2510. In some embodiments, phase-shift parameters are determined and stored in a memory or other storage device (e.g. a memory which may be part of or separate form controller 2509, for example). It should be appreciated that in some embodiments the phase shift parameters are determined based on the PWM signal duty-cycle and phase shift that is required by a particular application of the PWM generator. These parameters may be pre-stored in the controller 2509 or in a separate external controller/memory. Typically, the phase shift parameters need to be dynamically adjusted depending upon the specific application, and so, an external system controller could be tasked with estimating/calculating these parameters based on various inputs from the system and passing them to PWM controller 2509.

As such, a person of ordinary skill in the art should appreciate that desired phase-shifts and pulse widths of the generated PWM signals 2508 relative to reference signals 2502 can be achieved through selecting the phase-shift parameters necessary to achieve the desired phase-shifts and pulse widths.

In embodiments, controller 2509 can be configured to determine phase-shift parameters for respective phase-shifting elements 2504 based upon desired phase-shift and pulse widths for generated PWM signals 2508. For example, controller 2509 can be configured to determine a desired phase shift and pulse width for a generated PWM signal 2508 relative to a reference signal 2502. Based on the desired phase shift and pulse width, controller 2509 can determine phase-shift parameters using empirical or analytical techniques In more detail, the phase shift parameters may be determined based upon feedback or feedforward techniques or a combination of both. for one or more phase-shifting elements 2504 so that the phase-shifting elements generate phase-shifted signals 2510 that can, in turn, be used to generate a PWM signal 2508 having the desired phase shift and pulse width relative to a reference signal 2502.

Further, as will be described in detail herein below, generating PWM signals 2508 according to the received phase-shifted signals 2510, the pulse width and phase of each generated PWM signal 2508 can be independently adjusted over a 0° to 360° range with arbitrarily fine resolution that is not affected by the operating frequency (e.g. the frequency of reference signal 2508). The generated PWM signals 2508 are capable of maintaining phase and frequency lock to reference signal 2502 for a wide modulation range of the reference signal frequency. In embodiments, PWM generator 100 is suitable for generating accurate and dynamically adjustable PWM waveforms for high-frequency and very-high-frequency applications. PWM generator 100 has particular value in applications in which reference signal 2508 is derived from some radio frequency ("RF") input source with respect to which precise timing of the PWM signal must be maintained, including PSIM-based tunable matching networks and PSIM amplifiers.

Referring now to FIG. 25B, a portion of an illustrative PWM signal Q(θ) 2508 generated by PWM generator (e.g. such as PWM generator 2500 described in conjunction with FIG. 25A), has a pair of pulses 2508a, 2508b. Each of the pulses 2508a, 2508b has a pulse width$_w$ 2512 and is locked in phase and frequency to a reference signal $V_{REF}(θ)$ 2502. PWM signal Q(θ) 2508 can be generated as discussed above in conjunction with FIG. 25A.

In the example embodiment of FIG. 25B, the generated PWM signal Q(θ) 2508 has a phase shift ϕ (identified by reference numeral 2514) relative to reference signal $V_{REF}(θ)$ 2502. Here, phase shift ϕ 2514 is defined between the rising edge of PWM signal Q(θ) 2508 and the negative-to-positive transition of reference signal $V_{REF}(θ)$ It should be noted that this definition of PWM phase shift is used throughout this disclosure. The phase shift 2514 illustrated in FIG. 25B is considered a positive phase shift. It should also be noted that the definition of phase shift is only truly unique between two sinusoidal signals at the same frequency. When describing the relationship between a PWM and sinusoidal signal such as in FIG. 25B, the definition of phase shift is arbitrary. The phase shift definition used herein is only chosen for the sake of convenience. However, if one desires, one can define phase shift any other way, as long as the definition uniquely describes the relationship between the two signals in FIG. 25B. If that is the case, phase shift based on one definition can always be converted to phase shift based on another definition without loss of generality. The phase shift definition has no effect on the circuit implementation. As discussed above, one of ordinary skill in the art will appreciate that desired pulse widths w 2512 and phase shifts ϕ 2514 relative to a reference signal 2502 can be achieved via selected values of phase-shift parameters provided to PWM generator 2504 necessary for phase-shifting elements 2504 to achieve the desired phase shift.

Referring now to FIG. 26, a PWM generator circuit 2600 includes a pair of phase-shifting elements 2016, 2018 coupled such that processing of a reference signal 2602 occurs in parallel. Such an architecture is referred to herein as a "parallel architecture."

Phase shifting elements 2620, 2622 may be the same as or similar to phase shifting elements 2504a-2504N described above in conjunction with FIG. 25. In a parallel architecture, inputs of at least two phase-shifting elements, are configured to receive a common reference signal (here reference signal 2602), which may be the same as or similar to reference signals 2502. Each phase-shifting element 2616, 2618 is configured to generate a respective phase-shifted signal at its output based upon the received reference signal 2602 and a received predetermined phase-shift parameter provided from control signals 2620, 2632 which may be provided from one or more controllers (such as controller 2509 described above in conjunction with FIG. 25). Phase-shifting elements 2616, 2618 are each configured to generate a phase-shifted signal by applying a phase-shift to a received reference signal 2602 according to a respective phase-shift parameter included in respective ones of controller signals 2620, 2622.

According to embodiments, each phase-shifting element 2616, 2618 can be configured to receive a respective one of control signals 2620, 2622. Control signals 2620, 2622 can include one or more predetermined phase-shift parameter for each of the respective phase-shifting element 2616, 2618. In embodiments, control signals 2620, 2622 can be generated by a processing circuitry such as, but not limited to, a DSP, a computer, a microprocessor, a microcontroller, or any combination thereof.

In the illustrative embodiment of FIG. 26, phase-shifting element 2616 is configured to receive control signal 2620 which includes a phase-shift parameter including a phase-shift of ϕ. Further, phase-shifting element 2618 can be configured to receive control signal 2622 which includes a phase-shift parameter including a phase-shift of ϕ and a pulse width of w. Phase-shifting elements produce phase-shifted signals A, B at respective outputs thereof.

Waveform combiner 2606 is configured to receive the phase-shifted signals A, B generated at the outputs of phase-shifting elements 2616, 2618. Waveform combiner 2606 can be the same as or similar to waveform combiner 2506 (FIG. 25A). In response to phase-shifted signals A, B provided thereto, waveform combiner 2606 generates a PWM signal 2608. PWM signal 2608 has phase-shift and pulse width characteristics according to the received phase-shifted signal. A generated by phase-shifting element 2616 and phase-shifted signal B generated by phase-shifting element 2618.

In the illustrative embodiment of FIG. 26, phase-shifted signals A and B are phase-locked to the reference signal 2602 and phase-shifted according to the respective phase shift valves (ϕ and w+ϕ) of the phase-shifting element from which they were generated. In embodiments, phase-shifted signals A and B can then be appropriately combined e.g. via waveform combiner 2606 to synthesize PWM signal 2608 with pulse width w and phase ϕ that is phase-locked to reference signal 2602. One of ordinary skill in the art should appreciate that the amount of phase shift that is necessary for phase-shifting elements 2616, 2618 to generate a desired PWM waveform 2608 is highly dependent upon the actual implementation of waveform combiner 2608.

It should also be appreciated that while FIG. 26 shows a parallel architecture with only two phase-shifting elements, it should be noted that the parallel architecture can implemented using three or more phase-shifting elements. The number of phase shifting elements to include in a phase-shifter circuit is selected in accordance with the needs of a particular application. Factors to consider in selecting the number of phase shifting elements to include in a PWM generator include but is not limited to the number of rising/falling edges that the PWM waveform must have during a single period. In the simplest terms, each phase-shifting element controls the position of one rising or falling edge of the of the PWM waveform in relation to the start of its period. For example, in FIG. 26, the PWM waveform has a single pulse every period and hence, it has only one rising and one falling edge; phase shifting element 2616 sets the position of the rising edge, and phase shifting element 2618 sets the position of the falling edge. In more complicated PWM waveforms, where it may be required to have more than one pulse each period there need to be more falling and rising edges, and more phase shifting elements are needed to control all the edges. For example, in FIG. 28, Q has two pulses repeating every single period and a total of four edges in a period. Hence, to control the relative position of each of these edges, four phase-shifting elements are required.

Another reason for having more phase-shifting elements than the required minimum is system redundancy and reliability. For example, in FIG. 26 an additional redundant phase-shifting element (identical to 2616) can be implemented to produce another copy of signal A. In the case that one of the phase-shifting elements fails, the waveform combiner can automatically select the other copy of signal A.

Referring now to FIG. 27, PWM generator circuit 2700 or more simply, a PWM generator, includes a pair of phase shifting elements 2716, 2718 with a first one of the phase shifting elements (here phase shifting elements 2716) having an input configured to receive a reference signal 2702 and having an output coupled to both an input of a waveform combiner 2706 and an input of a second phase-shifting element (here phase-shifting element 2718). An output of the second phase shifting element is coupled to a second input of waveform combiner 2706. Such an architecture is referred to herein as a "cascade architecture."

In a cascade architecture, a first phase-shifting element 2716, which may be the same as or similar to phase-shifting elements 2504 (FIG. 1) is configured to receive reference signal 2702 at its input. The first phase-shifting element 2716 is configured to generate phase-shifted signal A at its output based upon reference signal 2702 and a respective predetermined phase shift parameter (provided, for example, by a controller such as controller 2509 described above in conjunction with FIG. 25A). For example, phase-shifting element 2716 can be configured to generate phase-shifted signal A by shifting the phase of reference signal 2702 according to a predetermined phase-shift parameter.

As discussed above with reference to FIG. 26, a phase-shift element may be configured to receive a control signal that includes a predetermined phase-shift parameter. For example, in the illustrative embodiment of FIG. 27, phase-shifting element 2716 is configured to receive control signal 2720 that includes a phase-shift parameter $\phi$.

The cascaded architecture further includes a second phase-shifting element 2718 configured to receive, at its input, phase-shifted signal A generated by phase-shifting element 2716. The second phase-shifting element 2718 is configured to generate phase-shifted signal B at its output based upon phase-shifted signal A and a respective phase-shift parameter. For example, in the illustrative embodiment of FIG. 27, phase-shifting element 2718 is configured to generate phase-shifted signal B by shifting the phase of phase-shifted signal B according to a predetermined phase-shift parameter here shown as ($\phi$+w).

Waveform combiner 2706, which may be the same as or similar to waveform combiner 2506 (FIG. 25A), is configured to receive the phase-shifted signals generated at the outputs of phase-shifting elements 2716, 2718 and to generate PWM signal 2708 having a desired pulse width and a phase-shift relative to reference signal 2702.

In the illustrative embodiment of FIG. 27, phase-shifting elements 2716, 2718 are configured to generate phase-shifted signals A and B phase-locked to the reference signal 2702 and phase-shifted with respect to reference signal 2702 by phase-shifts $\phi$ and $\phi$+w respectively. However, the phase-shifting elements 2716, 2718 in the cascade architecture introduce a phase shift of only $\phi$ and w (i.e. phase shifting element 2716 introduces phase shift $\phi$ and phase shifting element 2718 introduces phase shift w). In a parallel architecture on the other hand, phase-shifting elements phase shift the reference signal by $\phi$ and $\phi$+w (e.g. in FIG. 26, phase shifting element 2616 introduces phase shift $\phi$ and phase shifting element 2618 introduces phase shift $\phi$+w).

In general, for generating the same PWM waveform, the phase-shifting elements in a parallel architecture need to be able to introduce larger phase shifts and operate over a wider phase-shifting range compared to those in a cascaded architecture.

A cascade architecture, on the other hand, a generated-PWM waveform may suffer from more jitter compared to the PWM waveform generated with a parallel architecture. The choice of one system architecture over the other is dependent upon a variety of factors including but not limited to the specific application and the requirements for the generated PWM waveform, and on the characteristics of the circuits available to implement them. Although the range of phase shift that each phase-shifting element can produce is an important deciding factor in the choice of cascaded versus paralleled architecture, dynamic behavior and transient response of the PWM generator is also highly dependent on the generator architecture. Paralleled architectures allow one to independently control the dynamics with which the rising and falling edges of the PWM waveform can be adjusted. In cascaded architectures on the other hand, the dynamics with which one can control the pulse of the PWM waveform is a combination of the dynamic responses of all the phase shifting elements.

For generating single-pulse PWM waveforms (i.e. one PWM pulse per cycle of the periodic reference signal 2502) such as the one shown in FIG. 25B, architectures with two phase-shifting elements are sufficient (see FIGS. 26 and 27). However, by employing more phase-shifting elements, one can generate even more sophisticated PWM signals, including waveforms having multiple pulses and multiple related PWM signals (e.g., as may be used to drive the multiple switches in a multi-switch amplifier or converter).

Referring now to FIG. 28, a PWM generator 2800 is configured to generate a dual-pulse PWM waveform 2808 and includes at least four phase-shifting elements 2824-2830 each having outputs coupled to inputs of a waveform combiner 2806. A first set of phase-shifting elements 2824, 2826 are each configured to received reference signal 2802 at their respective inputs. Phase-shifting elements 2824, 2826 are each configured to generate a phase-shifted signal at their respective outputs according to reference signal 2802 and a respective phase-shift parameter. For example, in the illustrative embodiment of FIG. 28, phase-shifting element 2824 is configured to generate a phase-shifted signal at its output by shifting the phase of reference signal 2802 according to phase-shifting element's 2824 respective phase-shift parameter ($\phi$). Likewise, phase-shifting element 2826 is configured to generate a phase-shifted signal at its output by shifting the phase of reference signal 2802 according to phase-shifting element's 2826 respective phase-shift parameter ($\phi$+$\alpha$+$\gamma$).

A second set of phase-shifting elements 2828, 2830 are each configured to receive, at their inputs, a phase-shifted signal generated by respective ones of the first set of phase-shifting element 2824, 2826. For example, in the illustrative embodiment of FIG. 28, phase-shifting element 2828 is configured to receive, at its input, the phase-shifted signal generated by phase-shifting element 2824 and phase-shifting element 2830 is configured to receive, at its input, the phase-shifted signal generated by phase-shifting element 2826.

The phase-shifting elements 2828, 2830 of the second set are each configured to generate a phase-shifted signal at their respective outputs based upon a phase-shifted signal generated by a phase-shifting element of the first set and a respective phase-shift parameter. For example, in the illustrative embodiment of FIG. 28, phase-shifting element 2828 is configured to generate a phase-shifted signal by further shifting the phase of the phase-shifted signal generated by phase-shifting element 2824 provided to the input of phase-shifting element 2828. Phase-shifting element 2828 shifts the phase of the signal provided thereto by a phase of ($\alpha$).

Similarly, phase-shifting element 2830 is configured to generate a phase-shifted signal by shifting the phase of the phase-shifted signal generated by phase-shifting element 2826 according to phase-shifting element's 2830 respective phase-shift parameter ($\beta$).

Waveform combiner 2806 receives the phase-shifted signals generated at the output of phase-shifting elements 2824-2830 at inputs thereof, combines the signals provided thereto and generates PWM signal 2808 according to the received phase-shifted signal. In embodiments, PWM signal 2808 is a dual-pulse PWM waveform (i.e. a pair of pulses which occur within a single cycle of a reference signal waveform) having a first pulse width and phase-shift relative to reference signal 2802 and a second pulse width and phase-shift relative to reference signal 2802.

By using two sets of phase-shifting elements to generate PWM signal 2808, it is possible to generate a dual-pulse PWM waveform. In the illustrative embodiment of FIG. 28, PWM waveform 2808 includes a dynamically and independently controlled phase $\phi$ with pulse widths $\alpha$ and $\beta$, and spacing between the pulses y while maintaining phase and frequency lock to the reference signal 2802.

One possible way to achieve this behavior is to design the waveform combiner in this example to toggle its output Q whenever one of its four inputs undergoes a negative-to-positive transition. For instance, suppose that Q is logic low when REF undergoes a negative-to-positive transition at $^\theta$=0. The level of output signal Q remains low until the output of phase-shifting element 2824 undergoes a negative-to-positive transition at $^\theta$, at which point output signal Q toggles to logic high. Output signal Q remains at logic level high for (a degrees at which point the negative-to-positive transition of the output of the phase-shifting element 2828 resets Q. Similarly, the negative-to-positive transitions on the outputs of phase-shifting elements 2826 and 2830 cause another pulse of width $\beta$ to follow the first one with a pulse spacing of $\gamma$. In this fashion, very complex multi-pulse PWM waveforms can be generated that remain phase- and frequency-locked to a reference signal input. Note that in the example of FIG. 28, both paralleling and cascading of phase-shifting elements is employed—i.e. it is a hybrid architecture.

Referring now to FIG. 29, a PWM generator 2900 includes a pair of phase-shifting elements 2916, 2918 coupled in a parallel architecture. Phase shifting elements 2916, 2918 may be the same as or similar to the phase shifting elements described above in conjunction with FIGS. 25A*m* 26. PWM generator 2900 also includes a phase detector 2932 which receives a portion of the reference signal at an input thereof. Phase detector 2932 also receives at an input thereof, a feedback signal from an output of a waveform combiner 2906. Outputs of phase detector 2932 are coupled to phase shifting elements 2916, 2918.

In embodiments, phase detector 2932 is configured to receive a portion of reference signal 2902 and a portion of PWM output signal 2908 and is configured to monitor (i.e. measure, detect, compute or otherwise determine) the phase between PWM signal 2908 and reference signal 2902. Phase detector 2932 can include analog and/or digital circuitry configured to detect and compare the phases of two or more signals and can include a DSP, microprocessor, computer, microcontroller.

Waveform combiner 2908 may be the same as or similar to waveform combiner 2508 (FIG. 25). In embodiments, there may be significant propagation delays associated with the circuitry of waveform combiner 2908. Such propagation delays result in phase modulation of the waveform combiner's 2908 output (i.e. the phase of the output signal of the waveform combiner may have a frequency variation which may interrupt the phase lock between reference signal 2902 and PWM waveform 2902. In embodiments, phase detector 2932 can be configured to compare the phase between PWM signal 2908 and reference signal 2902 to a phase threshold. A phase threshold corresponds to a value for a phase indicating that the phase between PWM signal 2908 and reference signal 2902 has become too great. In other words, a phase threshold can include a value that indicates that PWM signal 2908 and reference signal 2902 are no longer in phase lock.

In embodiments, phase detector 2932 can be configured to generate one or more phase correction signals when PWM signal 2908 and reference 2902 are determined to be no longer in phase lock. Phase correction signals can include data indicating an adjustment to one or more phase-shift parameters of respective phase-shifting elements in order to place PWM signal 2908 and reference signal 2902 in phase lock. Thus, phase correction signals include data to correct for the propagation delays causing PWM signal 2908 and reference signal 2902 to no longer be in phase lock.

In embodiments, each phase-shifting element 2916, 2918 is configured to receive a phase correction signal and, in response to the phase correction signal, adjust its phase-shift parameter. By adjusting the phase-shift parameter of a phase-shifting element 2916, 2918, the phase-shifted signal generated by the phase-shifting element 2916, 2918 is also adjusted. Because PWM signal 2902 is generated by waveform combiner 2908 according to received phase-shifted signals, adjusting the phase-shift parameters allows for a correction in the PWM signal 2902 generated by waveform combiner 2906.

Referring now to FIG. 30, PWM generation system 3000 includes a plurality of PWM generators 3036a-3036N each of which may be the same as or similar to any of PWM generators 2500, 2600, 2700, 2800, 2900 described above in conjunction with FIGS. 25A, 26, 27, 28 and 29, respectively. Each PWM generators 3036a-N is configured to receive reference signal 3002.

In the illustrative embodiment of FIG. 30, each PWM generator 3036a-N includes at least two phase-shifting elements 3016a-N, 3018a-N configured to generate one or more phase shifted signals based upon reference signal 3002 and phase-shift parameters associated with each phase-shifting element 3016a-N, 3018a-N.

For example, PWM generator 3036a includes phase-shifting elements 3016a, 3018a which are configured to generate two or more phase-shifted signals based upon reference signal 3002 and phase-shift parameters associated with phase-shifting elements 3016a, 3018a. Each phase-shifted signal generated by a phase-shifting element A-N 3016a-N, 3018a-N, is provided to a respective waveform combiner 3006a-N in order to generate a respective PWM signal 3008a-N.

In this way, multiple PWM signals 3008a-N frequency and phase locked to reference signal 3002 can be generated with each PWM signal 3008a-N having a respective pulse width and phase-shift relative to reference signal 3002.

In embodiments, each phase-shifting element 3016a-N, 3018a-N, is configured to receive a phase-shift parameter from a controller 3034. Controller 3034 can include a processing circuitry such as, but not limited to, a DSP, a computer, a microprocessor, a microcontroller, or any combination thereof. In embodiments, controller 3034 is configured to receive an input comprising desired pulse widths and phase shifts relative to a reference signal 3002 for one or more desire PWM signals 3008 It should be appreciated that desired PWM pulse widths/phases can also be an input supplied by a user, or be pre-determined and stored in some look-up table in memory.

Typically, however, desired pulse widths and phases will be determined by the controller in relation to some sort of system feedback whether it is impedance levels or some other measured voltage/current/power signals within the system. In embodiments, controller 3034 can receive an input comprising desired pulse widths and phase shifts relative to a reference signal 3002 from a computer, a microcontroller, a processor, a graphic user interface, an interaction device (i.e. a keyboard, a mouse, a touchscreen, etc.), or any combination thereof—to name a few. Based upon these desired pulse widths and phase shifts relative to a reference signal 3002, controller 3034 is configured to determine the phase-shift parameters for each phase-shifting element necessary to achieve the desired pulse widths and phase shifts and provide them to the respective phase-shift elements.

By having controller 3034 determine and provide the phase-shift parameters to the phase-shifting elements necessary to achieve the desired pulse widths and phase shifts, each PWM waveform 3008A-N generated by PWM generation system 300 can be dynamically and independently adjusted by controller 3034. In many applications, there is a need to generate multiple PWM waveforms that are properly synchronized with respect to each other. This is of particular interest in many kinds of converters where one needs to accurately commutate between two or more switches. For example, driving the switches in a half-bridge would require the generation of two PWM waveforms with controllable duty-ratio and separately controlled dead time for each transition. Both the phase and pulse width w of each PWM waveform can be dynamically and independently adjusted by a controller.

One of skill in the art will appreciate that although the illustrative embodiment of FIG. 30 shows all N of PWM generators 3036a-N being based on the paralleled architecture (FIG. 26), other architectures may be used, such as a cascading architecture, or any combination of the two. Depending on the specific requirements of an application, PWM generators with different architectures and/or implementations can be connected together and fed with a common reference signal.

One of skill in the will note that characteristics of a particular PWM generation architecture are highly dependent on the implementation details of the phase-shifting elements and the waveform combiner. PWM generation architectures with phase-shifting element implementations based on both IQ modulators and phase-locked loops, as discussed below. Designs based on IQ modulators and phase-locked loops often allow one to control phase shift over a wide operating frequency range while preventing phase shift modulation with frequency variation. One of ordinary skill will note that there are other possible methods for implementing phase-shifting elements such as programmable/voltage-controlled delay lines and delay-locked loops.

Regarding FIGS. 31-35, embodiments of PWM generators are provided based on phase-shifting elements implemented with IQ modulators. In embodiment, IQ modulators allow for an RF carrier signal to be modulated according to a diverse range of amplitude, frequency and phase modulation operations.

Referring now to FIG. 31, PWM generation circuit 3100 implemented as an IQ modulator that includes an amplitude and phase shifting circuit 3152 having a first input configured to receive a local oscillator (LO) signal 3140. PWM generation circuit further comprises a pair of optional amplifiers 3144, 3146. In this illustrative embodiment, a first one of the amplifiers is configured to receive an in-phase signa component I (also referred to herein a $I_{BB}$ and identified with reference numeral 3138) and a second one of the pair of amplifiers is configured to receive a quadrature-phase signal component Q (also referred to herein as $Q_{BB}$ and identified with reference numbered 3140). Amplifiers 3144, 316 receive the respective ones of IQ signals provided thereto and provide appropriately amplified signals to inputs of respective ones of a pair of mixers (or multipliers) 3418, 3150. Mixers 3148, 3150 receive on second inputs thereof appropriately phase and amplitude adjusted LO signals from amplitude and phase shifting circuit 3152. Outputs of mixers 3148, 3150 are coupled to inputs of a summing circuit 3154. Summing circuit 3154 appropriately sums the signals provided thereto provide a phase shift signal 3110 (an example of which is illustrated and described in conjunction with FIG. 25B above)

Thus, IQ modulator is configured to receive a local oscillator ("LO") 3140 which may be a signal the same or similar as reference signal 2502. IQ modulator 3100 is configured to split LO 3140 into two orthogonal signal components I 3138 and Q 3132. Signal Component I 3138 represents an in-phase component relative to LO 3140, in other words component I 3138 and LO 3140 have the same phase. Component Q 3132 represents the quadrature component of LO 3140 which has a phase shift with reference to LO 3140. For example, component Q 3132 can have a phase shift of 90° or π/2 radians with respect to LO 3140.

In embodiments, one or more signals derived from LO 3140 can be generated by amplitude and phase-shifting circuit 3152. Amplitude and phase-shifting circuit 3152 can include analog and/or digital circuits configured to shift the phase and/or amplitude of LO 3140 in order to generate one or more signals derived from LO 3140. In embodiments, amplitude and phase-shifting circuit 3152 is configured to generate signals derived from LO 3140 to be applied to component I 3138 ($I_{BB}$) and a signal derived from LO 3140 to be applied to component Q 3132 ($Q_{BB}$). In embodiments, amplitude and phase-shifting circuit 3152 is configured to generate baseband signals in order to achieve a desired phase shift of LO 3140.

In embodiments, component I 3138 is provided to multiplier 3148. In some embodiments, component I 3138 may first be provided to an amplifier 3144 before being provided to multiplier 3148. It should be appreciated that amplifiers 3144, 3146 can be used in general for any input signal conditioning, buffering or amplification/attenuation. It should be understood that although in this illustrative embodiment circuits 3144, 3146 are schematically illustrated as amplifiers, the actual function of circuits 3144/3146 is highly dependent on the specific implementation of the IQ modualtor. Further, a signal derived from LO 3140 generated by amplitude and phase-shifting circuit 3152 is also provided to multiplier 3148. Multiplier 3148 is configured to multiply component I 3138 and the signal derived from LO 3140 provide the product to adder 3154. Likewise, component Q 3142 is provided to multiplier 3150. In some embodiments component Q 3142 may be provided to an amplifier 3146 before being provided to multiplier 3150. Further, a second signal derived from LO 3140 generated by amplitude and phase-shifting circuit 3152 is provided to multiplier 3150. Multiplier 3150 is configured to multiply component Q 3142 and the signal derived from LO 3140 and provide the product to adder 3154. Each multiplier 3148, 3150 comprises analog and/or digital circuits configured to multiply two or more signals together.

Adder 3154 includes analog and/or digital circuits configured to summate two or more signals together. Adder 3154 is configured to generate a phase shifted signal 3110 by summating the products provided by multiplier 3148 and multiple 3150. In other words, adder 3154 is configured to generate a phase-shifted signal according to LO 3140 and the generated baseband signals $I_{BB}$ and $Q_{BB}$.

In embodiments, the output of an IQ modulator can be expressed as:

$$RF(t) = \quad [EQ\ 1]$$
$$I_{BB}\cos(\omega t) - Q_{bb}\sin(\omega t) = \sqrt{(I_{BB}^2 + Q_{BB}^2)}\ \cos\left(\omega t + \tan^{-1}\frac{Q_{BB}}{I_{BB}}\right)$$

Wherein RF(t) represents the phase-shifted signal generated by the IQ modulator.

For the sake of simplicity, it can be assumed that the LO 3140 is split into the two orthogonal $\cos(\omega t)$ and $-\sin(\omega t)$ signals. Any absolute phase offset in LO 3140 will result in an identical absolute phase offset in the phase-shifted signal.

As EQ. 1 suggests, by keeping $I_{BB}^2+Q_{BB}^2$ constant and adjusting the ratio of $Q_{BB}$ to $I_{BB}$, phase shift θ can be controlled between the local oscillator input and the RF output, while maintaining a constant RF magnitude. In embodiments, using the IQ modulator in this fashion—strictly as a phase modulator—is particularly suitable for implementing the phase-shifting elements required for PWM generation.

Referring now to FIG. 32, a phasor diagram (i.e. a polar plot) of an example I/Q modulation is provided. Represented in the polar view is $Q_{BB}$ 3242 along the Y-axis, $I_{BB}$ 3238 along the X-axis of the plot, with the phase shifted signal 3210 generated by an I/Q modulator represented as a phasor between the two. As can be seen from FIG. 32, $I_{BB}$ 3238 essentially controls the real component of the phase-shifted signal phasor, while $Q_{BB}$ sets its imaginary component. Thus, one of skill in the art will appreciate that by appropriately controlling the two base-band signals $I_{BB}$ and $Q_{BB}$ one can independently modulate both the amplitude and phase of the phase-shifted signal 3210. In embodiments, frequency modulation is also possible by appropriately modulating the phase of the output.

As can be seen from FIG. 32, keeping $I_{BB}^2+Q_{BB}^2$ constant and adjusting the ratio of $Q_{BB}$ to $I_{BB}$, phase shift θ can be controlled between the LO 3240 input and the phase-shifted signal output 3110, while maintaining a constant phase-shifted signal magnitude. Using the IQ modulator in this fashion—strictly as a phase modulator—is particularly suitable for implementing the phase shifting elements required for PWM generation.

It should be noted that although the phase of the PWM waveform may vary with frequency for a fixed set of baseband inputs I and Q, the pulse width 11' (in electrical degrees) remains constant and is not affect by frequency modulation. This is mainly due to the symmetric structure and the balanced path delays of the architecture of FIG. 33 (referred to herein as a parallel architecture).

It should also be appreciated that if the band-pass filters of the two IQ modulators in FIG. 33 have identical frequency-phase response, then a frequency variation will cause an identical phase offset to both $IQ_1$ and $IQ_2$. However, the pulse width of the PWM waveform is equal to the differential phase of the two logic gate inputs with respect to the REF signal. Thus, if the propagation delays from $IQ_1$ and $IQ_2$ to the output Q are also matched, frequency modulation only causes a common mode phase shift to the logic gate inputs, and hence does not affect the pulse width w. This is one reason for using comparators with matched propagation delays in a common package (i.e. the comparators are implemented in the same integrated circuit package and hence, they are exposed to similar manufacturing process variables and temperatures resulting in nearly matched propagation delays) for the implementation of the waveform combiner.

One of skill in the art will appreciate that if modulation of the PWM waveform phase φ with frequency for constant base-band inputs I and Q is undesirable for a particular application, a number of approaches can be pursued to alleviate this issue. For instance, I and Q can be tuned in response to a frequency variation to correct for any phase error in φ. This approach, however, requires an accurate measure of the frequency-phase response of the IQ modulators and the propagation delays associated with the waveform combiner circuitry. Furthermore, the controller that synthesizes the I and Q signals must keep track of the operating frequency—this may be undesirable and cumbersome for some applications.

To achieve accurate phase control of the phase-shifting elements, a look-up table is implemented into a controller, the same or similar as controller 3034, which maps a set of base-band I and Q values to a phase shift between the IQ output of the phase shifting element and its reference signal.

In an example embodiment, the I and Q values are synthesized with 12-bit OACs, and so they can only take one of 4096 discrete values. To create the look-up table, one of the baseband inputs is swept over its entire digital range, while the other one is adjusted to keep the magnitude of $I^2+Q^2$ roughly constant as suggested by (I). The phase shift between REF and IQ is measured for each of the 4096 pairs of base-band inputs and stored in the look-up table. This control approach corrects for any non-linarites in the DAC transfer functions, mismatches in the gain of the base-band channels of the IQ modulator, and the insertion phase of the output band-pass filter at a particular operating frequency.

Referring now to FIG. 33, a PWM generator 3300 includes one or more phase-shifting elements realized as a pair of IQ modulators as shown. The reference signal to which the PWM waveform is synchronized is fed to both IQ modulators and serves as their local oscillator input. A pair of DACs controlled with a microcontroller can be used to synthesize the appropriate values for the I and Q signals for each IQ modulator and thus control the Phase shift of their out outputs IQ1 and IQ2 with respect to the REF signal.

In the illustrative embodiment of FIG. 33, PWM generator 3300 includes a waveform combiner 3306 implemented with a pair of comparators and a single logic gate here shown as an gate, here provided as an AND gate. It should be appreciated that in the example implementation shown in FIG. 33, the logic AND gate has one inverting input. The gate is shown like this merely to simplify circuit complexity. In reality, however, the circuitry may be implemented with an AND gate with two non-inverting inputs along with a NOT gate at one of its inputs.

Another way to implement the same circuit functionality is to reverse (i.e. flip) the +/−connections of comparator 3368 (which negates its output) and feeding the outputs of the two comparators to an AND gate with two non-inverting inputs. In fact, the latter is the actual circuit implementation that we have used in the construction of our prototype The output Q of waveform combiner 3306 is asserted (logic-high) only during the time when signal $IQ_1$ is positive and signal $IQ_2$ is negative. Thus, to generate a PWM waveform with pulse width w and phase $\phi$, the IQ modulator outputs IQI and IQ2 must be phase-shifted with respect to the REF signal by $\phi$ and $\phi+w$ respectively.

It should be appreciated that, the resolution with which w and $\phi$ can be controlled depends upon the resolution with which the DACs can synthesize the I and Q inputs of the two IQ modulators. It should be noted that the implementation of the waveform combiner in FIG. 33 limits the pulse width of the output PWM waveform to a maximum of 1800 which corresponds to $IQ_1$ and $IQ_2$ being 1800 out-of-phase. As described below, however, this limitation can be alleviated with a different realization of the waveform combiner.

In one embodiment, an IQ modulator-based implementation of a single phase-shifting element utilizes an L TC5598 (Analog Devices Inc.) chip which provides an integrated realization of an IQ modulator having differential base-band I and Q inputs and differential LO input. The differential voltages at the I and Q inputs are converted to currents that in turn drive double-balanced mixers. The outputs of these mixers are summed and applied to a buffer, which converts the differential mixer signals to a 50 n single-ended buffered RF output. The L TC5598 allows operation over a 5 MHz to 1600 MHz local oscillator frequency range, while supporting more than 400 MHz of base-band bandwidth, which enables very fast adjustment of a PWM waveform. The I and Q inputs are synthesized with a pair of 12-bit DACs (AD5624, Analog Devices Inc.); their single-ended outputs are buffered and converted to differential signals with a pair of fully differential operational amplifiers (L TC6362, Linear Technology). The DACs are controlled with a microcontroller through a standard SPI serial interface. A passive impedance matching network and a I: 1 balun (TC I-I TG2+, Mini-Circuits) convert the differential LO input of the IQ modulator to a single-ended 50 n reference input REF.

Referring now to FIG. 34, a plot of phase shift command vs. measure phase shift error illustrates good correspondence between a commanded phase shift and the phase shift achieved in response to such a commanded phase shift. In some embodiments, to control the phase shift produced by an IQ modulator-based phase-shifting element, the appropriate I and Q inputs must be provided to the IQ modulator. One way to determine these inputs is through the use of a look-up table. A pre-determined look-up table stored in the controller's memory lists the I and Q signal values that are required to produce a certain commanded phase shift. This look-up table can be pre-computed or measured empirically. As FIG. 34 suggests, with this look-up table approach one can control the phase of the phase-shifting element outputs (e.g. phase-shifted signals IQ1 and IQ2 in the circuit of FIG. 33 can be controlled to within 0.5° over the entire 360° range of commanded phase shift). If desirable, the control accuracy can be further improved by using DACs with higher number of bits to synthesize the I and Q inputs.

Referring now to FIG. 35, a plot of phase shift command vs. measured phase shift standard deviation (STD) illustrates the standard deviation of the measured phase error achieved in a prototype circuit. The standard deviation of the measured phase error in FIG. 35 can be thought of as an indirect measure of the jitter in the output of the prototype IQ modulator-based phase-shifting element. FIG. 35 shows the certainty with which the phase error measurements in FIG. 34 are made for a given commanded phase shift over the entire −180° to 180° range.

FIG. 35 serves as an important metric that validates the phase error measurements of FIG. 34.

As noted above, the standard deviation of the measured phase error in FIG. 35 can be thought of as a measure of the jitter in the outputs of the phase-shifting elements and it is mainly attributed to jitter in the reference signal and the oscilloscope acquisition system with which the phase measurements were performed. Thus, FIG. 35 serves to validate the measurements of phase error in FIG. 34. FIG. 35 basically illustrates that the measured phase errors shown in FIG. 34 are accurate to within approximately ±0.1°. In other words, FIG. 34 shows the measured phase error, and FIG. 35 shows how certain that measurement is (what is known as standard deviation).

Next described is the use of phase-locked loops (PLL) in implementing phase-shifting elements for PWM waveform generation. Also described is a design example of a cascaded PWM generation architecture having a plurality of phase-shifting elements comprising PLL's.

In general, PLL-based approaches for generating a variable duty cycle waveform allows dynamic control of both angular pulse width and phase $\phi$ (relative to a reference signal) independently from frequency, i.e. frequency modulation affects neither w nor $\phi$. Angular pulse width, here refers to the width of the pulse of the PWM waveform expressed in degrees out of a 360° cycle (one full period).

For example, a PWM waveform with a 100 nsec period and a 25 nsec pulse width has a 90° angular pulse width (a quarter of a single period). By using this notion of angular pulse widths, one can describe the width of a pulse with relation to its period without the need to specify a frequency. This is somewhat similar to the notion of using 0-100% duty cycle to describe PWM waveforms.

Referring now to FIG. 36, a circuit 3600 capable of generating a variable duty cycle waveform includes a phase shifting circuit 3604 comprising a pair of phase-shifting elements 3604a, 3604b. Phase-shifting elements 3604a, 3604b each comprise a PLL 3616, 3618 with a first one of the PLLs 3616 having an input 3616a configured to receive a reference signal 3602. PLL 3616 provides a phase-shifted signal A at an output 3616b thereof. PLL output 3616b is coupled though a signal path to a first input of a waveform combiner 3606. A portion of PLL output signal A is also coupled to both an input 3618a of a second PLL 3618 as well as through a time delay circuit 3674 to a feedback input 3616c of PLL 3616. Thus, the first and second phase-shifting element 3604a, 3604b are coupled such that a phase-shifted output signal generated by a first phase-shifting element 3604a serves as a reference signal (i.e. an input signal) of a second phase-shifting element 3604b. Thus, the phase-shifting elements 3604a, 3604b are said to be coupled in a so-called "cascade" architecture.

Time delay element 3674 introduces a time delay T in the feedback path of PLL 3616. The time delay T is selected to match a propagation delay through the waveform combiner circuitry 3603 from input 3606a (i.e. signal A input in FIG. 36) to output 3606C (i.e. signal Q output in FIG. 36). Such delay may possibly include switch gate driver delay as well as any other delay. As will be described in detail below time delay element 3674 introduces a time delay $\tau$ selected to substantially reduce (and ideally eliminate) the dependence of phase shift φ on frequency modulation.

In response to signals provided to the input 3618a thereof, PLL 3618 provides a phase-shifted signal B at an output 3618b thereof. Output 3618b of PLL 3618 is coupled though a signal path to a second input of waveform combiner 3606. A portion of PLL output signal B is also coupled to a feedback input 3618c of PLL 3618.

Waveform combiner 3606 combines the signals provided thereto at inputs 3606a, 3606b and provides a PWM signal 3608 having a desired waveform at output 3606c. Waveform combiner 3606 combines the signals provided thereto using any of the techniques described herein or any other technique suitable to produce the PWM signal 3608.

Each PLL module 3616, 3618 generates a respective output signal A, B at the respective outputs 3616b, 3618b such that the signals fed back to the respective feedback inputs are frequency-locked to the input signal provided to the respective input 3616a, 3618a and is phase-shifted with respect to it (i.e. phase-shifted with respect to the respective input signal) by a certain amount. The PLL modules 3616, 3618 thus allow direct control the of the phase shift between the input and the feedback signals.

This phase shift may be digitally controlled (e.g., via a microcontroller (pC) 3662 or via some other source of control) and can be adjusted from −180° to +180° with an arbitrary resolution. The resolution may depend, for example, upon the implementation of the PLLs. Depending upon the implementation of a PLL-based phase-shifting element, the phase shift it produces is typically controlled by the means of an analog current or voltage signal. It is the resolution with which this analog signal can be synthesized that ultimately determines the resolution with which phase shift can be controlled. Often, the analog control signal is synthesized with a digital-to-analog converter (DAC). The DAC itself could be a part of the microcontroller, or can be a part of the design of the PLL phase-shifting element.

In the former case, the microcontroller directly synthesizes the analog control signal, and in this case it is indeed the resolution of the microcontroller that determines the resolution with which phase shift can be controlled.

In the latter case, however, the microcontroller can digitally control the DAC that is part of the PLL phase-shifting element. In this case, it is the PLL implementation that determines the resolution with which one can control phase shift.

FIG. 36 is thus an example of a cascaded PWM waveform generator having phase-shifting elements implemented using phase-locked loop modules coupled to a waveform combiner. In embodiments, the waveform combiner may be implemented using one or more logic gates such as a single AND gate. Such an approach allows the generation of a PWM waveform having a dynamically adjustable duty-cycle and phase cp. It should be noted that with a waveform combiner provided from a single logic gate, the angular pulse width w of the PWM waveform may be limited to a maximum of 180°.

Considering circuit 3600 of FIG. 36, if the time delay element T in the feedback path of PLL 3616 is zero and PLL 3616 (PLL1) is commanded to provide a phase shift of between its input and feedback signal, this causes output signal A (i.e. the output of PLL 3616) to be frequency-locked to the reference input REF and phase-shifted with respect to it by φ (assuming τ=0). In this example, a phase shift of between the reference signal REF and the output signal A implies that a rising edge of the output signal pulse lags the negative-to-positive transition in the reference signal by a phase of φ.

Similarly, suppose that PLL 3618 (PLL2) is commanded to provide a phase shift of w between its input and feedback signals. Since the output of PLL1 serves as the input of PLL2, signal B has a phase shift of w with respect to signal A and hence lags the reference signal REF by a phase shift of φ+w.

In one embodiment signals A and B may be combined with a logic AND gate to produce the output signal Q having an angular pulse width w and a phase shift φ between its rising edge and the negative-to-positive transition of the REF signal. It should be noted that in this scenario, signal B is first inverted before being logically combined (i.e. via an AND logic gate) with signal A. It should also be noted that due to a propagation delay of the waveform combiner circuitry, any frequency modulation of the REF signal will cause a corresponding change in the phase shift φ of the PWM waveform. This dependence of the PWM waveform phase on frequency may be substantially reduced (and ideally eliminated) by tuning the time delay τ in the feedback path of PLL1 to match the propagation delay of the waveform combiner logic gate(s) (e.g. an AND gate).

To clarify this further, suppose that PLL1 in FIG. 36 is commanded to provide a phase shift Φ between its input and feedback signals. A time delay of τ in the feedback path of PLL1 will cause the output signal A to lead the signal at feedback input 3616c (also denoted FB in FIG. 36) by time τ. If the time delay τ matches the propagation delay of the waveform combiner, then signal Q will be in phase with the signal at feedback input 3616c (FB), and hence, output signal Q will lag the reference signal REF by a phase corresponding to the commanded phase shift. Thus, the phase of the PWM waveform will be set by the commanded phase shift of PLL 3616 and will not be affected with frequency variation.

It should be noted that the amount of propagation delay that can be compensated by the feedback loop in this fashion while guaranteeing PLL stability depends upon the phase margin and bandwidth of the PLL feedback loop. PLL designs having high loop bandwidth can tolerate only small amount of loop delay and hence require the use of logic circuitry in the waveform combiner having a sufficient operational speed to support such operation. On the other hand, being able to fully compensate the propagation delay of waveform combiners having large propagation delays (as may be the case when using transistor gate drivers as logic gates) necessitates the design of a PLL with slow loop bandwidth and thus limits the speed with which phase of the PWM waveform can be adjusted.

Although a waveform combiner comprising only a single logic gate (e.g. a single AND logic gate having an inverted input coupled to PLL output 3618b) is relatively simple to implement, it only allows generation of a PWM waveform having a maximum angular pulse width of 180 degrees (50% duty cycle) which corresponds to signals A and B being 180 degrees out-of-phase. Furthermore, this is only possible if both signals A and B have 50% duty-cycle. Many applications, however, require the ability to control the duty-cycle of PWM waveforms over a wider range. Thus, an alternative implementation of a waveform combiner which alleviates the above-noted limitations is described below in conjunction with FIG. 37.

In general overview, FIG. 37 is a cascaded phase-locked PWM generator 3700 having a waveform combiner provided from edge detectors coupled to a D-type flip-flop. This approach allows dynamic adjustment of PWM phase φ and angular pulse width w over a 360° range. As discussed above, time delay element τ included in a feedback path of a first PLL receiving a reference signal is selected to substantially match the propagation delay through the waveform combiner circuitry from an input A to an output Q and thus eliminate the dependence of Φ on frequency modulation.

Referring now to FIG. 37, an illustrative circuit for PWM waveform generation includes a pair of phase shifting elements 3704, 3704 coupled to a waveform combiner 3706. Phase shifting elements 3704, 3704 may be the same as or similar to the phase shifting elements 3604a, 3604b described above in conjunction with FIG. 36. In this illustrative embodiment, waveform combiner 3706 comprises a pair of edge detectors 3778, 3780 each of which receives inputs from respective ones of phase shifting elements 3704, 3704. Edge detectors 3778, 3780 are here implemented with a logic gate (here illustrated as an AND logic gate having an inverter coupled to one input thereof). One of ordinary skill in the art will appreciate, of course, that edge detectors may be implemented using any type of circuits. One of ordinary skill in the art will further appreciate that any type of circuit capable of detecting signal edges (e.g. rising and/or falling edges of a signal) may also be used.

The output of a first one of the edge detectors, here edge detector 3778, is coupled to a clock input CLK of a D-type flip-flop 3782. The output of a second one of the edge detectors, here edge detector 3780, is coupled to a reset input RESET of the D-flip-flop 3782. The D input of flip-flop 3782 is coupled to a reference signal (here a logic signal has a value of a logic 1).

This D-type flip-flop arrangement alleviates the above-noted limitation of the circuit of FIG. 36. Since the D input of the flip-flop is coupled to a signal having a logic-high signal level, a rising edge on the CLK input sets output signal Q high (i.e. a logic-high signal level), while a rising edge on the RES input clears Q (i.e. sets the output signal Q to a logic-low signal level). The edge detectors 3778, 3780 at the inputs of the combiner generate a pulse to drive the flip-flop when a rising edge occurs on signals A or B.

It should, of course, also be appreciated that depending upon the implementation of the flip-flop, the use of edge-detectors may not be required.

For flip-flops with an asynchronous reset input, the output signal Q will be forced to a logic-low signal level as long as RES is logic-high irrelevant of the CLK input. In such cases, it is important to use edge detectors to prevent the flip-flop from "skipping" the rising edge of signal A while signal B is logic-high. When using edge detectors, the maximum PWM pulse width that can be obtained is roughly equal to the time period of the REF signal minus the pulse width of the edge detector output. It should thus be appreciated that waveform combiner 3706 allows control of the angular pulse width and phase of the PWM waveform over nearly a 360° range.

In some applications it may be desirable or necessary to generate a plurality of related "single-pulse" PWM waveforms. In general, a PWM waveform can comprise multiple pulses in a single period with various pulse widths and spacing between the pulses. In such a "multi-pulse" PWM waveform, the pulse pattern repeats every cycle at the PWM waveform frequency. For example, in FIG. 28, each 360° cycle of the generated PWM waveform has two pulses with widths α and β.

A PWM waveform comprising only a single pulse every 360° cycle (one full period) is termed here "single-pulse PWM waveform". Circuits and systems capable of generating such a plurality of such single-pulse PMW waveforms might be used, for example, to drive complementary switches in a half-bridge with controllable duty ratio and separately controllable dead-times between switches. In other applications, it may be desirable or necessary to provide controllable overlap on times, rather than controllable dead times, or more than two related single-pulse waveforms. FIG. 38 shows an example design of a PWM generation system capable of generating a plurality of, here two, PWM waveforms that are phase- and frequency-locked to a common reference signal REF.

Referring now to FIG. 38, a PWM generation system 3800 includes a reference signal source 3802 which generates a reference signal. The reference signal is provided to inputs of each of a plurality of PLL-based PWM generators 3836a-3836N. PLL-based PWM generators 3836a-3836N may be the same as or similar to PWM generator 3700 described above in conjunction with FIG. 37.

Taking PWM generator 3836a as representative of PWM generators 3836a-3836N, PWM generator includes a pair of PLLs 3816a, 3816b coupled in a cascade configuration. As described above, in a cascade configuration, a first one of the PLL's 3816a receives reference signal from reference signal source 3802 at an input thereof and output of PLL 3816a is coupled to an input of a second, different PLL 3818 such that a phase-shifted output signal from PLL 3816a serves as a reference signal (i.e. an input signal) of PLL 3818a. As described above, an output of PLL 3816a is coupled through a time delay circuit 3874a to a feedback input of PLL 3816a. The phase-shifted signals generated by PLLs 3816a, 3818a are provided to inputs of a waveform combiner to generate a PWM output signal Q at an output 3808a of PWM generator 3836a.

PMW generation system 3800 further includes a controller 3834. Controller 3834 provides phase-shift parameter values to phase-shifting elements in each of the PWM generators 3836a-3836N. In particular, controller 3834 provides phase-shift parameter values 3812a-3812N to respective ones of PLLs 3816a-3816N, 3838a-3838N.

Thus, in the case where system 3800 comprises two of the PLL-based PWM generators 3836 fed with the same reference signal, the system is capable of independently controlling the phase shift $\phi_1$, $\phi_2$ and the pulse width $_{w1}$, $_{w2}$ of two PWM waveforms $Q_1$ and $Q_2$, respectively.

The circuit of FIG. 38 can be used, for example, to generate drive signals for two complimentary switches in a half-bridge circuit with controllable duty-cycle and dead time. In an embodiment having two PWM generators 3836 and in which a reference signal frequency may vary over a range of 5 MHz to 20 MHz, the PWM waveforms $Q_1$ and $Q_2$ may be provided having approximately 25% duty-cycle and 25% symmetric dead time, i.e. the dead time at each transition is about 25% of the PWM period. The rising edges of Qi and $Q_2$ may be 180° apart and aligned with the maximums and minimums of the reference signal respectively. In such an embodiment, as frequency varies over the entire 5 MHz to 20 MHz range, PWM duty-cycle, dead times and phase shift are not affected.

Referring now to FIG. 39, an illustrative PWM generation system 3900 includes first and second phase shifting elements 3904a, 3904b coupled such that a phase-shifted output signal generated by a first PLL 3916 serves as a reference signal (input) of a second PLL 3918. Thus, PLLs 3916, 3918 are coupled in the so-called cascade architecture described above in conjunction with FIG. 36.

However, in contrast to the cascade arrangement described above in conjunction with FIG. 36, in the illustrative embodiment of FIG. 39, a feedback signal provided to FB input 3916c of PLL 3916 is taken directly from an output of a waveform combiner 3906 (i.e. a portion of output signal Q is provided to a feedback input 3916c of PLL 3916).

System controller 3934 provides phase-shift parameters to phase shifting elements 3904a, 3904b and in particular, to PLLs 3916, 3918. The phase-shift parameters comprise at least one or more phase shift values. In the example of FIG. 39, system controller 3934 provides a phase-shift value of ϕ to phase shifting element 3904a and provides a phase-shift value of w to phase shifting element 3904b.

Providing phase-shifting element 3904a with a predetermined phase-shift value of ϕ forces PLL 3916 to adjust the phase of its output signal (i.e. signal A in FIG. 39) until the phase shift between the reference signal REF and the feedback signal provided to the FB input of PLL 3916 is a phase of ϕ. As described above, since the phase-shifting elements 3916, 3918 are coupled in the so-called cascade configuration, this results in phase-shifting element 3904b producing a phase-shifted signal B having a phase shift of ϕ +w. The phase-shifted signal produced by phase-shifting elements 3904a, 3904b are combined in the waveform combiner 3906 to generate PWM signal 3908 (i.e. output signal Q) having a phase shift ϕ and a pulse width w. Thus, the phase of the PWM waveform with respect to reference signal REF can be directly controlled as frequency varies without the need to compensate for propagation time delays in waveform combiner circuitry.

Referring now to FIG. 40 a flow diagram of process for generating a PWM signal having a desired pulse width and phase shift relative to a reference signal begins in processing block 4002, in which a PWM generator receives a reference signal. Such a PWM generator may be the same as or similar to any of the PWM generators described herein and is configured to receive at least one reference signal. The reference signal may be the same as or similar to any of the reference signals described herein (including, but not limited to, reference signal) 2502 described above in conjunction with FIG. 25B). In embodiments, the PWM generator can include at least one phase-shifting element, which may be the same as or similar to phase-shifting elements 2504. The phase-shifting elements of the PWM generator may have either a parallel architecture, a cascade architecture, or both, as discussed above with reference to FIGS. 26 and 27.

Processing then proceeds to processing block 4004 in which at least one phase-shifting element of the PWM generator generates a phase-shifted signal at an output thereof. Such a phase-shifted signal may be the same as or similar to phase-shifted signals 2508 described in conjunction with FIG. 25B. The phase shift of the phase-shifted signal may be based upon the reference signal(s) provided in processing block 4002 as well as based upon a respective predetermined phase-shift parameter. A phase-shift parameter can include a predetermined phase shift and/or predetermined pulse width used in the generation of the phase-shifted signal. For example, the predetermined phase-shift parameter can include a desired phase-shift for a respective phase-shifting element to apply to a reference signal in order to generate a phase-shifted signal. In embodiments, some phase-shifting elements can be configured to generate a phase-shifted signal by phase-shifting a reference signal according to a predetermined phase-shift parameter while other phase-shifting elements can be configured to generate a phase-shifted signal by phase-shifting a phase-shifted signal generated by another phase-shifting element.

In embodiments, the predetermined phase-shift parameters can be generated by a controller which may be the same as or similar to any of the controllers described herein. The controller can be configured to generate the predetermined phase-shift parameters based upon desired pulse widths and phases relative to a reference signal for a PWM signal generated by the PWM generator. In embodiments, the controller is configured to provide the generated, predetermined phase-shift parameters to respective phase-shifting elements.

Processing then proceeds to processing block 4006 in which the phase-shifted signals generated in processing block 4004 are combined to generate one or more PWM signals. The phase-shifted signals generated in processing block 4004 may be combined using a variety of techniques including any of the techniques described herein. For example, the phase-shifted signals maybe combined by providing the phase-shifted signals to a waveform combiner which may be the same as or similar to any of the waveform combiners described herein. For example, the waveform combiner can operate to compare, summate, detect, divide, (or any combination thereof) the received shifted signals to generate PWM signals. In embodiments, the generated PWM signals have a desired pulse width and phase shift relative to the reference signal based upon the predetermined phase-shift parameters of the phase shifting elements.

Referring now to FIG. 41A, an illustrative power generation and delivery system 4100 having first and second ports 4127, 1429 includes a phase-switched and tunable impedance matching network 4188 (PSIM TMN) having an input coupled to port 4127 and having an output coupled to port 4129.

A means for monitoring impedance at port 4127 is coupled between port 4127 and PSIM TMN input 4188a and a means for monitoring impedance 4196 is coupled between PSIM TMN output 4188b and port 4129. The means for monitoring impedance 4194, 4196 may measure, detect compute or otherwise determine impedances at one or both of ports 4127 4129. Use of such means allows impedance to be determined dynamically.

PSIM TMN 4188 includes one or more phase-switched impedance (PSIM) elements with N PSIM elements 4190a-N here being shown. In embodiments, PSIM elements 4190a-N may be the same as or similar to the phase-switched elements described herein (e.g. phase-switched reactance elements 116 discussed above with reference to FIG. 1). Each PSIM element 4190a-N is coupled to a PWM generation circuit 4136 which comprises at least one PWM generator. In embodiments, PWM generators in PWM generation circuit 4136 may be the same as or similar to the PWM generators described herein.

PSIM element 4190a-N are configured to be responsive to PWM signals provided by PWM generation circuit 4136. In particular, in response to PWM signals generated by PWM generation circuit 4136, PSIM TMN 4088 adjusts an impedance present at (i.e. looking into) either, or both of, the first and second ports 4127, 4129.

In embodiments, portions of signals provided to and from PSIM TMN 4188 are coupled to PWM generators 4136. It should be appreciated that the input/output signals of the TMN in FIG. 41A can be used as reference signals for the PWM generators to properly synchronize the switching of the PSIM elements to currents/voltages in the TMN network. As indicated by FIG. 41A, one can also use external SYNC signals as reference for the PWM generator.

PWM generators 4136 are each configured to receive at least one reference signal and at least one control signal. Control signals may be provided, for example, by a controller 4184 which may be the same as or similar to any of the controllers described herein. In the illustrative embodiment of FIG. 41A, M reference signals designated as SYNC 1–M, are shown (with M≤N) where N refers to the number of PSIM elements.

It should, of course be appreciated that in general, the PWM generator can take-in an arbitrary number M of SYNC signals, and there is no real need to constraint M≤N (i.e. in some embodiments, it may be desirable or even necessary for M>N). For example, the PWM generator can take in more SYNC signals than there are PSIM elements and dynamically switch which SYNC signal to use for which PSIM element based on internal control or some command from the system controller.

In response to the signals provided thereto, PWM generator, circuit 4136 generates at least one PWM signal having a pulse width and a phase shift relative to a reference signal. Reference signals can include signals which may be the same as or similar to reference signals described herein (such as, for example, reference signal 2502 described above in conjunction with FIG. 25). PWM signals generated by PWM signal generators 4136 are provided to the at least one PSIM elements 4190*a*-N. Each PWM generator 4136 can include one or more phase-shifting elements configured to generate phase-shifted signals (based, at least in part, upon phase-shift parameters provided from controller 4184) and one or more waveform combiners configured to generate at least one PWM signal based upon the generated phase-shifted signals.

In embodiments, PSIM TMN 4188 is configured to adjust the impedances presented at PORT 1 and/or PORT 2 according to the pulse widths and phase shifts relative to reference signals of the PWM signals generated by PWM signal generators 4136. In other words, the impedances presented at PORT 1 and/or PORT 2 are determined based upon the pulse widths and phase shifts (relative to reference signals) of the PWM signals generated by PWM signal generator circuit 4136.

The desired impedance values presented at PORT 1 and/or PORT 2 may be achieved by appropriately selecting the values for the pulse widths and phase shifts of the PWM signals provided to PSIM TMN. After reading the description provided herein, one of ordinary skill in the art will further appreciate that desired values for the impedance presented at PORT 1 and/or PORT 2 may be achieved by selecting appropriate phase-shift parameters that are provided to the phase-shifting elements of PWM generators included in PWM generation circuit 4136.

In embodiments, predetermined phase-shifting parameters can be provided to the phase-shifting elements of PWM generators by system controller 4184. System controller 4184 can include a DSP, processor, microprocessor, computer, microcontroller, or any combination thereof—to name a few. In some embodiments, system controller 4184 is configured to generate predetermined phase-shift parameters based upon desired values for the pulse widths and phase shifts relative to reference signals of the PWM signals generated by PWM generators 4136. In other embodiments, system controller 4184 is configured to generate predetermined phase-shift parameters based upon desired values for the impedance presented at PORT 1 and/or PORT 2.

In some embodiments, the means for monitoring impedance 4149, 4196 may be provided as one or more current and/or voltage (I-V) probes with at least one I-V probe coupled to PORT 1 and at least one I-V probe coupled to PORT 2. Each I-V probe is configured to monitor (e.g. measure, detect compute or otherwise determine) a load impedance and/or impedance loading of PORTs 1 and 2 and provide a signal representative of the monitored load impedance and/or impedance loading to system controller 4184.

In embodiments, system controller 4184 is configured to adjust generated, predetermined phase-shift parameters provided to the phase-shifting elements 4190*a*-4190N so as to adjust the values of the impedances at PORT 1 and/or PORT 2 to desired values. Thus, system controller 4184 can control the PWM generators and PSIM TMN 4188 based upon the monitored load impedance and/or impedance loading monitored (e.g. measured, detected, or otherwise determined) at PORT 1 and/or PORT 2.

Referring now to FIG. 41B, an illustrative RF power generation and delivery system 4100 includes a system controller having a first output coupled to an RF input of an inverter 4186 and a second output coupled to an input of a PWM generation circuit 4136. PWM generation circuit 4136 includes one or more PWM generators each of which may be the same as or similar to any of the PWM generators described herein. An output of RF inverter 4186 is coupled to an input of a PSIM TMN 4188. An output of PSIM TMN 4188 is coupled to a load 4192.

PSIM TMN 4188 includes a plurality of PSIM elements 4190*a*-N. Each PSIM element 4190*a*-N is coupled to at least one PWM generator of PWM generation circuit 4136. PWM generators in PWM generation circuit 4136 are configured to generate PWM signals having pulse widths and phase shifts relative to a reference signal. The PWM generators in FIG. 41B can take a reference signal from the control system, from the input/output of the TMN, any internal current/voltage signal from the TMN, or any other externally provided SYNC signal similar to FIG. 41A (as indicated by the dashed lines).

The particular widths and phase shifts provided by the PWM generators are based upon phase-shift parameters provided by system controller 4184. Some of the phase shift parameters provided by the control system are responsible for controlling the phase of the generated PWM waveform with respect to a reference signal, and other phase shift parameters control the pulse width of the PWM waveforms.

In general, the phase-shift parameters that control PWM pulse width have to be adjusted dynamically and are often determined through some sort of feedback (e.g. measurements of TMN input/load impedance, reflected power at the TMN ports, etc.). These can also be controlled/overwritten directly by a user.

The phase shift parameters that control the phase of the PWM waveforms typically do not need to be dynamically adjusted and can be pre-stored in a look-up table which can be obtained by a system calibration. In general, however, these phase shift parameters can also be determined based on feedback (e.g. voltage and current waveforms in the TMN, power lost in the PSIM devices, etc.) and may be dynamically adjusted by the control system (or overwritten by a user) to meet the demands of the system. In response to signals provided to and/or from PWM generation circuit, PSIM TMN 4188 adjusts impedances presented at its input and output.

Thus, with RF inverter coupled to an input of 4188 and a load coupled to an output of PSIM TMN 4188, in response to PWM signals generated by PWM generators 4136, the impedance presented to RF inverter 4186 and/or load 4092 may be adjusted. In embodiments, system controller 4184 may generate values of predetermined phase-shift parameters provided to PWM generation circuit 4136 such that desired values for impedances presented to RF inverter 4186 and/or load 4092 may be achieved. One of ordinary skill in the art will appreciate that the desired values for impedances presented to RF inverter 4186 and/or load 4092 will depend on the operation, use, design, etc. of the RF power generation and delivery system.

Referring now to FIG. 42, an illustrative rf power generation and delivery system 4200 includes an RF inverter or amplifier 4286 having an output coupled to an input of a PSIM TMN 4288. PSIM TMW 4288 includes at least one PSIM element. RF inverter 4286 is here illustrated as a voltage source 4203 and resistor $R_S$ 4205. An I-V probe 4294 is coupled between the RF inverter and the PSIM TMN. A load 4298 having a load impedance $Z_L$ is coupled to the output of PSIM TMN 4288. An I-V probe is coupled between PSIN TMN 4288 and load 4298.

The system further includes a PWM waveform generator 4236 (including phase-shifting element A 4216, phase-shifting element B 4218, and waveform combiner 4206), I-V probes 4294, 4296, and system controller 4284. Thus, in this illustrative embodiment, PSIM TMN 4288 is coupled, at its input, to RF inverter or amplifier 4286 and, at its output, to a load 4298 and is configured to adjust an impedance presented to RF inverter or amplifier 4286 and an impedance presented to load 4298.

In embodiments, the PSIM element includes capacitors $C_{S1}$ 4207, $C_{S2}$ 4217, and $C_{P1}$, inductors $L_{S1}$ 4209 and $L_{S2}$ 4215, and transistor $q_1$. Transistor $q_1$ is configured to receive a drive signal 4208 from PWM generator 4236, and in response thereto adjust the impedances presented at the input and/or output terminals of PSIM TMN 4288 (i.e. adjust the impedances presented to RF inverter or amplifier 4286 and/or load 4298). The drive signal can be provided as a PWM signal generated by PWM generator 4236 using any of the techniques described herein.

An input of PSIM TMN 4288 is coupled to an input of PWM generator 4236 (here through a level adjust circuit 4233 which may comprise, for example, an attenuator) so that a signal (e.g. voltage signal) at the input of PSIM TMN 4288 is provided to PWM 4236 as a reference signal 4202. In embodiments, the signal at the input of PSIM TMN 4288 may first be provided to attenuator 4284 before being provided as reference signal 4202 ensure compatibility with the PWM generator's 4236 internal circuitry. In this illustrative embodiment, PWM generator 4236 is provided having a parallel architecture. Thus, reference signal 4202 is provided to both phase-shifting elements A, B 4216, 4218 with each phase-shifting element configured to generate a phase-shifted signal 4210A, 4210B based upon respective predetermined phase-shift parameters. In embodiments, the predetermined phase-shift parameters can be provided to phase-shifting elements 4216, 4218 by system control 4284. It should, of course, be appreciated that in other embodiments it may be desirable or necessary to provide PWM generator 4236 having a cascade architecture.

I-V probes 4294, 4296 are configured to monitor (e.g. detect, measure, compute or otherwise determine) the impedances presented to load 4298 and RF inverter 4286 and provide the monitored impedances to system control 4284. In embodiments, system control 4284 is configured to generate predetermined phase-shift parameters based upon the monitored impedances to achieve desired values for the monitor the impedances presented to load 4298 and RF inverter 4286.

Referring now to FIG. 43, an illustrative rf power generation and delivery system 4300 includes a PSIM TMN 4388 with input and output terminals and two PSIM elements; an RF inverter or amplifier 4386 (including voltage source 4303 and resistor $R_S$ 4305); PWM waveform generators A, B 4236A, 4326B (each including a first phase-shifting element 4316A,B and a second phase-shifting element 4318A,B, and waveform combiner 4306A,B); I-V probes 4394, 4396, and a system controller 4384. In embodiments, PSIM TMN 4388 is coupled, at its input, to RF inverter or amplifier 4386 and, at its output, to a load 4398 and is configured to adjust an impedance presented to RF inverter or amplifier 4386 and an impedance presented to load 4298.

A first PSIM element includes a transistor $q_1$ 4321 configured to receive a drive signal and in response thereto adjust an impedance presented at the output terminal of PSIM TMN 4288 (i.e. adjust the impedance presented to load 4398). In embodiments, the drive signal for $q_1$ 4321 can be provided as a PWM signal generated by PWM generator 4336A. A second PSIM element includes a transistor $q_2$ 4311 configured to receive a drive signal and in response thereto adjust the impedance presented at the input terminal of PSIM TMN 4388 (i.e. adjust the impedance presented to RF inverter or amplifier 4386). In embodiments, the drive signal for $q_2$ 4311 can be provided as a PWM signal generated by PWM generator 4336B.

Each PWM generator 4336 is configured to generate a PWM signal based upon predetermined phase-shift parameters provided to its phase-shifting elements 4316, 4318. In embodiments, these phase-shifting parameters can be generated by system control 4384, with system control 4384 configured to generate predetermined phase-shift parameters based upon desired values for the impedance presented at the inputs and outputs of PSIM TMN 4388.

Each PWM signal generated by PWM generators 4336A,B has a pulse width and phase shift relative to a respective reference signal provided to the PWM generator. In embodiments, the reference signal provided to PWM generator A 4336A can include one or more signals (e.g. a voltage signal) at the output of PSIM TMN 4388 and the reference signal provided to PWM generator B 4336B can include one or more signals (e.g. a voltage signal) at the input of PSIM TMN 4388. Due to this, PWM generator A 4336A generates a PWM signal with a pulse width and phase shift relative to the signals at the output of PSIM TMN 4388 and PWM generator B 4336B generates a PWM signal with a pulse width and phase shift relative to the signals at the input of PSIM TMN 4388.

In embodiments, I-V probes 4396, 4398 on the input and output ports of the PSIM TMN 4338 monitor the impedances presented at the inputs and outputs of PSIM TMN 4338 based on which system control 4384 can control each PWM generator 4336 and the operation of RF inverter or amplifier 4386 (e.g. operating frequency, output power).

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Some embodiments might be implemented in the form of methods and apparatuses for practicing those methods. Further, as would be apparent to one skilled in the art, various functions of circuit elements might also be implemented as processing blocks in a software program. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It should be understood that the steps of the methods set forth herein are not necessarily required to be performed in the order described, and the order of the steps of such methods should be understood to be merely illustrative. Likewise, additional steps may be included in such methods, and certain steps may be omitted or combined, in methods consistent with various embodiments.

It will be further understood that various changes in the details, materials, and arrangements of the parts that have been described and illustrated herein might be made by those skilled in the art without departing from the scope of the following claims.

We claim:

1. A power generation and delivery system comprising:
   a pulse width modulator generator configured to generate a pulse width modulated (PWM) signal Q(0) comprising at least a pair of PWM pulses with each of the PWM pulses having a pulse width w and each of the pair of pulses locked in phase and frequency to a reference signal VREF(Θ) wherein the generated PWM signal Q(0) has a phase shift φ relative to the reference signal VREF(Θ).

2. The system of claim 1 wherein the phase shift cp corresponds to a phase difference between a rising edge of a PWM pulse and a negative-to-positive transition of the reference signal VREF(Θ).

3. The system of claim 1 wherein the pulse width modulator generator is configured to receive one or more phase-shift parameters having values selected to provide desired pulse widths w and phase shifts φ relative to the reference signal 2502 can be achieved via selected values of phase-shift parameters provided to PWM generator necessary for phase-shifting elements to achieve a desired phase shift.

4. The system of claim 1 wherein the pulse width modulator generator is configured to:
   synchronize a phase of a gate drive signal with respect to the reference signal;
   create a stable/controllable phase shift φ that determines a beginning of a conduction cycle; and
   create a stable/controllable pulse width w to determine a duty cycle and thereby an adjustable reactance.

5. The system of claim 1 wherein:
   the pulse width modulator generator is configured to provide a PWM waveform having one PWM pulse per cycle of the periodic reference signal; and
   the pulse width modulator generator is configured to provide a PWM waveform having one PWM pulse per cycle of the periodic reference signal.

6. The system of claim 1 wherein:
   the pulse width modulator generator is configured to provide a PWM waveform having one PWM pulse per cycle of the periodic reference signal; and
   the pulse width modulator generator is configured to provide multiple PWM pulses per cycle of the periodic reference signal to drive multiple switches in a multi-switch amplifier or converter.

7. The system of claim 1 wherein:
the pulse width modulator generator is configured to provide a PWM waveform having one PWM pulse per cycle of the periodic reference signal; and
the pulse width modulator generator is configured to provide multiple PWM pulses and multiple related PWM signals per cycle of the periodic reference signal.

8. A system for adjustable phase/shift duty control cycle, the system comprising:
a reference signal source configured to provide a reference signal VREF(Θ); and
a pulse width modulator generator configured to receive a reference signal vREF(Θ) from the reference signal source, the pulse width modulator generator configured to generate a pulse width modulated (PWM) signal Q(0) comprising at least a pair of PWM pulses with each of the PWM pulses having a pulse width w; and
means for phase locking each of the pair of PWM pulses in phase and frequency in response to a reference signal VREF(Θ) provided by the reference signal source wherein the generated PWM signal Q(0) has a phase shift cp relative to the reference signal VREF(Θ).

9. The system of claim 8 wherein the pulse width modulator generator comprises one or more phase-shifting elements.

10. The system of claim 8 wherein the pulse width modulator generator comprises:
means for synchronizing a phase of a gate drive signal with respect to the reference signal;
means for creating a controllable phase shift φ that determines a beginning of a conduction cycle; and
means for creating a controllable pulse width w to determine a duty cycle.

11. The system of claim 8 wherein the pulse width modulator generator is configured to provide a PWM waveform having one PWM pulse per cycle of the periodic reference signal.

12. The system of claim 8 wherein:
The reference signal source is configured to provide a periodic reference signal $V_{REF}(\Theta)$; and
the pulse width modulator generator is configured to provide multiple PWM pulses per cycle of the periodic reference signal to drive multiple switches in a multi-switch amplifier or converter.

13. The system of claim 8 wherein:
The reference signal source is configured to provide a periodic reference signal $V_{REF}(\Theta)$; and
the pulse width modulator generator is configured to provide multiple PWM pulses and multiple related PWM signals per cycle of the periodic reference signal.

14. A method comprising:
generating a pulse width modulated (PWM) signal Q(0) comprising at least a pair of PWM pulses with each of the PWM pulses having a pulse width w; and
phase locking each of the pair of PWM pulses in phase and frequency to a reference signal VREF(Θ) wherein the generated PWM signal Q(0) has a phase shift φ relative to a phase of the reference signal VREF(Θ).

15. The method of claim 14 further comprising:
synchronize a phase of a gate drive signal with respect to the reference signal;
creating a stable/controllable phase shift φ that determines a beginning of a conduction cycle; and
create a stable/controllable pulse width w to determine a duty cycle and thereby an adjustable reactance.

16. The method of claim 14 wherein:
The reference signal is a periodic reference signal $V_{REF}(\Theta)$; and
generating a pulse width modulated (PWM) signal Q(0) comprises providing a PWM signal waveform having one PWM pulse per cycle of the periodic reference signal.

17. The method of claim 14 wherein:
The reference signal is a periodic reference signal; and
generating a pulse width modulated (PWM) signal Q(0) comprises providing a PWM signal waveform having multiple PWM pulses per cycle of the periodic reference signal to drive multiple switches in a multi-switch amplifier or converter.

18. The method of claim 14 wherein:
The reference signal is a periodic reference; and
generating a pulse width modulated (PWM) signal Q(0) comprises providing a PWM signal waveform having multiple PWM pulses and multiple related PWM signals per cycle of the periodic reference signal.

* * * * *